United States Patent
Im et al.

(10) Patent No.: US 12,446,371 B2
(45) Date of Patent: Oct. 14, 2025

(54) PIXEL, DISPLAY APPARATUS COMPRISING SAME, AND MANUFACTURING METHOD THEREFOR

(71) Applicant: SAMSUNG DISPLAY CO., LTD., Yongin-si (KR)

(72) Inventors: Hyun Deok Im, Yongin-si (KR); Won Sik Oh, Yongin-si (KR); Won Ho Lee, Yongin-si (KR); Jong Hyuk Kang, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 429 days.

(21) Appl. No.: 17/920,516

(22) PCT Filed: Apr. 21, 2021

(86) PCT No.: PCT/KR2021/005050
§ 371 (c)(1),
(2) Date: Oct. 21, 2022

(87) PCT Pub. No.: WO2021/215833
PCT Pub. Date: Oct. 28, 2021

(65) Prior Publication Data
US 2023/0155067 A1    May 18, 2023

(30) Foreign Application Priority Data
Apr. 24, 2020    (KR) .................. 10-2020-0049846

(51) Int. Cl.
*H10H 20/831*    (2025.01)
*H01L 25/075*    (2006.01)
(Continued)

(52) U.S. Cl.
CPC ..... *H10H 20/8316* (2025.01); *H01L 25/0753* (2013.01); *H10H 20/01* (2025.01);
(Continued)

(58) Field of Classification Search
CPC .................................................. H10H 20/8316
See application file for complete search history.

(56) References Cited

U.S. PATENT DOCUMENTS 9,181,630 B2    11/2015    Shibata et al.
9,318,529 B2    4/2016    Jang et al.
(Continued)

FOREIGN PATENT DOCUMENTS

CN    103367592    10/2013
CN    106463580    2/2017
(Continued)

OTHER PUBLICATIONS

Notice of Allowance for Korean Patent Application No. 10-2020-0049846, dated Aug. 21, 2024.
(Continued)

*Primary Examiner* — Ajay Ojha
*Assistant Examiner* — Hajar Kolahdouzan
(74) *Attorney, Agent, or Firm* — Womble Bond Dickinson (US) LLP

(57) ABSTRACT

According to an embodiment, a pixel may include a first area and a second area partitioned in a first direction, (1-1)-th and (2-1)-th electrodes disposed in the first area and spaced apart in a second direction different from the first direction, (1-2)-th and (2-2)-th electrodes disposed in the second area and spaced apart in the second direction, light emitting elements disposed between the (1-1)-th and (2-1)-th electrodes and between the (1-2)-th and (2-2)-th electrodes, a contact electrode disposed on the (1-1)-th and (2-1)-th electrodes and the (1-2)-th and (2-2)-th electrodes, an insu-
(Continued)

lating layer disposed between each of the (1-1)-th and (2-1)-th electrodes and the (1-2)-th and (2-2)-th electrodes, and the contact electrode, and including a first opening exposing a portion of the (1-1)-th electrode; and a first intermediate electrode electrically connecting the contact electrode on the (2-1)-th electrode and the contact electrode on the (1-2)-th electrode.

20 Claims, 43 Drawing Sheets

(51) Int. Cl.
  *H10H 20/01* (2025.01)
  *H10H 20/819* (2025.01)
  *H10H 20/857* (2025.01)
(52) U.S. Cl.
  CPC ........ *H10H 20/819* (2025.01); *H10H 20/857* (2025.01); *H10H 20/032* (2025.01); *H10H 20/0364* (2025.01)

(56) References Cited

U.S. PATENT DOCUMENTS

| | | | |
|---|---|---|---|
| 9,773,761 | B2 | 9/2017 | Do |
| 9,947,835 | B2 | 4/2018 | Seo et al. |
| 10,074,344 | B2 | 9/2018 | Kim et al. |
| 10,769,990 | B2 | 9/2020 | Cho et al. |
| 11,069,726 | B2 | 7/2021 | Kim et al. |
| 11,367,823 | B2 | 6/2022 | Kim et al. |
| 2017/0148861 | A1 | 5/2017 | Kim |
| 2018/0175009 | A1* | 6/2018 | Kim .................. H01L 25/0753 |
| 2021/0288217 | A1 | 9/2021 | Li et al. |
| 2021/0296550 | A1 | 9/2021 | Li et al. |
| 2021/0359165 | A1 | 11/2021 | Im et al. |
| 2021/0384252 | A1 | 12/2021 | Lee et al. |
| 2022/0069003 | A1 | 3/2022 | Lee et al. |

FOREIGN PATENT DOCUMENTS

| | | |
|---|---|---|
| CN | 109638032 | 4/2019 |
| CN | 110165031 | 8/2019 |
| KR | 10-2013-0033450 | 4/2013 |
| KR | 10-1309069 | 9/2013 |
| KR | 10-1490758 | 2/2015 |
| KR | 10-2016-0129733 | 11/2016 |
| KR | 10-2019-0095638 | 8/2019 |
| KR | 10-2019-0124359 | 11/2019 |
| KR | 10-2020-0010704 | 1/2020 |
| KR | 10-2020-0013824 | 2/2020 |
| KR | 10-2020-0017013 | 2/2020 |
| KR | 10-2020-0021574 | 3/2020 |
| KR | 10-2020-0032809 | 3/2020 |
| KR | 10-2020-0085977 | 7/2020 |
| WO | 2020/071599 | 4/2020 |
| WO | 2020/075936 | 4/2020 |

OTHER PUBLICATIONS

Chinese Office Action for Chinese Patent Application No. 202180030087.5, dated Apr. 15, 2024.
International Search Report, with English translation, corresponding to International Application No. PCT/KR2021/005050 dated Aug. 6, 2021.
Written Opinion, with English translation, corresponding to International Application No. PCT/KR2021/005050, dated Aug. 6, 2021.

* cited by examiner

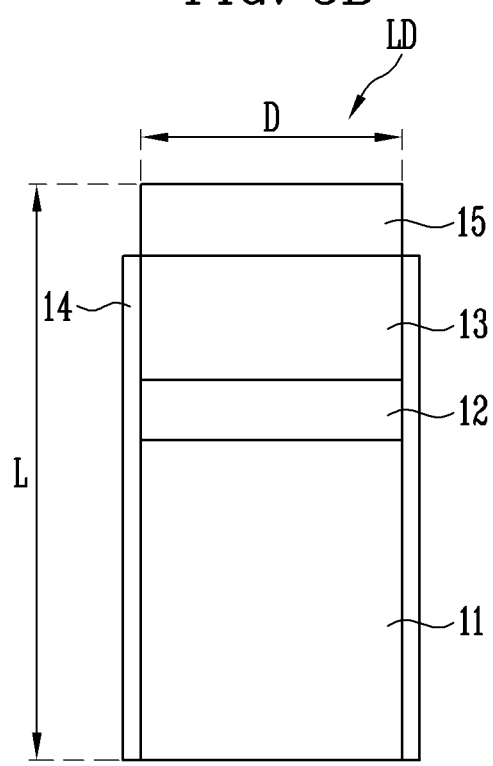

PIXEL, DISPLAY APPARATUS COMPRISING SAME, AND MANUFACTURING METHOD THEREFOR

CROSS-REFERENCE TO RELATED APPLICATION(S)

This application is a national entry of International Application No. PCT/KR2021/005050, filed on Apr. 21, 2021, which claims under 35 U.S.C. § 119(a) and 365(b) priority to and benefits of Korean Patent Application No. 10-2020-0049846, filed on Apr. 24, 2020 in the Korean Intellectual Property Office, the entire contents of which are incorporated herein by reference.

BACKGROUND

1. Technical Field

The disclosure relates to a pixel, a display device including the same, and a method of manufacturing the display device.

2. Description of the Related Art

As interest in information display increases and the demand to use portable information media increases, demand and commercialization for display devices continues.

SUMMARY

An aspect of the disclosure is to provide a pixel including an emission unit forming multiple series stages without increasing the number of alignment electrodes (or alignment lines) by disposing an intermediate electrode (or a bridge electrode) between successive series stages.

An aspect of the disclosure is to provide a pixel capable of improving light output efficiency of light emitting elements.

An aspect of the disclosure is to provide a display device that may implement high resolution.

An aspect of the disclosure is to provide a method of manufacturing the above-described display device.

According to an embodiment of the disclosure, a pixel may include a first area and a second area partitioned in a first direction, (1-1)-th and (2-1)-th electrodes disposed in the first area and spaced apart in a second direction different from the first direction, (1-2)-th and (2-2)-th electrodes disposed in the second area and spaced apart in the second direction, light emitting elements disposed between the (1-1)-th and (2-1)-th electrodes and between the (1-2)-th and (2-2)-th electrodes, a contact electrode disposed on the (1-1)-th and (2-1)-th electrodes and the (1-2)-th and (2-2)-th electrodes, an insulating layer disposed between each of the (1-1)-th and (2-1)-th electrodes and the (1-2)-th and (2-2)-th electrodes, and the contact electrode, and including a first opening exposing a portion of the (1-1)-th electrode, and a first intermediate electrode electrically connecting the contact electrode on the (2-1)-th electrode and the contact electrode on the (1-2)-th electrode. The insulating layer may completely cover the (2-1)-th electrode and the (1-2)-th electrode.

In an embodiment, the insulating layer may further include a second opening exposing a portion of the (2-2)-th electrode.

In an embodiment, the (1-1)-th electrode may directly contact the contact electrode on the (1-1)-th electrode through the first opening, and the (2-2)-th electrode may directly contact the contact electrode on the (2-2)-th electrode through the second opening.

In an embodiment, the (2-1)-th electrode may be electrically insulated from the contact electrode on the (2-1)-th electrode, and the (1-2)-th electrode may be electrically insulated from the contact electrode on the (1-2)-th electrode.

In an embodiment, the first intermediate electrode may be disposed between the first area and the second area. The first intermediate electrode and the contact electrode on the (2-1)-th electrode may be integral with each other or the first intermediate electrode and the contact electrode on the (1-2)-th electrode may be integral with each other.

In an embodiment, the contact electrode on the (1-1)-th electrode, the contact electrode on the (2-1)-th electrode, the contact electrode on the (1-2)-th electrode, the contact electrode on the (2-2)-th electrode, and the intermediate electrode may be disposed on a same layer.

In an embodiment, the (1-1)-th electrode and the (1-2)-th electrode may extend in the first direction and may be electrically connected to each other between the first area and the second area. The (2-1)-th electrode and the (2-2)-th electrode may extend in the first direction and may be electrically connected to each other between the first area and the second area.

In an embodiment, the (1-1)-th electrode may be an anode electrode, and the (2-2)-th electrode may be a cathode electrode.

In an embodiment, the light emitting elements may include first light emitting elements disposed between the (1-1)-th electrode and the (2-1)-th electrode in the first area, and second light emitting elements disposed between the (1-2)-th electrode and the (2-2)-th electrode in the second area.

In an embodiment, the first light emitting elements may form a first series stage electrically connected in parallel between the (1-1)-th electrode and the (2-1)-th electrode, and the second light emitting elements may form a second series stage electrically connected in parallel between the (1-2)-th electrode and the (2-2)-th electrode.

In an embodiment, the pixel may further include a third area disposed at a lower end of the second area in the first direction. The third area may include (1-3)-th and (2-3)-th electrodes spaced apart in the second direction, third light emitting elements disposed between the (1-3)-th electrode and the (2-3)-th electrode, a contact electrode disposed on the (1-3)-th and (2-3)-th electrodes, the insulating layer disposed between each of the (1-3)-th and (2-3)-th electrodes and the contact electrode, and including a second opening exposing a portion of the (2-3)-th electrode, and a second intermediate electrode electrically connecting the contact electrode on the (2-2)-th electrode and the contact electrode on the (1-3)-th electrode.

In an embodiment, the insulating layer may completely cover the (2-2)-th electrode and the (1-3)-th electrode.

In an embodiment, the (1-1)-th electrode may directly contact the contact electrode on the (1-1)-th electrode through the first opening, and the (2-3)-th electrode may directly contact the contact electrode on the (2-3)-th electrode through the second opening.

In an embodiment, the second intermediate electrode and the contact electrode on the (2-2)-th electrode may be integral with each other or the second intermediate electrode and the contact electrode on the (1-3)-th electrode may be integral with each other.

In an embodiment, the first light emitting elements may form a first series stage electrically connected in parallel between the (1-1)-th electrode and the (2-1)-th electrode, the second light emitting elements may form a second series stage electrically connected in parallel between the (1-2)-th electrode and the (2-2)-th electrode, and the third light emitting elements may form a third series stage electrically connected in parallel between the (1-3)-th electrode and the (2-3)-th electrode.

In an embodiment, the (1-1)-th electrode may be an anode electrode, and the (2-3)-th electrode may be a cathode electrode.

In an embodiment, in the first area, one electrode of the (1-1)-th and (2-1)-th electrodes may have a circular shape and the other electrode may have a shape surrounding a periphery of the one electrode. In the second area, one electrode of the (1-2)-th and (2-2)-th electrodes may have a circular shape and the other electrode may have a shape surrounding a periphery of the one electrode.

According to an embodiment, a display device may include pixels disposed on a substrate. Each of the pixels may include a first area and a second area partitioned in a first direction, (1-1)-th and (2-1)-th electrodes disposed in the first area and spaced apart in a second direction different from the first direction, (1-2)-th and (2-2)-th electrodes disposed in the second area and spaced apart in the second direction, first light emitting elements disposed between the (1-1)-th and (2-1)-th electrodes, second light emitting elements disposed between the (1-2)-th and (2-2)-th electrodes, a first contact electrode disposed on the (1-1)-th electrode, a second contact electrode disposed on the (2-1)-th electrode, a third contact electrode disposed on the (1-2)-th electrode, and a fourth contact electrode disposed on the (2-2)-th electrode, an insulating layer disposed between the (1-1)-th electrode and the first contact electrode, between the (2-1)-th electrode and the second contact electrode, between the (1-2)-th electrode and the third contact electrode, and between the (2-2)-th electrode and the contact electrodes, and an intermediate electrode electrically connecting the second contact electrode and the third contact electrode. In an embodiment, the insulating layer may include a first opening exposing a portion of the (1-1)-th electrode and a second opening exposing a portion of the (2-2)-th electrode. The insulating layer may completely cover the (2-1)-th electrode and the (1-2)-th electrode.

In an embodiment, the (1-1)-th electrode may be an anode electrode, and the (2-2)-th electrode may be a cathode electrode.

According to an embodiment, a method of manufacturing a display device may include providing each pixel including a pixel area having a first area and a second area partitioned in a first direction. The providing of the pixel may include forming (1-1)-th and (2-1)-th electrodes spaced apart in a second direction different from the first direction in the first area, forming (1-2)-th and (2-2)-th electrodes spaced apart in the second direction in the second area, forming an insulating material layer on the (1-1)-th and (2-1)-th electrodes and the (1-2)-th and (2-2)-th electrodes, aligning light emitting elements on the insulating material layer, forming an insulating layer including a first opening exposing a portion of the (1-1)-th electrode and a second opening exposing a portion of the (2-2)-th electrode by removing a portion of the insulating material layer, and forming a contact electrode on the (1-1)-th and (2-1)-th electrodes and the (1-2)-th and (2-2)-th electrodes, and forming an intermediate electrode electrically connecting the contact electrode on the (2-1)-th electrode and the contact electrode on the (1-2)-th electrode. The insulating layer may completely cover the (2-1)-th electrode and the (1-2)-th electrode. The (2-1)-th electrode may be electrically insulated from the contact electrode on the (2-1)-th electrode, and the (1-2)-th electrode may be electrically insulated from the contact electrode on the (1-2)-th electrode.

According to an embodiment of the disclosure, an intermediate electrode may be disposed between two successive series stages, an area of a first alignment electrode of a preceding series stage may be directly connected with a contact electrode, an area of a second alignment electrode of a subsequent series stage may be directly connected to another contact electrode, and remaining areas of each of the first and second alignment electrodes may be covered with an insulating layer, to configure an emission unit of each pixel in a series/parallel mixed structure without increasing the number of alignment electrodes. Accordingly, a pixel having improved light output efficiency and a display device including the same may be provided.

According to an embodiment of the disclosure, a display device capable of easily realizing high resolution may be provided.

According to an embodiment of the disclosure, a method of manufacturing the above-described display device may be provided.

Effects according to embodiments of the disclosure are not limited by the contents above, and additional various effects are included in the specification.

BRIEF DESCRIPTION OF THE DRAWINGS

FIG. 3B is a cross-sectional view schematically illustrating the light emitting element of FIG. 3A.

DETAILED DESCRIPTION OF THE EMBODIMENTS

Figure 1A:
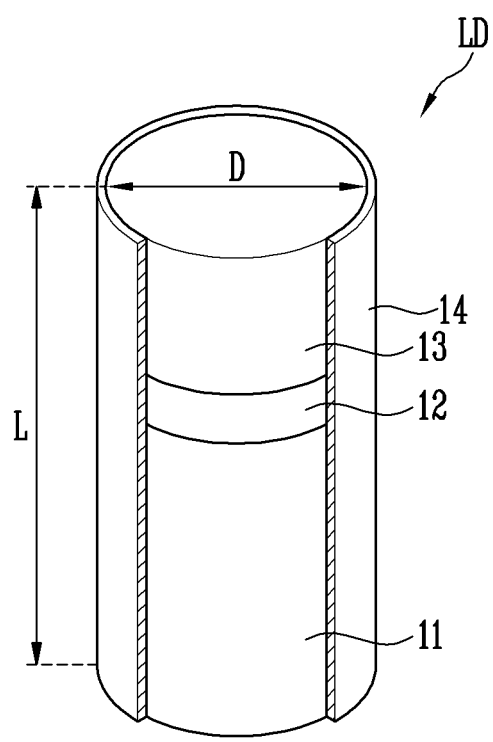
FIG. 1A is a perspective view schematically illustrating a light emitting element according to an embodiment of the disclosure.

Since the disclosure may be modified in various manners and have various forms, specific embodiments will be illustrated in the drawings and will be described in detail in the specification. However, it should be understood that the disclosure is not intended to be limited to the disclosed specific forms, and the disclosure includes all modifications, equivalents, and substitutions within the technical scope of the disclosure.

Similar reference numerals are used for similar components in describing each drawing. In the accompanying drawings, the dimensions of the structures may be shown, e.g., enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

It should be understood that in the application, a term of "comprise", "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof. A case where a portion of a layer, a film, an area, a plate, or the like is referred to as being "on" another portion, it includes not only a case where the portion is "directly on" another portion, but also a case where there is further another portion between the portion and another portion. In the specification, when a portion of a layer, a film, an area, a plate, or the like is formed on another portion, a forming direction is not limited to an upper direction but includes forming the portion on a side surface or in a lower direction. When a portion of a layer, a film, an area, a plate, or the like is formed "under" another portion, this includes not only a case where the portion is "directly beneath" another portion but also a case where there is further another portion between the portion and another portion.

In the application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') may not be present between the component and the other component.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

In the description below, the singular expressions include plural expressions unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
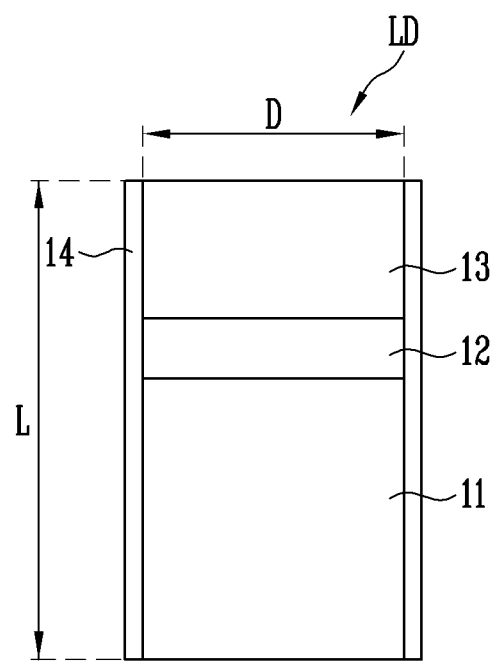
FIG. 1B is a cross-sectional view schematically illustrating the light emitting element of FIG. 1A.
Figure 2A:
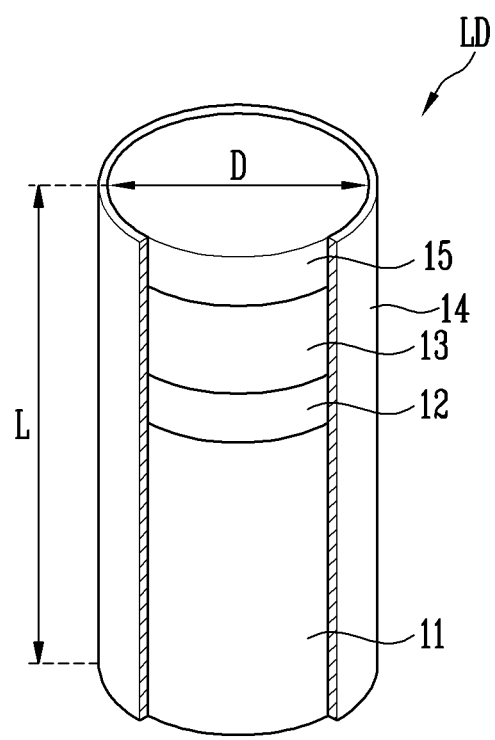
FIG. 2A is a perspective view schematically illustrating a light emitting element according to another embodiment of the disclosure.
Figure 2B:
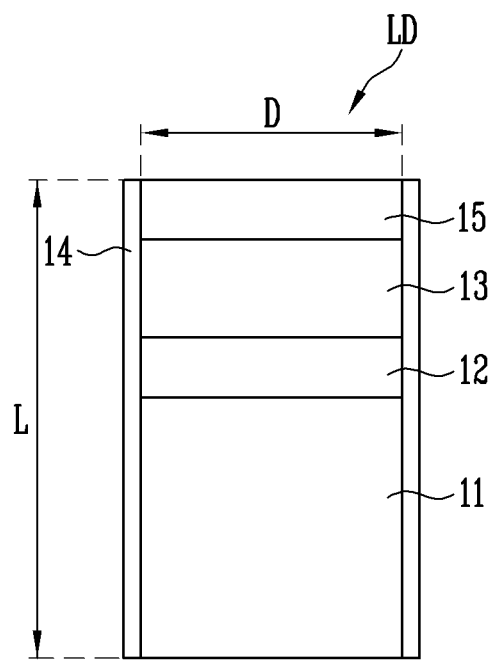
FIG. 2B is a cross-sectional view schematically illustrating the light emitting element of FIG. 2A.
Figure 3A:
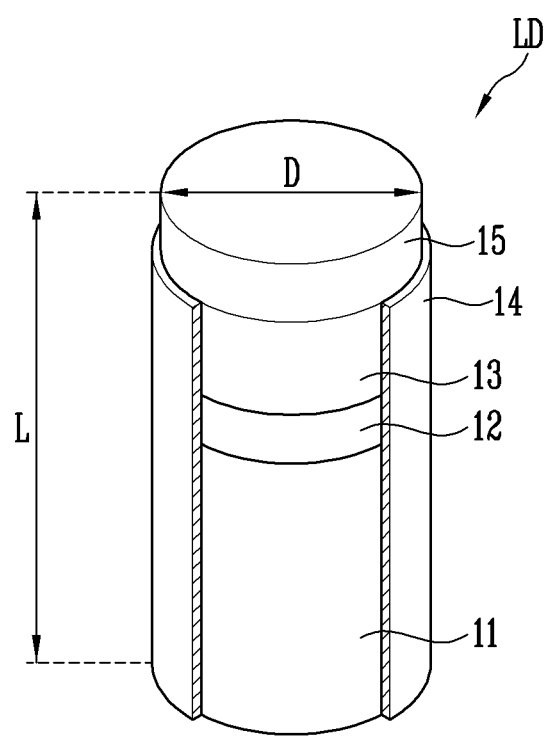
FIG. 3A is a perspective view schematically illustrating a light emitting element according to another embodiment of the disclosure.
Figure 4A:
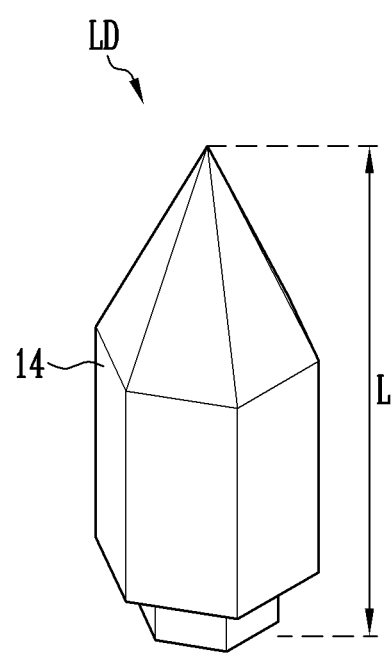
FIG. 4A is a perspective view schematically illustrating a light emitting element according to still another embodiment of the disclosure.

FIG. 1A is a perspective view schematically illustrating a light emitting element LD according to an embodiment of the disclosure, and FIG. 1B is a cross-sectional view schematically illustrating the light emitting element LD of FIG. 1A. FIG. 2A is a perspective view schematically illustrating a light emitting element LD according to another embodiment of the disclosure, and FIG. 2B is a cross-sectional view schematically illustrating the light emitting element LD of FIG. 2A. FIG. 3A is a perspective view schematically illustrating a light emitting element LD according to another embodiment of the disclosure, and FIG. 3B is a cross-sectional view schematically illustrating the light emitting element LD of FIG. 3A. FIG. 4A is a perspective view schematically illustrating a light emitting element LD according to still another embodiment of the disclosure, and FIG. 4B is a cross-sectional view schematically illustrating the light emitting element LD of FIG. 4A.

Figure 4B:
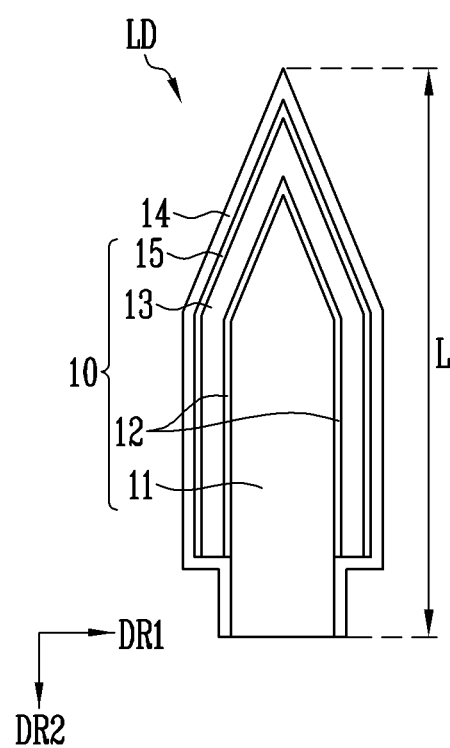
FIG. 4B is a cross-sectional view schematically illustrating the light emitting element of FIG. 4A.

For convenience, after describing FIGS. 1A, 1B, 2A, 2B, 3A, and 3B showing the light emitting element LD manufactured by an etching method, FIGS. 4A and 4B showing the light emitting element LD manufactured by a growth method is described. In an embodiment of the disclosure, a type and/or a shape of the light emitting element LD are/is not limited to the embodiments shown in FIGS. 1A, 1B, 2A, 2B, 3A, 3B, 4A, and 4B.

First, referring to FIGS. 1A, 1B, 2A, 2B, 3A, and 3B, the light emitting element LD may include a first semiconductor layer 11, a second semiconductor layer 13, and an active layer 12 interposed between the first semiconductor layer 11 and the second semiconductor layer 13. For example, the light emitting element LD may implement a light emitting stack in which the first semiconductor layer 11, the active layer 12, and the second semiconductor layer 13 are sequentially stacked on each other.

The light emitting element LD may be provided (disposed) in a shape extending in a direction. When an extension direction of the light emitting element LD is referred to as a length direction, the light emitting element LD may include an end (or a lower end) and another end (or an upper end) along the extension direction. Any one of the first and second semiconductor layers 11 and 13 may be disposed at the end (or the lower end) of the light emitting element LD, and the other of the first and second semiconductor layers 11 and 13 may be disposed at the another end (or the upper end) of the light emitting element LD. For example, the first semiconductor layer 11 may be disposed at the end (or the lower end) of the light emitting element LD, and the second semiconductor layer 13 may be disposed at the another end (or the upper end) of the light emitting element LD.

The light emitting element LD may be provided in various shapes. For example, the light emitting element LD may have a rod-like shape, a bar-like shape, a column-like shape, or the like, which may be long in the length direction (for example, an aspect ratio may be greater than 1). In an embodiment of the disclosure, a length L of the light emitting element LD in the length direction may be greater than a diameter D (or a width of a cross-section) thereof. The light emitting element LD may include, for example, a light emitting diode (LED) manufactured to be extremely small to have the diameter D and/or the length L of about a micro scale or a nano scale.

The diameter D of the light emitting element LD may be about 0.5 µm to about 500 µm, and the length L may be about 1 µm to about 100 µm. However, the diameter D and the length L of the light emitting element LD are not limited thereto, and a size of the light emitting element LD may be changed to satisfy a requirement condition (or a design condition) of a lighting device or a light emitting display device to which the light emitting element LD may be applied.

The first semiconductor layer 11 may include at least one n-type semiconductor layer as an example. For example, the first semiconductor layer 11 may include at least one semiconductor material among InAlGaN, GaN, AlGaN, InGaN, AlN, and InN, and may be an n-type semiconductor layer doped with a first conductive dopant (or an n-type dopant) such as Si, Ge, and/or Sn. However, a material configuring the first semiconductor layer 11 is not limited thereto, and various other materials may configure the first semiconductor layer 11. In an embodiment of the disclosure, the first semiconductor layer 11 may include a gallium nitride (GaN) semiconductor material doped with the first conductive dopant (or the n-type dopant). For example, the first semiconductor layer 11 may be an n-type GaN semiconductor layer. The first semiconductor layer 11 may include an upper surface contacting the active layer 12 along the length direction of the light emitting element LD and a lower surface exposed to the outside. The lower surface of the first semiconductor layer 11 may be the end (or the lower end) of the light emitting element LD.

The active layer 12 may be disposed on the first semiconductor layer 11 and may be formed in a single or multiple quantum well structure. For example, in case that the active layer 12 is formed in the multiple quantum well structure, in the active layer 12, a barrier layer (not shown), a strain reinforcing layer, and a well layer may be periodically and repeatedly stacked as one unit. The strain reinforcing layer may have a lattice constant less than that of the barrier layer to further reinforce a strain, for example, a compression strain, applied to the well layer. However, a structure of the active layer 12 is not limited to an above-described embodiment.

The active layer 12 may emit light having a wavelength of about 400 nm to about 900 nm, and may use a double hetero structure. In an embodiment of the disclosure, a clad layer (not shown) doped with a conductive dopant may be formed on and/or under the active layer 12 along the length direction of the light emitting element LD. For example, the clad layer may be formed of an AlGaN layer or an InAlGaN layer. According to an embodiment, a material of AlGaN, AlInGaN, or the like may be used to form the active layer 12, and various other materials may configure the active layer 12. The active layer 12 may include a first surface contacting the first semiconductor layer 11 and a second surface contacting the second semiconductor layer 13. The first surface and the second surface of the active layer 12 may face each other in the length direction of the light emitting element LD.

In case that an electric field of a voltage or more is applied to both ends of the light emitting element LD, the light emitting element LD emits light while an electron-hole pair may be combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant) such as Mg. However, a material configuring the second semiconductor layer 13 is not limited thereto, and various other materials may configure the second semiconductor layer 13. In an embodiment of the disclosure, the second semiconductor layer 13 may include a gallium nitride (GaN) semiconductor material doped with the second conductive dopant (or the p-type dopant). For example, the second semiconductor layer 13 may be a p-type GaN semiconductor. As shown in FIGS. 1A and 1B, the second semiconductor layer 13 may include a lower surface contacting the second surface of the active layer 12 along the length direction of the light emitting element LD and an upper surface exposed to the outside. Here, the upper surface of the second semiconductor layer 13 may be the another end (or the upper end) of the light emitting element LD.

In an embodiment of the disclosure, the first semiconductor layer 11 and the second semiconductor layer 13 may have thicknesses different from each other in the length direction of the light emitting element LD. For example, the first semiconductor layer 11 may have a thickness relatively thicker than that of the second semiconductor layer 13 along the length direction of the light emitting element LD. Therefore, as shown in FIGS. 1A and 1B, the active layer 12 of the light emitting element LD may be positioned more adjacently to the upper surface of the second semiconductor layer 13 than to the lower surface of the first semiconductor layer 11.

In FIGS. 1A and 1B, the first semiconductor layer 11 and the second semiconductor layer 13 are configured as one layer, but the disclosure is not limited thereto. In an embodiment of the disclosure, according to a material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer to reduce a lattice constant difference. The TSBR layer may be configured of a p-type semiconductor layer such as p-GaInP, p-AlInP, and p-AlGaInP, but the disclosure is not limited thereto.

According to an embodiment, as shown in FIGS. 2A to 3B, the light emitting element LD may further include an additional electrode 15 (hereinafter referred to as a "first additional electrode") disposed on the second semiconductor layer 13, in addition to the above-described first semiconductor layer 11, active layer 12, and second semiconductor layer 13. According to another embodiment, the light emitting element LD may further include another additional electrode (not shown, hereinafter referred to as a "second additional electrode") disposed at an end of the first semiconductor layer 11.

The first additional electrode 15 and the second additional electrode may be ohmic contact electrodes, but are not limited thereto, and may be schottky contact electrodes according to an embodiment. The first additional electrode 15 and the second additional electrode may include a metal or metal oxide, and may use, for example, chromium (Cr), titanium (Ti), aluminum (Al), gold (Au), nickel (Ni), indium tin oxide (ITO), an oxide or an alloy thereof, and the like alone or in combination, but are not limited thereto.

The materials included in each of the first additional electrode 15 and the second additional electrode may be identical to or different from each other. The first additional electrode 15 and the second additional electrode may be substantially transparent or translucent. Accordingly, light generated by the light emitting element LD may pass through the first additional electrode 15 and the second additional electrode and may be emitted to the outside of the light emitting element LD. According to an embodiment, in case that the light generated by the light emitting element LD does not pass through the first additional electrode 15 and the second additional electrode and is emitted to the outside of the light emitting element LD through an area except for the ends of the light emitting element LD, the first additional electrode 15 and the second additional electrode may include an opaque metal.

In an embodiment of the disclosure, the light emitting element LD may further include an insulating film 14 (or an insulating layer). However, according to an embodiment, the insulating film 14 may be omitted and may be provided so as to cover only a portion of the first semiconductor layer 11, the active layer 12, and the second semiconductor layer 13.

The insulating film 14 may prevent an electrical short that may occur in case that the active layer 12 is in contact with a conductive material other than the first semiconductor layer 11 and the second semiconductor layer 13. By forming the insulating layer 14, lifespan and efficiency of the light emitting element LD may be improved by minimizing a surface defect of the light emitting element LD. In case that multiple light emitting elements LD are closely disposed, the insulating film 14 may prevent an unwanted short that may occur between the light emitting elements LD. In case that the active layer 12 may prevent an occurrence of a short with an external conductive material, presence or absence of the insulating film 14 is not limited.

As shown in FIGS. 1A and 1B, the insulating film 14 may be provided in a form entirely surrounding an outer circumferential surface of the light emitting stack including the first semiconductor layer 11, the active layer 12, and the second semiconductor layer 13. For convenience of description, a portion of the insulating film 14 is removed in FIG. 1A, and the first semiconductor layer 11, the active layer 12, and the second semiconductor layer 13 included in the actual light emitting element LD may be surrounded by the insulating film 14.

In an above-described embodiment, the insulating film 14 entirely surrounds the outer circumferential surface of each of the first semiconductor layer 11, the active layer 12, and the second semiconductor layer 13, but the disclosure is not limited thereto. According to an embodiment, in case that the light emitting element LD includes the additional electrode 15, as shown in FIGS. 2A and 2B, the insulating film 14 may entirely surround the outer circumferential surface of each of the first semiconductor layer 11, the active layer 12, the second semiconductor layer 13, and the additional electrode 15. According to another embodiment, as shown in FIGS. 3A and 3B, the insulating film 14 may not entirely surround the outer circumferential surface of the additional electrode 15 disposed on the second semiconductor layer 13, or may surround only a portion of the outer circumferential surface of the additional electrode 15 and may not surround a remainder of the outer circumferential surface of the additional electrode 15. However, the insulating film 14 may expose at least both ends of the light emitting element LD, and for example, the insulating film 14 may expose an end of the first semiconductor layer 11 together with the additional electrode 15 disposed at an end side of the second semiconductor layer 13. According to an embodiment, in case that the first additional electrode 15 is disposed at an end of the light emitting element LD and the second additional electrode is disposed at another end of the light emitting element LD, the insulating film 14 may expose at least one area of the first additional electrode 15 and at least one area of the second additional electrode. In still another embodiment, the insulating film 14 may not be provided.

According to an embodiment of the disclosure, the insulating film 14 may include a transparent insulating material. For example, the insulating film 14 may include at least one insulating material of silicon oxide ($SiO_x$), silicon nitride ($SiN_x$), silicon oxynitride ($SiO_xN_y$), aluminum oxide ($AlO_x$), titanium dioxide ($TiO_2$), and the like, but is not limited thereto, and various materials having insulation may be used.

In case that the insulating film 14 is provided to the light emitting element LD, a short between the active layer 12 and driving electrodes which are not shown may be prevented. By forming the insulating film 14, the lifespan and efficiency of the light emitting element LD may be improved by minimizing the surface defect of the light emitting element LD. In case that the light emitting elements LD are closely disposed, the insulating film 14 may prevent the unwanted short that may occur between the light emitting elements LD.

An above-described light emitting element LD may be used as a light emitting source of various display devices. The light emitting element LD may be manufactured through a surface treatment process. For example, in case that the light emitting elements LD are mixed in a fluid solution (or a solvent) and supplied to each pixel area (for example, an emission area of each pixel or an emission area of each sub-pixel), the surface treatment may be performed on each of the light emitting elements LD so that the light emitting elements LD may be uniformly sprayed without being non-uniformly aggregated in the solution.

An emission unit (or an emission device) including the light emitting element LD described above may be used in various types of devices that require a light source, including a display device. For example, in case that the light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in another type of device that requires a light source, such as a lighting device.

The light emitting element LD manufactured by the growth method is described with reference to FIGS. 4A and 4B.

In describing the light emitting element LD manufactured by the growth method, the disclosure is described based on differences from the above-described embodiments, and features not specially described in the light emitting element LD manufactured by the growth method may be similar to the above-described embodiments, and the same reference numerals are given to components similar and/or identical to those of the above-described embodiments.

Referring to FIGS. 4A and 4B, the light emitting element LD according to an embodiment of the disclosure may include the first semiconductor layer 11, the second semiconductor layer 13, and the active layer 12 interposed between the first and second semiconductor layers 11 and 13. According to an embodiment, the light emitting element LD may include a light emitting pattern 10 of a core-shell structure including the first semiconductor layer 11 positioned at a center (or a middle) of the light emitting element LD, the active layer 12 surrounding at least one side of the first semiconductor layer 11, the second semiconductor layer 13 surrounding at least one side of the active layer 12, and the additional electrode 15 surrounding at least one side of the second semiconductor layer 13.

The light emitting element LD may be provided in a polygonal horn shape extending in a direction. For example, the light emitting element LD may be provided in a hexagonal horn shape. When the extension direction of the light emitting element LD is referred to as the length direction, the light emitting element LD may have an end (or a lower end) and another end (or an upper end) along the length direction. A portion of a semiconductor layer of the first and second semiconductor layers 11 and 13 may be exposed at the end (or the lower end) of the light emitting element LD, and a portion of the other semiconductor layer of the first and second semiconductor layers 11 and 13 may be exposed at the another end (or the upper end) of the light emitting element LD. For example, a portion of the first semiconductor layer 11 may be exposed at the end (or the lower end) of the light emitting element LD, and a portion of the second semiconductor layer 13 may be exposed at the another end (or the upper end) of the light emitting element LD. In case that the light emitting element LD is applied as the light source of the display device, the exposed portion of the first semiconductor layer 11 may be in contact with one driving electrode of driving electrodes driving the light emitting element LD and the exposed portion of the second semiconductor layer 13 may be in contact with another driving electrode.

According to an embodiment, in case that the light emitting element LD includes the additional electrode 15, a portion of the additional electrode 15 surrounding at least one side of the second semiconductor layer 13 may be exposed at the another end (or the upper end) of the light emitting element LD. In case that the light emitting element LD is applied as the light source of the display device, the exposed portion of the additional electrode 15 may be in contact with the other driving electrode and may be electrically connected to the one electrode.

In an embodiment of the disclosure, the first semiconductor layer 11 may be positioned at a core, for example, a center (or a middle) of the light emitting element LD. The light emitting element LD may be provided in a shape corresponding to a shape of the first semiconductor layer 11. For example, in case that the first semiconductor layer 11 has a hexagonal horn shape, the light emitting element LD and the light emitting pattern 10 may also have a hexagonal horn shape.

The active layer 12 may be provided and/or formed in a shape surrounding the outer circumferential surface of the first semiconductor layer 11 in the length direction of the light emitting element LD. Specifically, the active layer 12 may be provided and/or formed in a shape surrounding the remaining area except for the another end disposed at the lower side of the ends of the first semiconductor layer 11 in the length direction of the light emitting element LD.

The second semiconductor layer 13 may be provided and/or formed in a shape surrounding the active layer 12 in the length direction of the light emitting element LD, and may include a semiconductor layer of a type different from that of the first semiconductor layer 11. For example, in case that the first semiconductor layer 11 includes an n-type semiconductor layer, the second semiconductor layer 13 may include a p-type semiconductor layer.

In an embodiment of the disclosure, the light emitting element LD may include the additional electrode 15 surrounding at least one side of the second semiconductor layer 13. The additional electrode 15 may be an ohmic contact electrode or a schottky contact electrode electrically connected to the second semiconductor layer 13, but is not limited thereto.

As described above, the light emitting element LD may be configured in a hexagonal horn shape having a shape in which the ends are protruded, and may be implemented as the light emitting pattern 10 of the core-shell structure including the first semiconductor layer 11 provided at the center thereof, the active layer 12 surrounding the first semiconductor layer 11, the second semiconductor layer 13 surrounding the active layer 12, and the additional electrode 15 surrounding the second semiconductor layer 13. The first semiconductor layer 11 may be disposed at the end (or the lower end) of the light emitting element LD having the hexagonal horn shape, and the additional electrode 15 may be disposed at the another end (or the upper end) of the light emitting element LD.

According to an embodiment, the light emitting element LD may further include the insulating film 14 provided on an outer circumferential surface of the light emitting pattern 10 of the core-shell structure. The insulating film 14 may include a transparent insulating material.

Figure 5:
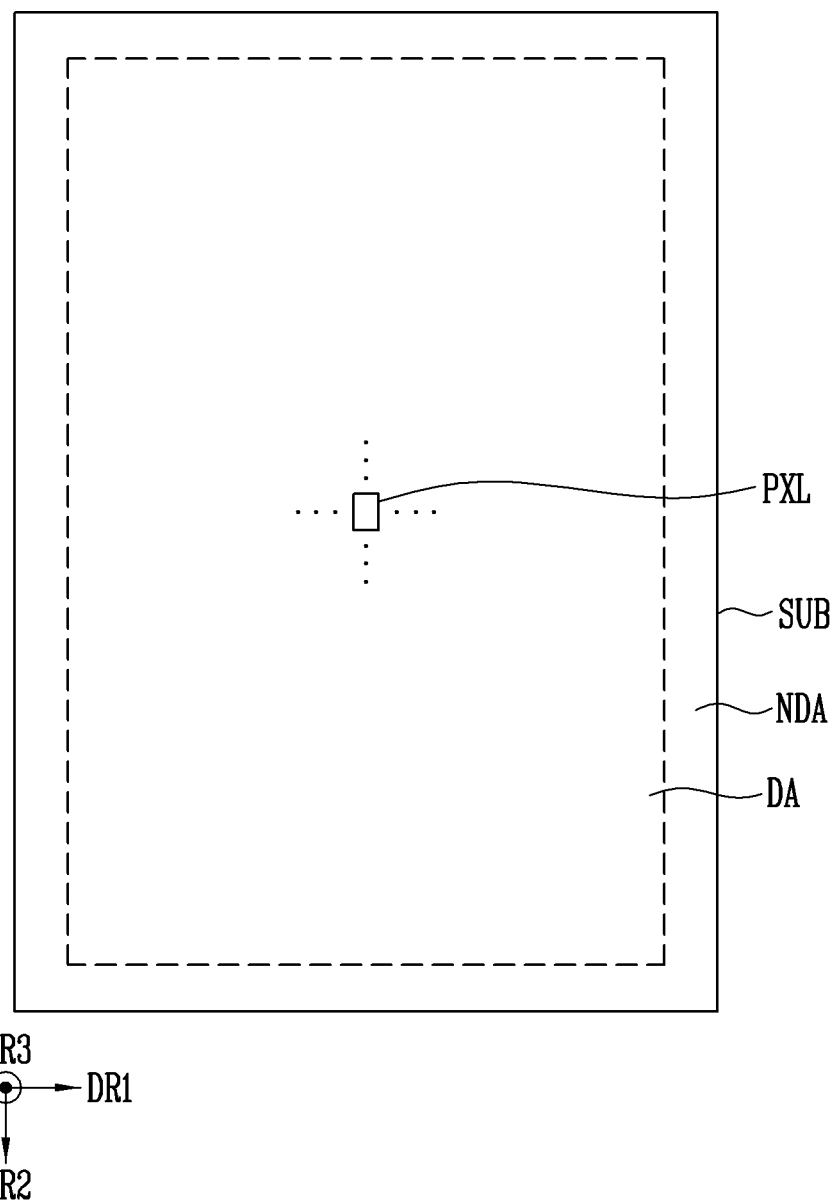
FIG. 5 is a diagram schematically illustrating a display device according to an embodiment of the disclosure, and is a schematic plan view of a display device, in particular, using a light emitting element as a light emitting source among the light emitting elements shown in FIGS. 1A, 1B, 2A, 2B, 3A, 3B, 4A, and 4B.

FIG. 5 is a diagram schematically illustrating a display device according to an embodiment of the disclosure, and is a schematic plan view of a display device, in particular, using a light emitting element LD as a light emitting source among the light emitting elements LD shown in FIGS. 1A, 1B, 2A, 2B, 3A, 3B, 4A, and 4B.

In FIG. 5, for convenience, a structure of the display device is briefly shown based on a display area DA where an image may be displayed. However, according to an embodiment, at least one driver (for example, a scan driver, a data driver, and the like) and/or signal lines, which are not shown, may be further disposed in the display device.

Referring to FIGS. 1A, 1B, 2A, 2B, 3A, 3B, 4A, 4B, and 5, the display device according to an embodiment of the disclosure may include a substrate SUB, pixels PXL provided on the substrate SUB and including at least one light emitting element LD, a driver provided on the substrate SUB and driving the pixels PXL, a line unit connecting the pixels PXL and the driver to each other.

In case that the display device is an electronic device to which a display surface may be applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or a wearable device, the disclosure may be applied.

The display device may be classified as a passive matrix type display device and an active matrix type display device according to a method of driving the light emitting element LD. For example, in case that the display device is implemented as an active matrix type, each of the pixels PXL may include a driving transistor that controls a current amount supplied to the light emitting element LD, a switching transistor that transmits a data signal to the driving transistor, and the like.

Recently, the active matrix type display device that selects and lights each pixel PXL in terms of resolution, contrast, and operation speed has become mainstream, but the disclosure is not limited thereto, and the passive matrix type display device in which lighting may be performed for each pixel PXL group is performed may also use components (for example, first and second electrodes, and the like) for driving the light emitting element LD.

The substrate SUB may include the display area DA and a non-display area NDA.

According to an embodiment, the display area DA may be disposed in a center area of the display device, and the non-display area NDA may be disposed in an edge area of the display device to surround the display area DA. However, positions of the display area DA and the non-display area NDA are not limited thereto, and the positions of the display area DA and the non-display area NDA may be changed.

The display area DA may be an area where the pixels PXL that display an image are provided. The non-display area NDA may be an area where the driver for driving the pixels PXL and a portion of the line unit connecting the pixels PXL and the driver to each other are provided. For convenience of description, only one pixel PXL is shown in FIG. 5, but multiple pixels PXL may be substantially disposed in the display area DA of the substrate SUB.

The display area DA may have various shapes. For example, the display area DA may be provided as a polygon shape of a closed shape including a side formed of a straight line. The display area DA may be provided in a circle shape and/or an ellipse shape including a side formed of a curve. The display area DA may be provided in various shapes such as a semicircle, a semi-ellipse, and the like including a side formed of a straight line and a curve.

The non-display area NDA may be provided on at least one side of the display area DA. In an embodiment of the disclosure, the non-display area NDA may surround a periphery (or an edge) of the display area DA.

The non-display area NDA may be provided with the line unit connected to the pixels PXL, and the driver connected to the line unit and driving the pixels PXL.

The line unit may electrically connect the driver and the pixels PXL to each other. The line unit may provide a signal to each pixel PXL and may be signal lines connected to each pixel PXL, for example, fan-out lines connected to a scan line, a data line, an emission control line, and the like. The line unit may be signal lines connected to each pixel PXL, for example, fan-out lines connected to a control line, a sensing line, and the like, in order to compensate for an electrical characteristic change of each pixel PXL in real time.

The substrate SUB may include a transparent insulating material and may transmit light. The substrate SUB may be a rigid substrate or a flexible substrate.

An area on the substrate SUB may be provided as the display area DA to dispose the pixels PXL, and the remaining area on the substrate SUB may be provided as the non-display area NDA. For example, the substrate SUB may include the display area DA including pixel areas in which each pixel PXL may be disposed, and the non-display area NDA disposed around the display area DA.

Each of the pixels PXL may be provided in the display area DA on the substrate SUB. In an embodiment of the disclosure, the pixels PXL may be arranged in the display area DA in a stripe or PenTile® array structure, but the disclosure is not limited thereto.

Each pixel PXL may include at least one light emitting element LD driven by corresponding scan signal and data signal. The light emitting element LD may have a size as small as a nano scale to a micro scale and may be connected in parallel with adjacent light emitting elements, but the disclosure is not limited thereto. The light emitting element LD may configure a light source of each pixel PXL.

Each pixel PXL may include at least one light source driven by a signal (for example, a scan signal and a data signal) and/or power (for example, first driving power and second driving power). For example, each pixel PXL may include at least one ultra-small light emitting element LD having a small size of about a nano scale to a micro scale shown in FIGS. 1A to 4B. However, a type of the light emitting element LD that may be used as the light source of each pixel PXL is not limited thereto in an embodiment of the disclosure.

In an embodiment of the disclosure, the color, type, number, and/or the like of the pixels PXL are/is not particularly limited, and for example, the color of light emitted from each pixel PXL may be variously changed.

The driver may provide a signal and power to each pixel PXL through the line unit, thereby controlling driving of the pixel PXL.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

FIGS. 6A to 6E are circuit diagrams schematically illustrating an electrical connection relationship between components included in a pixel PXL shown in FIG. 5 according to various embodiments.

For example, FIGS. 6A to 6E show the electrical connection relationship between the components included in the pixel PXL that may be applied to the active type display device, according to different embodiments. However, types of the components included in the pixel PXL to which an embodiment of the disclosure may be applied are not limited thereto.

In FIGS. 6A to 6E, not only the components included in each of the pixels PXL shown in FIG. 5 but also an area where the components may be provided are referred to as the pixel PXL. According to an embodiment, each pixel PXL shown in FIGS. 6A to 6E may be any one of the pixels PXL included in the display device of FIG. 5, and the pixels PXL may have structures substantially identical or similar to each other.

Referring to FIGS. 1A to 4B, 5, and 6A to 6E, the pixel PXL may include an emission unit EMU that generates light of a luminance corresponding to the data signal. The pixel PXL may selectively further include a pixel circuit 144 for driving the emission unit EMU.

According to an embodiment, the emission unit EMU may include the light emitting elements LD connected in parallel between a first power line PL1 to which a voltage of first driving power supply VDD may be applied and a second power line PL2 to which a voltage of second driving power supply VSS may be applied. For example, the emission unit EMU may include a first electrode EL1 (or a "first alignment electrode") connected to the first driving power supply VDD via the pixel circuit 144 and the first power line PL1, a second electrode EL2 (or a "second alignment electrode") connected to the second driving power supply VSS via the second power line PL2, and the light emitting elements LD connected in parallel in the same direction between the first and second electrodes EL1 and EL2. In an embodiment of the disclosure, the first electrode EL1 may be an anode electrode, and the second electrode EL2 may be a cathode electrode.

In an embodiment of the disclosure, each of the light emitting elements LD included in the emission unit EMU may include an end (or a first end) connected to the first driving power supply VDD through the first electrode EL1 and another end (or a second end) connected to the second driving power supply VSS through the second electrode EL2. The first driving power supply VDD and the second driving power supply VSS may have different potentials. For example, the first driving power supply VDD may be set as high potential power, and the second driving power supply VSS may be set as low potential power. At this time, a potential difference between the first driving power supply VDD and the second driving power supply VSS may be set as a threshold voltage or more of the light emitting elements LD during an emission period of the pixel PXL.

As described above, the respective light emitting elements LD connected in parallel in the same direction (for example, a forward direction) between the first electrode EL1 and the second electrode EL2 to which voltages of different potentials are supplied may configure respective effective light sources. Such effective light sources may be gathered to configure the emission unit EMU of the pixel PXL.

The light emitting elements LD of the emission unit EMU may emit light with a luminance corresponding to a driving current supplied through the corresponding pixel circuit 144. For example, the pixel circuit 144 may supply a driving current corresponding to a grayscale value of corresponding frame data to the emission unit EMU during each frame period. The driving current supplied to the emission unit EMU may be divided and flow to the light emitting elements LD. Therefore, each of the light emitting elements LD may emit light with the luminance corresponding to the current flowing therethrough, and thus the emission unit EMU may emit light of the luminance corresponding to the driving current.

Figure 6A:
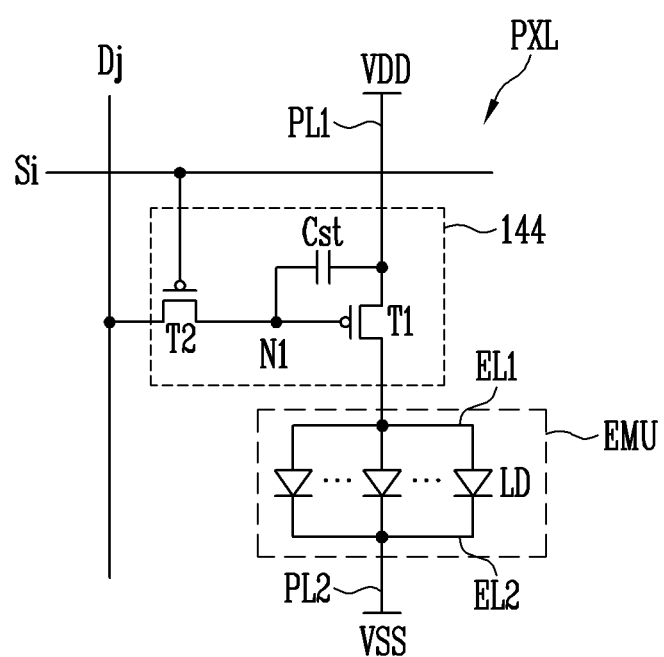
FIGS. 6A to 6E are circuit diagrams schematically illustrating an electrical connection relationship between components included in a pixel shown in FIG. 5 according to various embodiments.
Figure 6B:
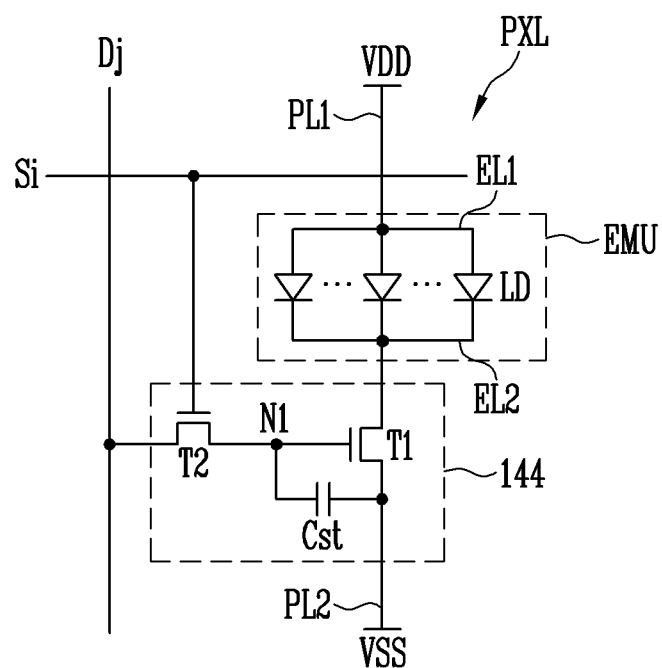
Figure 6C:
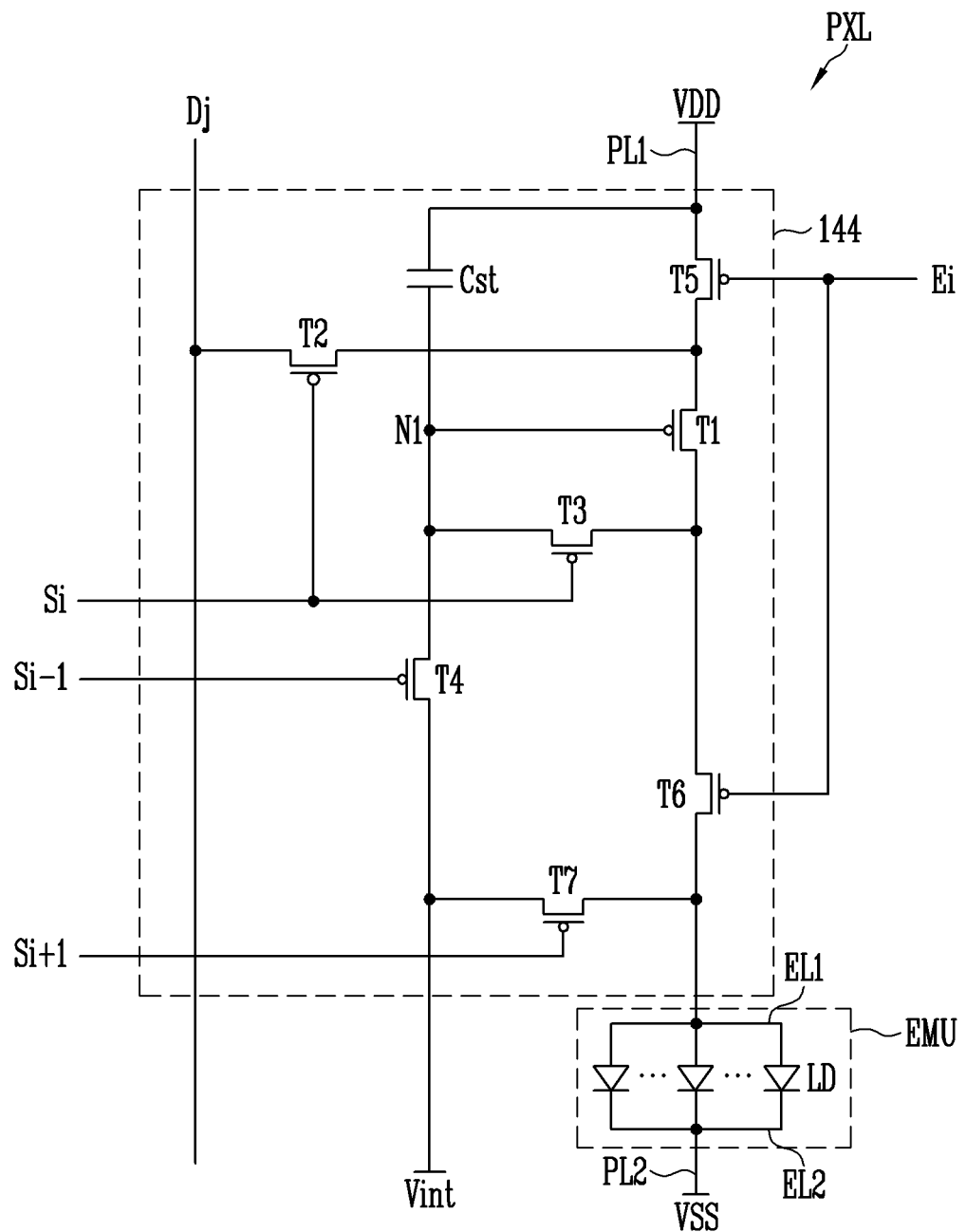
Figure 6D:
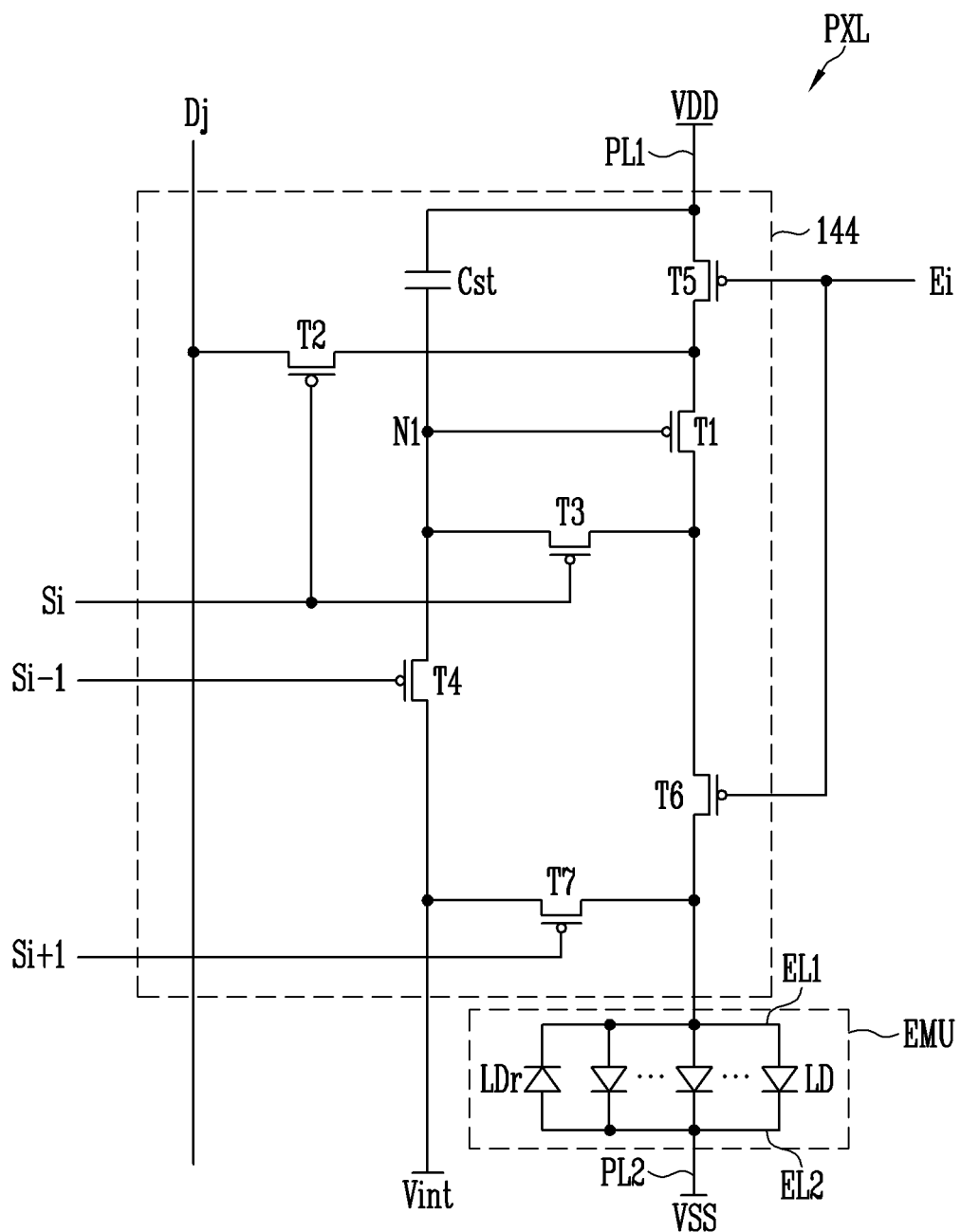
Figure 6E:
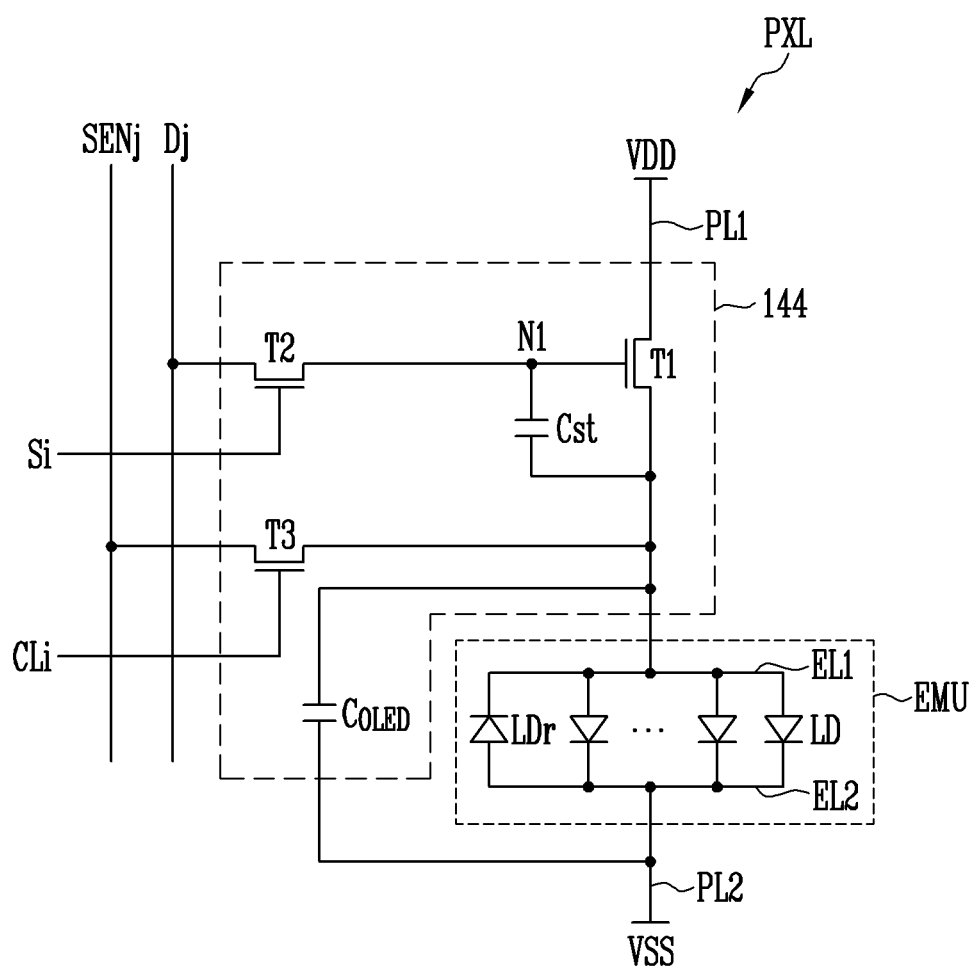

FIGS. 6A to 6E show an embodiment in which the ends of the light emitting elements LD are connected in the same direction between the first driving power supply VDD and the second driving power supply VSS, but the disclosure is not limited thereto. According to an embodiment, the emission unit EMU may further include at least one ineffective light source in addition to the light emitting elements LD configuring each effective light source. For example, at least one reverse light emitting element LDr may be further connected between the first and second electrodes EL1 and EL2 of the emission unit EMU, as shown in FIGS. 6D and 6E. The reverse light emitting element LDr may be connected in parallel between the first and second electrodes EL1 and EL2 together with the light emitting elements LD configuring the effective light sources, and may be connected between the first and second electrodes EL1 and EL2 in a direction opposite to the light emitting elements LD. The reverse light emitting element LDr maintains an inactive state even though a driving voltage (for example, a driving voltage of a forward direction) may be applied between the first and second electrodes EL1 and EL2, and thus a current substantially may not flow through the reverse light emitting element LDr.

The pixel circuit 144 may be connected to a scan line Si and a data line Dj of a corresponding pixel PXL. For example, in case that the pixel PXL is disposed in an i-th (i may be a natural number) row and a j-th (j may be a natural number) column of the display area DA, the pixel circuit 144 of the pixel PXL may be connected to the i-th scan line Si and the j-th data line Dj of the display area DA. According to an embodiment, the pixel circuit 144 may include first and second transistors T1 and T2 and a storage capacitor Cst as shown in FIGS. 6A and 6B. However, a structure of the pixel circuit 144 is not limited to an embodiment shown in FIGS. 6A and 6B.

First, referring to FIG. 6A, the pixel circuit 144 may include the first and second transistors T1 and T2 and the storage capacitor Cst.

A first terminal of the second transistor T2 (or a switching transistor) may be connected to the j-th data line Dj, and a second terminal may be connected to a first node N1. Here, the first terminal and the second terminal of the second transistor T2 may be different terminals, and for example, in case that the first terminal is a source electrode, the second terminal may be a drain electrode. A gate electrode of the second transistor T2 may be connected to the i-th scan line Si.

The second transistor T2 may be turned on in case that a scan signal of a voltage (for example, a low voltage) at which the second transistor T2 may be turned on from the i-th scan line Si is supplied, to electrically connect the j-th data line Dj and the first node N1 to each other. At this time, a data signal of a corresponding frame may be supplied to the j-th data line Dj, and thus the data signal may be transmitted to the first node N1. The data signal transmitted to the first node N1 may be charged in the storage capacitor Cst.

A first terminal of the first transistor T1 (or a driving transistor) may be connected to the first driving power supply VDD, and a second terminal may be electrically connected to the first electrode EL1 of each of the light emitting elements LD. A gate electrode of the first transistor T1 may be connected to the first node N1. The first transistor T1 controls an amount of the driving current supplied to the light emitting elements LD in response to a voltage of the first node N1.

An electrode of the storage capacitor Cst may be connected to the first driving power supply VDD, and another electrode may be connected to the first node N1. The storage capacitor Cst charges a voltage corresponding to the data signal supplied to the first node N1 and maintains the charged voltage until a data signal of a next frame may be supplied.

Each of FIGS. 6A and 6B shows the pixel circuit 144 including the second transistor T2 for transmitting the data signal into the pixel PXL, the storage capacitor Cst for storing the data signal, and the first transistor T1 for supplying the driving current corresponding to the data signal to the light emitting elements LD.

However, the disclosure is not limited thereto, and the structure of the pixel circuit 144 may be variously modified and implemented. For example, the pixel circuit 144 may further include other circuit elements such as at least one transistor element such as a transistor element for compensating for a threshold voltage of the first transistor T1, a transistor element for initializing the first node N1, and/or a transistor element for controlling an emission time of the light emitting element LD, or a boosting capacitor for boosting the voltage of the first node N1.

In FIG. 6A, the transistors included in the pixel circuit 144, for example, the first and second transistors T1 and T2 are P-type transistors, but the disclosure is not limited thereto. For example, at least one of the first and second transistors T1 and T2 included in the pixel circuit 144 may be changed to an N-type transistor.

Referring to FIGS. 1A to 4B, 5, and 6B, according to an embodiment of the disclosure, the first and second transistors T1 and T2 may be implemented as N-type transistors. A configuration or an operation of the pixel circuit 144 shown in FIG. 6B may be similar to that of the pixel circuit 144 of FIG. 6A except for a connection position change of some components due to a transistor type change. Therefore, a description thereof is briefly provided.

In an embodiment of the disclosure, the pixel circuit 144 shown in FIG. 6B may include the first and second transistors T1 and T2 formed of the N-type transistors, and the storage capacitor Cst. In case that the first and second transistors T1 and T2 are formed of the N-type transistors, the emission unit EMU may be connected between the first driving power supply VDD and the pixel circuit 144 for stabilization of the storage capacitor Cst that charges the voltage corresponding to the data signal supplied to the first node N1. However, the disclosure is not limited thereto, and according to an embodiment, the emission unit EMU shown in FIG. 6B may be connected between the pixel circuit 144 and the second driving power supply VSS. In an embodiment of the disclosure, the configuration of the pixel circuit 144 is not limited to an embodiment shown in FIGS. 6A and 6B. For example, the pixel circuit 144 may be configured as in an embodiment shown in FIGS. 6C and 6D.

As shown in FIGS. 6C and 6D, the pixel circuit 144 may be connected to the i-th scan line Si and the j-th data line Dj of the pixel PXL. According to an embodiment, the pixel circuit 144 may be further connected to at least another scan line. For example, the pixel PXL disposed in the i-th row of the display area DA may be further connected to an (i−1)-th scan line Si−1 and/or an (i+1)-th scan line Si+1. According to an embodiment, the pixel circuit 144 may be further connected to third power in addition to the first driving power supply VDD and the second driving power supply VSS. For example, the pixel circuit 144 may also be connected to initialization power Vint.

The pixel circuit 144 may include first to seventh transistors T1 to T7 and a storage capacitor Cst.

A terminal, for example, a source electrode of the first transistor T1 (or a driving transistor) may be connected to the first driving power supply VDD via the fifth transistor T5, and another terminal, for example, a drain electrode may be connected to the end of the light emitting elements LD via the sixth transistor T6. A gate electrode of the first transistor T1 may be connected to a first node N1. The first transistor T1 controls the driving current flowing between the first driving power supply VDD and the second driving power supply VSS via the light emitting elements LD in response to a voltage of the first node N1.

The second transistor T2 (or a switching transistor) may be connected between the j-th data line Dj connected to the pixel PXL and the source electrode of the first transistor T1. A gate electrode of the second transistor T2 may be connected to the i-th scan line Si connected to the pixel PXL. The second transistor T2 may be turned on in case that a scan signal of a gate-on voltage (for example, a low voltage) is supplied from the i-th scan line Si, to electrically connect the j-th data line Dj to the source electrode of the first transistor T1. Therefore, in case that the second transistor T2 is turned on, the data signal supplied from the j-th data line Dj may be transmitted to the first transistor T1.

The third transistor T3 may be connected between the drain electrode of the first transistor T1 and the first node N1. A gate electrode of the third transistor T3 may be connected to the i-th scan line Si. The third transistor T3 may be turned on in case that the scan signal of the gate-on voltage is supplied from the i-th scan line Si, to electrically connect the drain electrode of the first transistor T1 and the first node N1 to each other.

The fourth transistor T4 may be connected between the first node N1 and an initialization power line to which the initialization power Vint may be applied. A gate electrode of the fourth transistor T4 may be connected to a previous scan line, for example, the (i−1)-th scan line Si−1. The fourth transistor T4 may be turned on in case that the scan signal of the gate-on voltage is supplied to the (i−1)-th scan line Si−1, to transmit a voltage of the initialization power Vint to the first node N1. Here, the initialization power Vint may have a voltage equal to or less than the lowest voltage of the data signal.

The fifth transistor T5 may be connected between the first driving power supply VDD and the first transistor T1. A gate electrode of the fifth transistor T5 may be connected to a corresponding emission control line, for example, an i-th emission control line Ei. The fifth transistor T5 may be turned off in case that an emission control signal of a gate-off voltage is supplied to the i-th emission control line Ei, and may be turned on in other cases.

The sixth transistor T6 may be connected between the first transistor T1 and the end of the light emitting elements LD. A gate electrode of the sixth transistor T6 may be connected to the i-th emission control line Ei. The sixth transistor T6 may be turned off in case that the emission control signal of the gate-off voltage is supplied to the i-th emission control line Ei, and may be turned on in other cases.

The seventh transistor T7 may be connected between the end of the light emitting elements LD and the initialization power line. A gate electrode of the seventh transistor T7 may be connected to any one of next scan lines, for example, the (i+1)-th scan line Si+1. The seventh transistor T7 may be turned on in case that the scan signal of the gate-on voltage is supplied to the (i+1)-th scan line Si+1, to supply the voltage of the initialization power Vint to the end of the light emitting elements LD.

The storage capacitor Cst may be connected between the first driving power supply VDD and the first node N1. The storage capacitor Cst may store a data signal supplied to the first node N1 and a voltage corresponding to the threshold voltage of the first transistor T1 during each frame period.

In FIGS. 6C and 6D, the transistors included in the pixel circuit 144, for example, the first to seventh transistors T1 to T7 are P-type transistors, but the disclosure is not limited thereto. For example, at least one of the first to seventh transistors T1 to T7 may be changed to an N-type transistor.

In an embodiment of the disclosure, the configuration of the pixel circuit 144 is not limited to an embodiment shown in FIGS. 6A to 6D. For example, the pixel circuit 144 may be configured as in an embodiment shown in FIG. 6E.

The pixel circuit 144 may be further connected to a control line CLi and a sensing line SENj as shown in FIG. 6E. For example, the pixel circuit 144 of the pixel PXL disposed in the i-th row and the j-th column of the display area DA may be connected to an i-th control line CLi and a j-th sensing line SENj of the display area DA. The above-described pixel circuit 144 may further include a third transistor T3 and another capacitor $C_{OLED}$ in addition to the first and second transistors T1 and T2 shown in FIGS. 6A and 6B.

The third transistor T3 may be connected between the first transistor T1 and the j-th sensing line SENj. For example, a terminal of the third transistor T3 may be connected to the terminal (for example, the source electrode) of the first transistor T1 connected to the first electrode EL1, and another terminal of the third transistor T3 may be connected to the j-th sensing line SENj. In case that the j-th sensing line SENj is omitted, a gate electrode of the third transistor T3 may be connected to the j-th data line Dj.

According to an embodiment, a gate electrode of the third transistor T3 may be connected to the i-th control line CLi. In case that the i-th control line CLi is omitted, the gate electrode of the third transistor T3 may be connected to the i-th scan line Si. The third transistor T3 may be turned on by a control signal of a gate-on voltage (for example, a high level) supplied to the i-th control line CLi during a sensing period, to electrically connect the j-th sensing line SENj and the first transistor T1 to each other.

According to an embodiment, a sensing period may be a period for extracting characteristic information (for example, the threshold voltage or the like of the first transistor T1) of each of the pixels PXL disposed in the display area DA. During the above-described sensing period, the first transistor T1 may be turned on by supplying a reference voltage at which the first transistor T1 may be turned on to the first node N1 through the j-th data line Dj and the second transistor T2, or connecting each pixel PXL to a current source or the like. The first transistor T1 may be connected to the j-th sensing line SENj by supplying the control signal of the gate-on voltage to the third transistor T3 to turn on the third transistor T3. Accordingly, the characteristic information of each pixel PXL including the threshold voltage or the like of the first transistor T1 may be extracted through the j-th sensing line SENj. The extracted characteristic information may be used to convert image data so that a characteristic deviation between the pixels PXL may be compensated.

An electrode of the other capacitor $C_{OLED}$ may be connected to the first electrode EL1, and another electrode may be connected to the second power line PL2 to which the second driving power supply VDD may be applied. Such another capacitor $C_{OLED}$ may reduce coupling between the light emitting elements LD of the emission unit EMU.

FIG. 6E discloses an embodiment in which all of the first to third transistors T1 to T3 are N-type transistors, but the disclosure is not limited thereto. For example, at least one of the above-described first to third transistors T1 to T3 may be changed to a P-type transistor. FIG. 6E discloses an embodiment in which the emission unit EMU may be connected between the pixel circuit 144 and the second driving power supply VSS, but the emission unit EMU may also be connected between the first driving power supply VDD and the pixel circuit 144.

FIGS. 6A to 6E show an embodiment in which all of the light emitting elements LD configuring each emission unit EMU are connected in parallel, but the disclosure is not limited thereto. According to an embodiment, the emission unit EMU may include at least one or more series stages including the light emitting elements LD connected in parallel with each other. For example, the emission unit EMU may be configured in a series/parallel mixed structure. This is described later with reference to FIGS. 7A and 7B.

The structure of the pixel PXL that may be applied to the disclosure is not limited to embodiments shown in FIGS. 6A to 6E, and the corresponding pixel may have various structures. In another embodiment of the disclosure, each pixel PXL may be configured inside a passive type light emitting display device or the like. The pixel circuit 144 may be omitted, and each of the ends of the light emitting elements LD included in the emission unit EMU may be directly connected to each of the scan lines Si−1, Si, and Si+1, the j-th data line Dj, the first power line PL1 to which the first driving power supply VDD may be applied, the second power line PL2 to which the second driving power supply VSS may be applied, a control line, and/or the like.

Figure 7A:
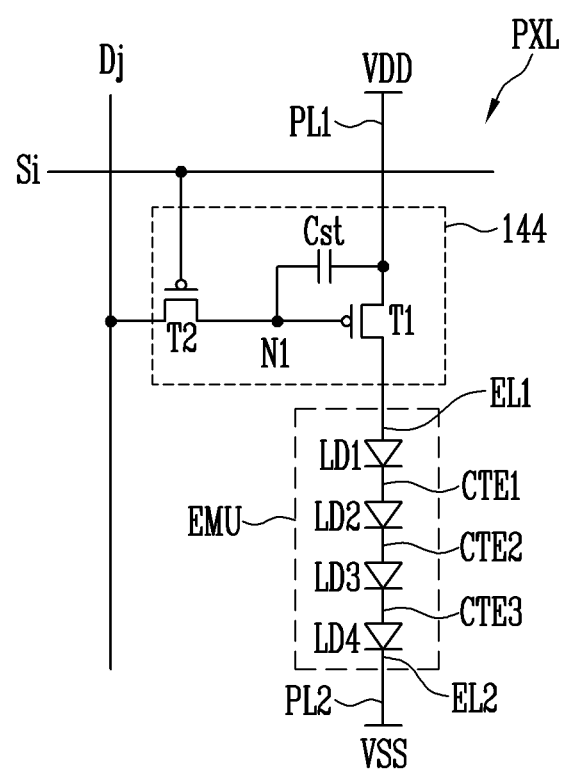
FIGS. 7A and 7B are circuit diagrams schematically illustrating the electrical connection relation of the components included in a pixel PXL shown in FIG. 5 according to another embodiment.
Figure 7B:
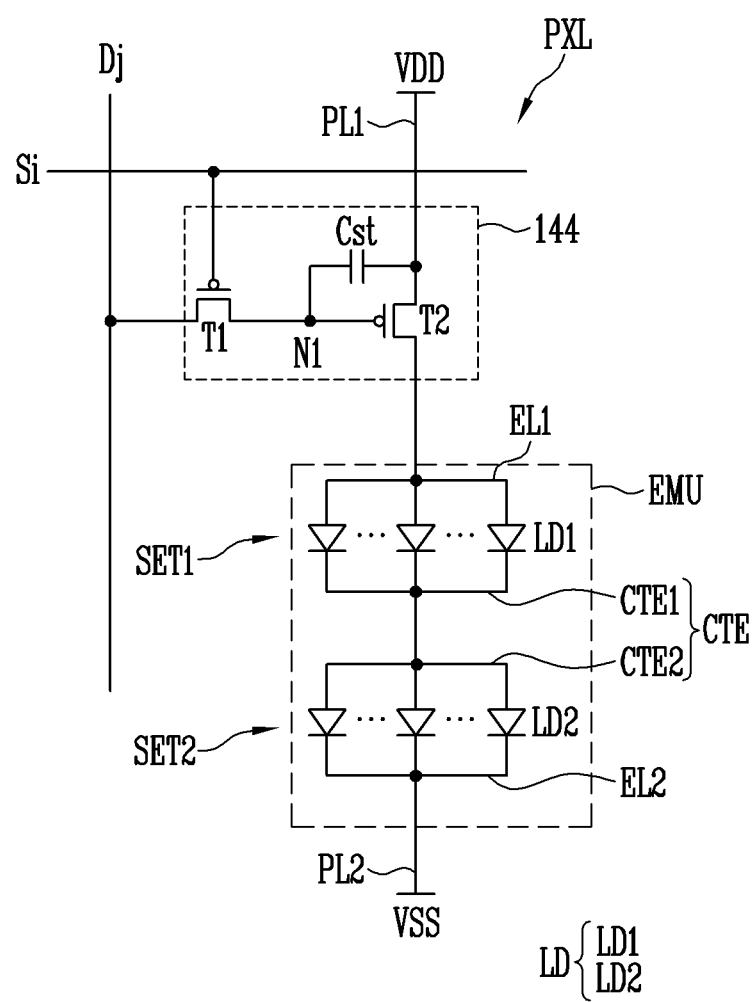

FIGS. 7A and 7B are circuit diagrams schematically illustrating the electrical connection relation of the components included in a pixel PXL shown in FIG. 5 according to another embodiment. In FIGS. 7A and 7B, the emission unit EMU of each pixel PXL may include multiple series stages (or stages) which may be successively connected to each other. In describing embodiments of FIGS. 7A and 7B, in order to avoid a redundant description, a detailed description of a configuration similar or identical to that of embodiments of FIGS. 6A to 6E, for example, the pixel circuit 144, is omitted.

First, referring to FIG. 7A, the emission unit EMU may include multiple light emitting elements LD connected in series to each other. For example, the emission unit EMU may include a first light emitting element LD1, a second light emitting element LD2, a third light emitting element LD3, and a fourth light emitting element LD4 connected in series in a forward direction between the first driving power supply VDD and the second driving power supply VSS to configure an effective light source. In the following embodiment, at least one random light emitting element among the first to fourth light emitting elements LD1 to LD4 or comprehensive first to fourth light emitting elements LD1 to LD4 may be referred to as the light emitting element LD or the light emitting elements LD.

An end (for example, the second semiconductor layer) of the first light emitting element LD1 may be connected to the first driving power supply VDD through the first electrode EL1, and another end (for example, the first semiconductor layer) of the first light emitting element LD1 may be connected to an end (for example, the second semiconductor layer) of the second light emitting element LD2 through a first intermediate electrode CTE1 connected between first and second series stages.

The end (for example, the second semiconductor layer) of the second light emitting element LD2 may be connected to the first intermediate electrode CTE1, and another end (for example, the first semiconductor layer) of the second light emitting element LD2 may be connected to an end (for example, the second semiconductor layer) of the third light emitting element LD3 through a second intermediate electrode CTE2 connected between second and third series stages.

The end of the third light emitting element LD3 may be connected to the second intermediate electrode CTE2, and another end (for example, the first semiconductor layer) of the third light emitting element LD3 may be connected to an end (for example, the second semiconductor layer) of the fourth light emitting element LD4 through a third intermediate electrode CTE3 connected between third and fourth series stages.

The end of the fourth light emitting element LD4 may be connected to the third intermediate electrode CTE3, and another end (for example, the first semiconductor layer) of the fourth light emitting element LD4 may be connected to the second driving power supply VSS through the second electrode EL2.

As described above, the first to fourth light emitting elements LD1 to LD4 may be connected in series between the first and second electrodes EL1 and EL2 of the emission unit EMU of the pixel PXL.

In a case of the emission unit EMU of a structure in which the light emitting elements LD are connected in series, a voltage applied between the first and second electrodes EL1 and EL2 may increase and a magnitude of the driving current flowing through the emission unit EMU may decrease compared to an emission unit EMU of a structure in which the light emitting elements LD are connected in parallel. Therefore, in case that the emission unit EMU of each pixel PXL is configured in a series structure, power consumption of the display device may be reduced.

According to an embodiment, at least one series stage may be provided in a form including multiple light emitting elements LD connected in parallel to each other. The emission unit EMU of each pixel PXL may be configured in a series/parallel mixed structure. For example, the emission unit EMU may be configured as shown in FIG. 7B.

Referring to FIG. 7B, the emission unit EMU of the pixel PXL may include multiple series stages sequentially connected between the first driving power supply VDD and the second driving power supply VSS. Each series stage may include one or more light emitting elements LD connected in a forward direction between two electrodes configuring an electrode pair of a corresponding series stage. For example, the emission unit EMU may include first and second series stages SET1 and SET2 sequentially connected between the first driving power supply VDD and the second driving power supply VSS. Each of the first and second series stages SET1 and SET2 may include two electrodes EL1 and CTE1, and CTE2 and EL2 configuring an electrode pair of a corresponding series stage, and multiple light emitting elements LD connected in parallel in a forward direction, for example, in the same direction, between the two electrodes EL1 and CTE1, and CTE2 and EL2.

The first series stage SET1 may include the first electrode EL1 and the first intermediate electrode CTE1 among the two electrodes EL1 and CTE1, and CTE2 and EL2 forming an electrode pair included in the emission unit EMU, and at least one first light emitting element LD1 connected between the first electrode EL1 and the first intermediate electrode CTE1. For example, the first series stage SET1 may include the first electrode EL1 connected to the first driving power supply VDD via the pixel circuit 144, the first intermediate connected to the second driving power supply VSS, and the first light emitting elements LD1 connected between the first electrode EL1 and the first intermediate electrode CTE1. An end (for example, a p-type semiconductor layer) of each of the first light emitting elements LD1 may be electrically connected to the first electrode EL1 of the first series stage SET1, and another end (for example, an n-type semiconductor layer) thereof may be electrically connected to the first intermediate electrode CTE1 of the first series stage SET1. The first light emitting elements LD1 may be connected in parallel between the first electrode EL1 and the first intermediate electrode CTE1 of the first series stage SET1, and may be connected in the same direction (for example, the forward direction) between the first electrode EL1 and the first intermediate electrode CTE1. According to an embodiment, at least one reverse light emitting element (refer to LDr of FIGS. 6D and 6E) may be further connected to the first series stage SET1. The reverse light emitting element LDr may be connected in parallel between the first electrode EL1 and the first intermediate electrode CTE1 together with the first light emitting elements LD1 configuring the effective light sources, and may be connected between the first electrode EL1 and the first intermediate electrode CTE1 in a direction opposite to the first light emitting elements LD1. The reverse light emitting element LDr maintains an inactive state even though a driving voltage (for example, a forward driving voltage) may be applied between the first electrode EL1 and the first intermediate electrode CTE1, and thus a current substantially may not flow through the reverse light emitting element LDr.

The second series stage SET2 may include the second intermediate electrode CTE2 and the second electrode EL2 among the two electrodes EL1 and CTE1, and CTE2 and EL2 forming an electrode pair included in the emission unit EMU, and at least one second light emitting element LD2 connected between the second intermediate electrode CTE2 and the second electrode EL2. For example, the second series stage SET2 may include the second intermediate electrode CTE2 connected to the first driving power supply VDD via the pixel circuit 144 and the first series stage SET1, the second electrode EL2 connected to the second driving power supply VSS, and multiple second light emitting elements LD2 connected between the second intermediate electrode CTE2 and the second electrode EL2. An end (for example, a p-type semiconductor layer) of each second light emitting element LD2 may be electrically connected to the second intermediate electrode CTE2 of the second series stage SET2, and another end (for example, an n-type semiconductor layer) may be electrically connected to the second electrode EL2 of the second series stage SET2. The second light emitting elements LD2 may be connected in parallel between the second intermediate electrode CTE2 and the second electrode EL2 of the second series stage SET2, and may be connected in the same direction (for example, the forward direction) between the first driving power supply VDD and the second driving power supply VSS through the second intermediate electrode CTE2 and the second electrode EL2. According to an embodiment, at least one reverse light emitting element LDr may be further connected between the second intermediate electrode CTE2 and the second electrode EL2. The reverse light emitting element LDr may be connected in parallel between the second intermediate electrode CTE2 and the second electrode EL2 together with the second light emitting elements LD2 configuring the effective light sources, and may be connected between the second intermediate electrode CTE2 and the second electrode EL2 in a direction opposite to the second light emitting elements LD2.

In an embodiment of the disclosure, the first intermediate electrode CTE1 of the first series stage SET1 and the second intermediate electrode CTE2 of the second series stage SET2 may be integrally provided to be connected to each other. For example, the first intermediate electrode CTE1 of the first series stage SET1 and the second intermediate electrode CTE2 of the second series stage SET2 may configure an intermediate electrode CTE connecting the first series stage SET1 and the second series stage SET2. As described above, in case that the first intermediate electrode CTE1 of the first series stage SET1 and the second intermediate electrode CTE2 of the second series stage SET2 are integrally provided, the first intermediate electrode CTE1 and the second intermediate electrode CTE2 may be different areas of the intermediate electrode CTE.

In an above-described embodiment, the first electrode EL1 of the first series stage SET1 may be the anode electrode of the emission unit EMU of each pixel PXL, and the second electrode EL2 of the second series stage SET2 may be the cathode electrode of the emission unit EMU.

As described above, the emission unit EMU of the pixel PXL including the light emitting elements LD connected in the series/parallel mixed structure may easily adjust a driving current/voltage condition according to an applied product specification.

In particular, the emission unit EMU of the pixel PXL including the light emitting elements LD connected in the series/parallel mixed structure may reduce the driving current compared to the emission unit EMU of the structure in which the light emitting elements LD may be connected in parallel. The emission unit EMU of the pixel PXL including the light emitting elements LD connected in the series/parallel mixed structure may reduce the driving voltage applied to the ends of the emission unit EMU compared to the emission unit EMU of the structure in which all of the light emitting elements LD are connected in series. In a case where all of the light emitting elements LD are connected only in series, in case that at least one of the light emitting elements LD connected in series is not completely connected in the forward direction (or the reverse light emitting element LDr is included), a path through which the driving current may flow in the pixel PXL may be blocked, and thus a dark spot defect may be caused. On the other hand, in a case where the light emitting elements LD are connected in the series/parallel mixed structure, even though some light emitting elements LD are not connected in the forward direction (or the reverse light emitting element LDr is included) or a defect occurs in some light emitting elements LD in each series stage, the driving current may flow through another light emitting element LD of a corresponding series stage. Accordingly, a defect of the pixel PXL may be prevented or reduced.

Figure 8:
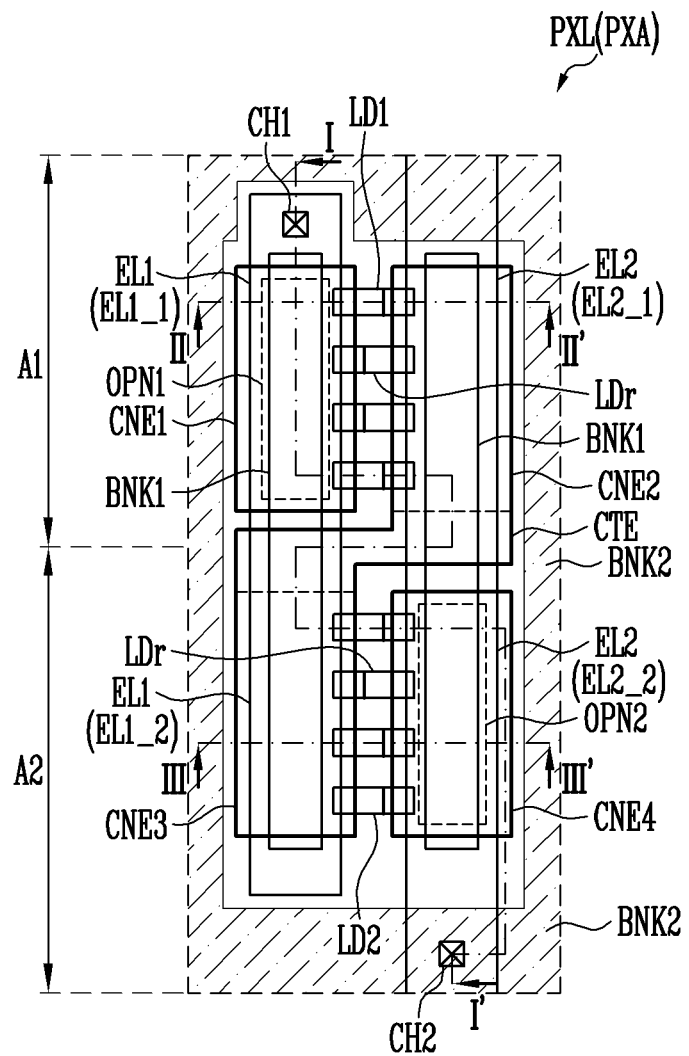
FIG. 8 is a plan view schematically illustrating a pixel among the pixels shown in FIG. 5.
Figure 9:
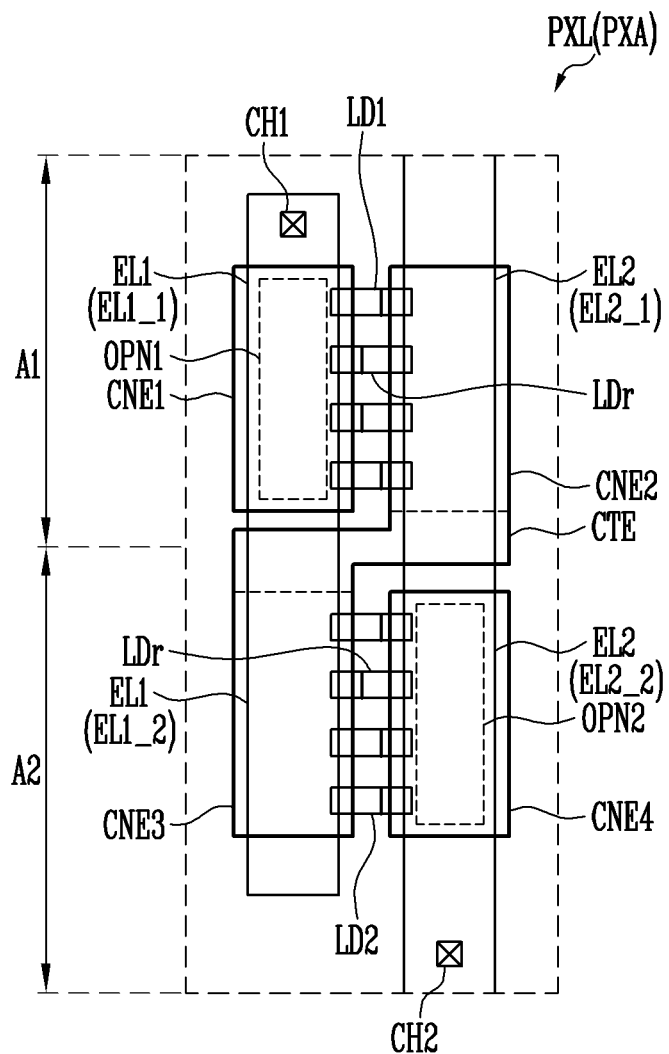
FIG. 9 is a plan view schematically illustrating only first and second electrodes, contact electrodes, light emitting elements, and an opening of FIG. 8.
Figure 9:
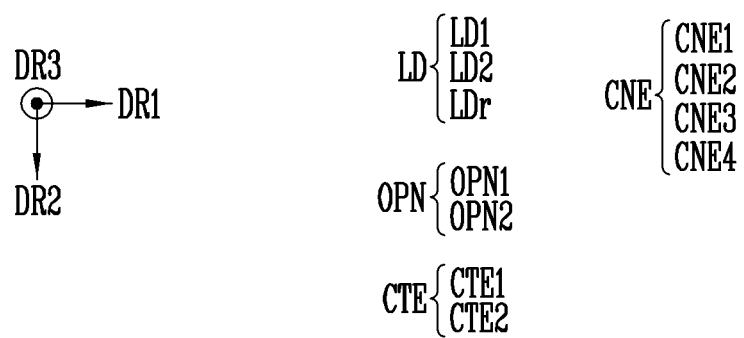
Figure 10:
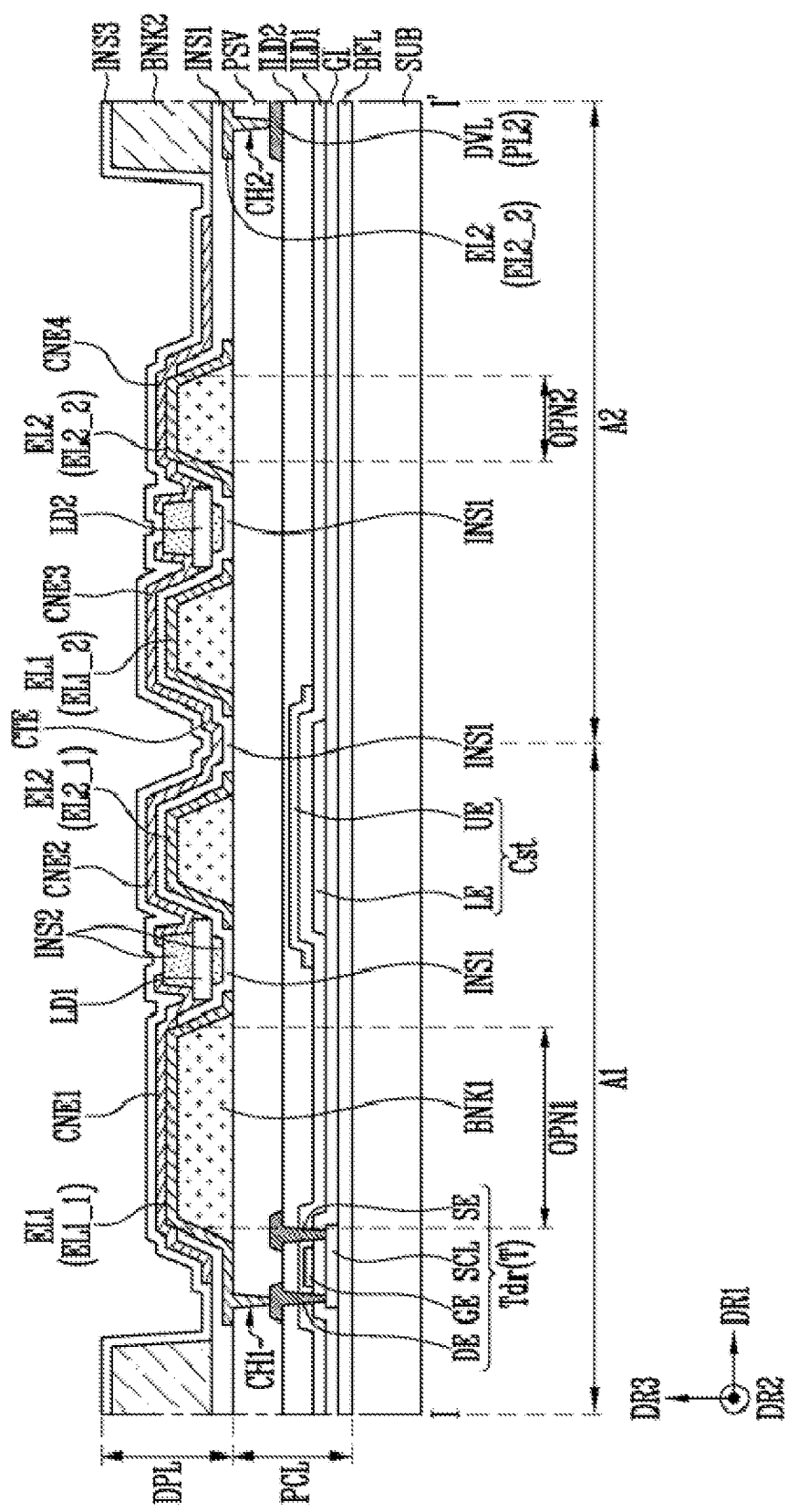
FIG. 10 is a schematic cross-sectional view taken along line I~I' of FIG. 8.
Figure 11:
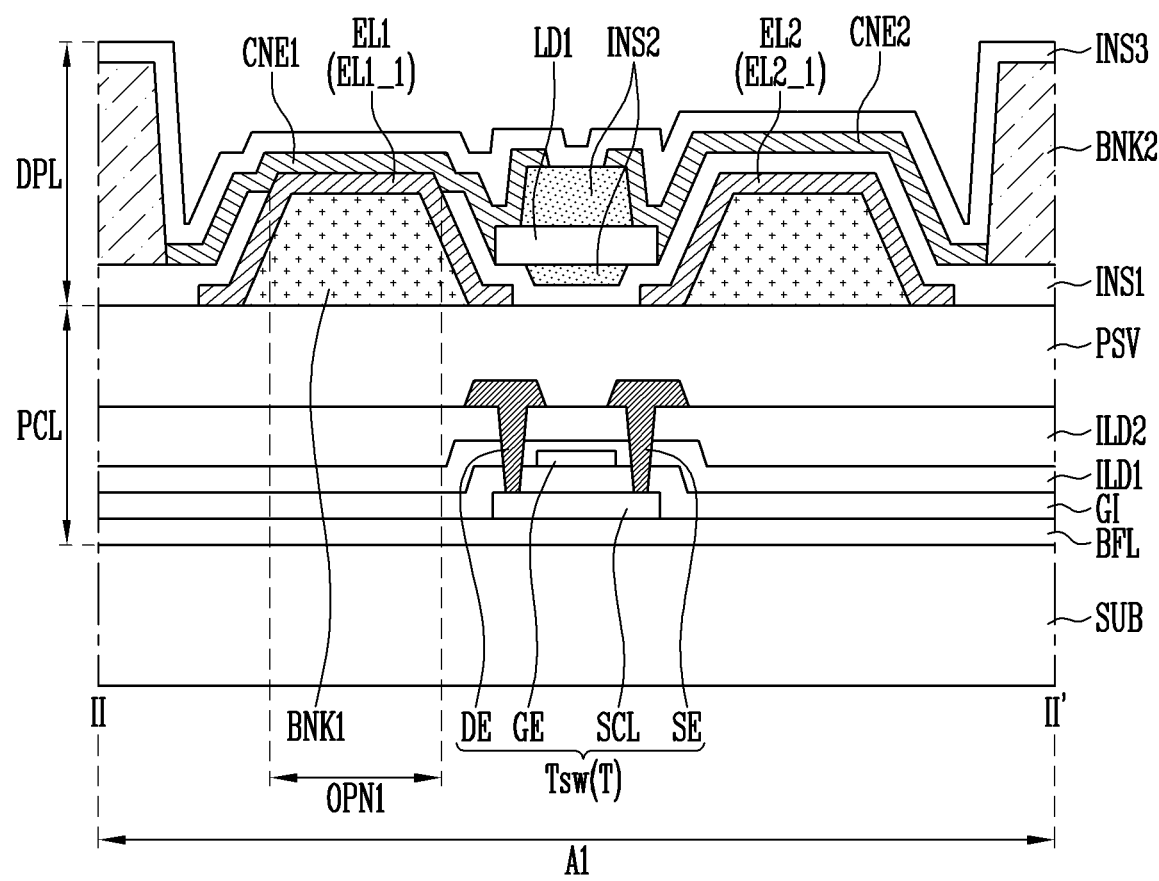
FIG. 11 is a schematic cross-sectional view taken along line II~II' of FIG. 8.
Figure 12:
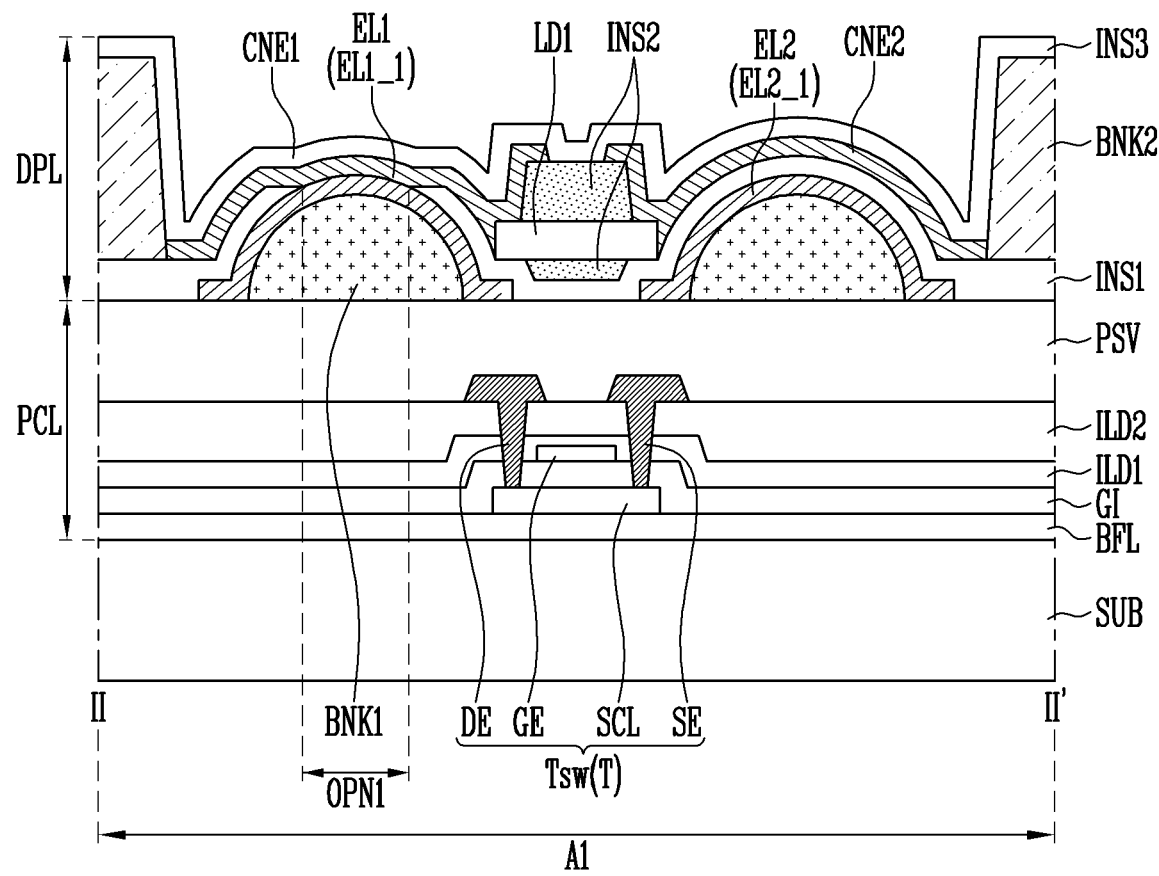
FIG. 12 is a schematic cross-sectional view corresponding to line II~II' of FIG. 8 as an implementation of a first bank pattern shown in FIG. 11 according to another embodiment.
Figure 13:
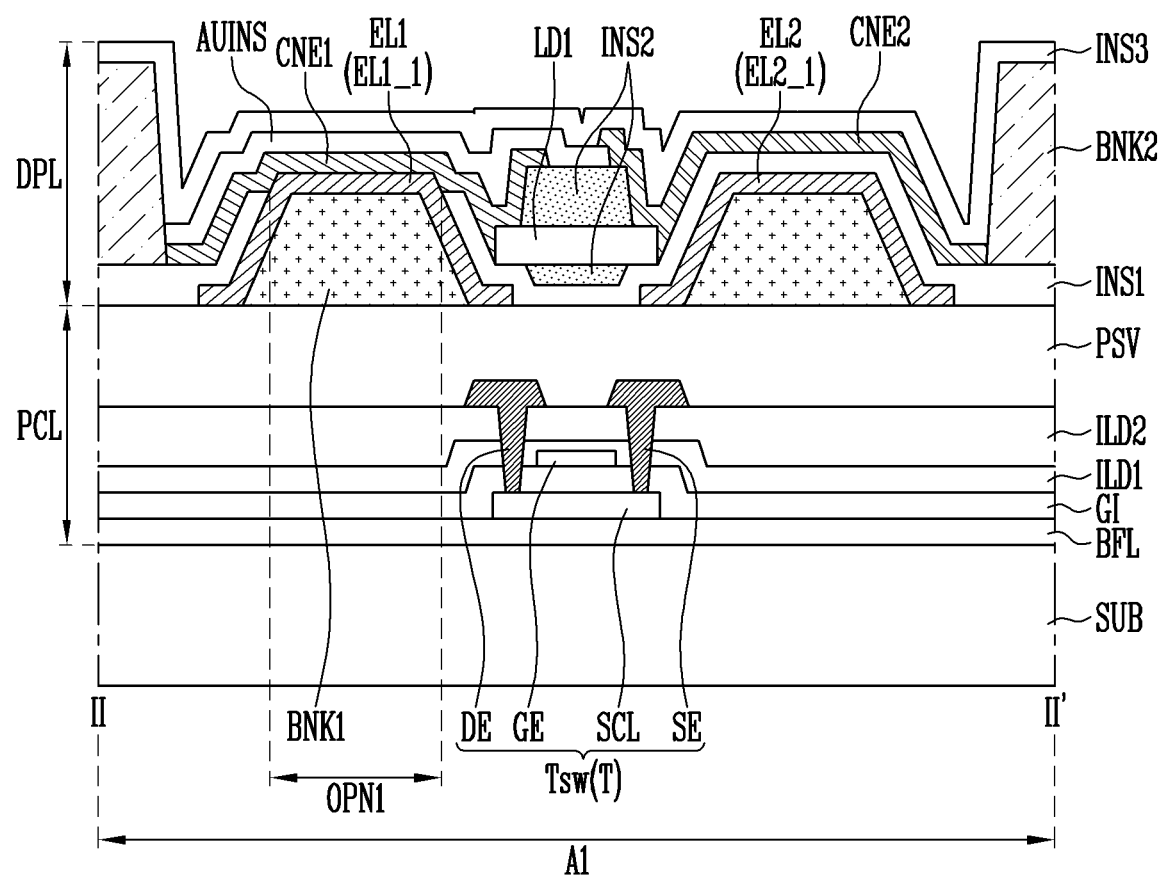
FIG. 13 is a schematic cross-sectional view corresponding to line II~II' of FIG. 8 as an implementation of a second contact electrode shown in FIG. 11 according to another embodiment.
Figure 14:
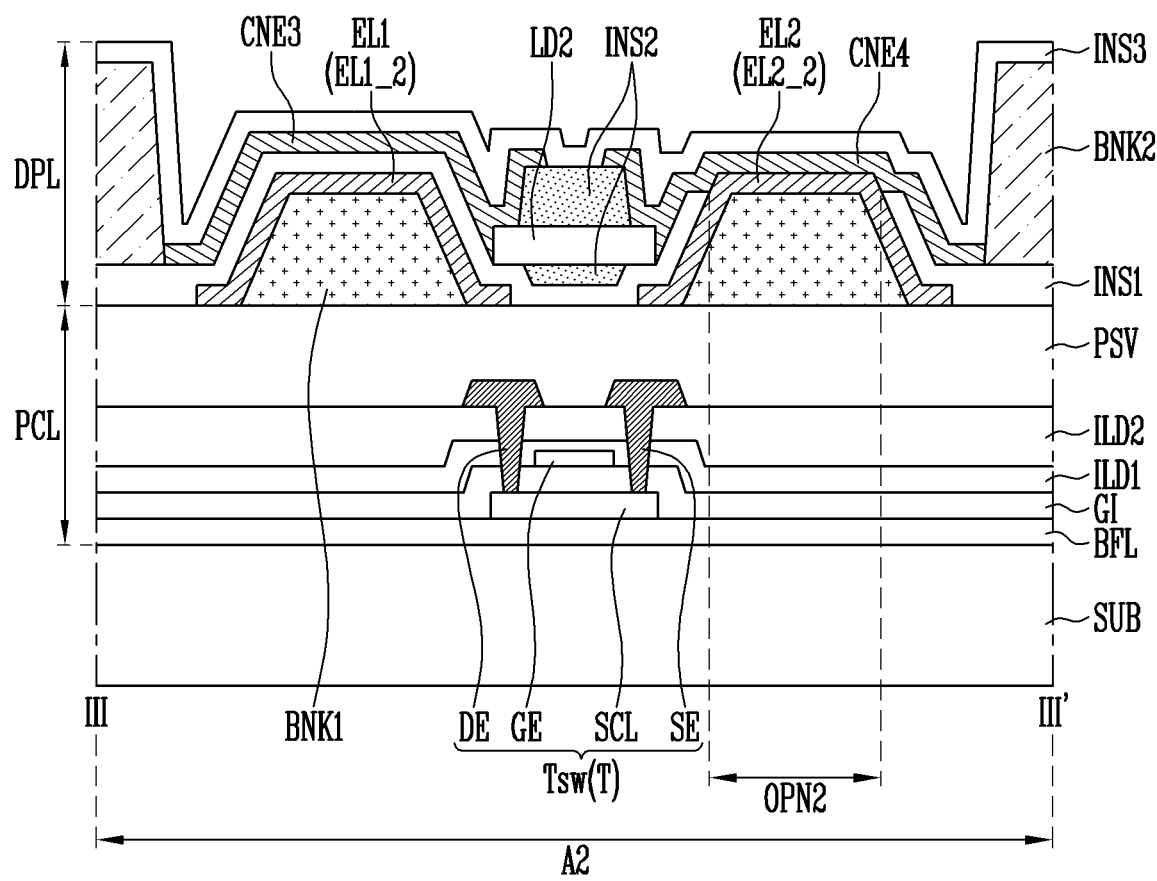
FIG. 14 is a schematic cross-sectional view taken along line III~III' of FIG. 8.
Figure 15:
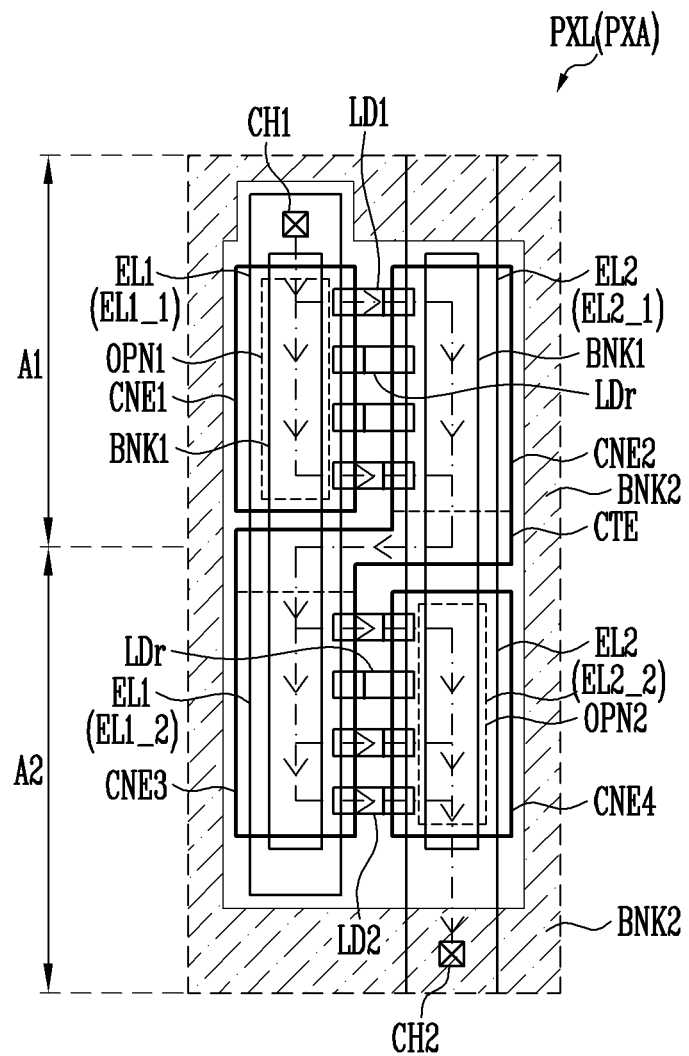
FIG. 15 is a plan view schematically illustrating a driving current flowing through a pixel according to an embodiment of the disclosure, and illustrates, for example, flow of the driving current flowing through the pixel of FIG. 8.
Figure 16A:
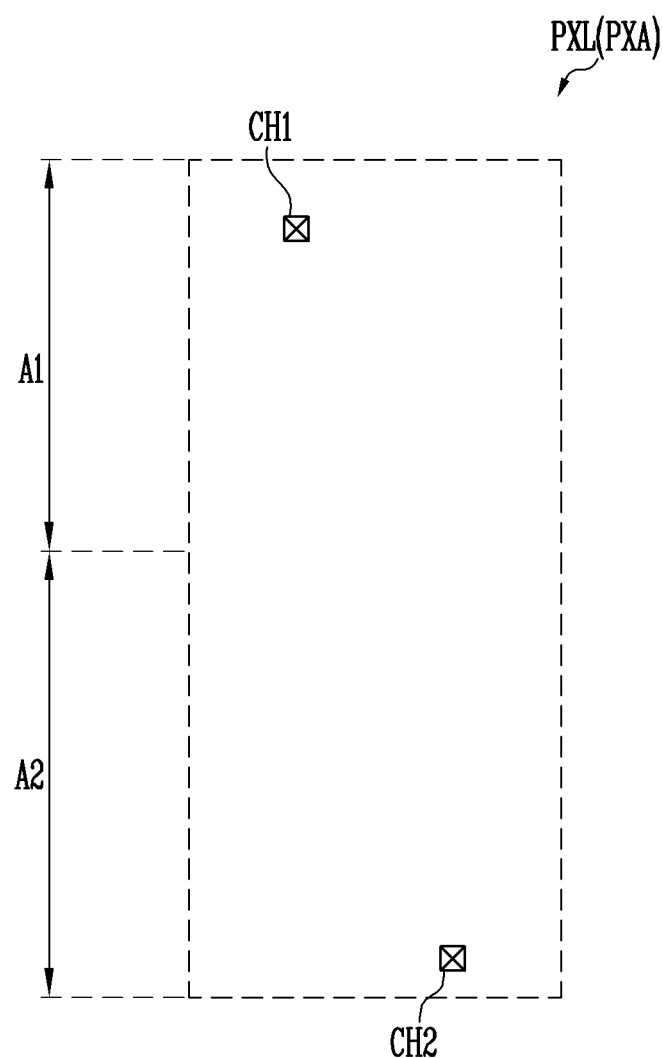
FIGS. 16A to 16G are schematic plan views sequentially illustrating a method of manufacturing the pixel PXL shown in FIG. 8.
Figure 16B:
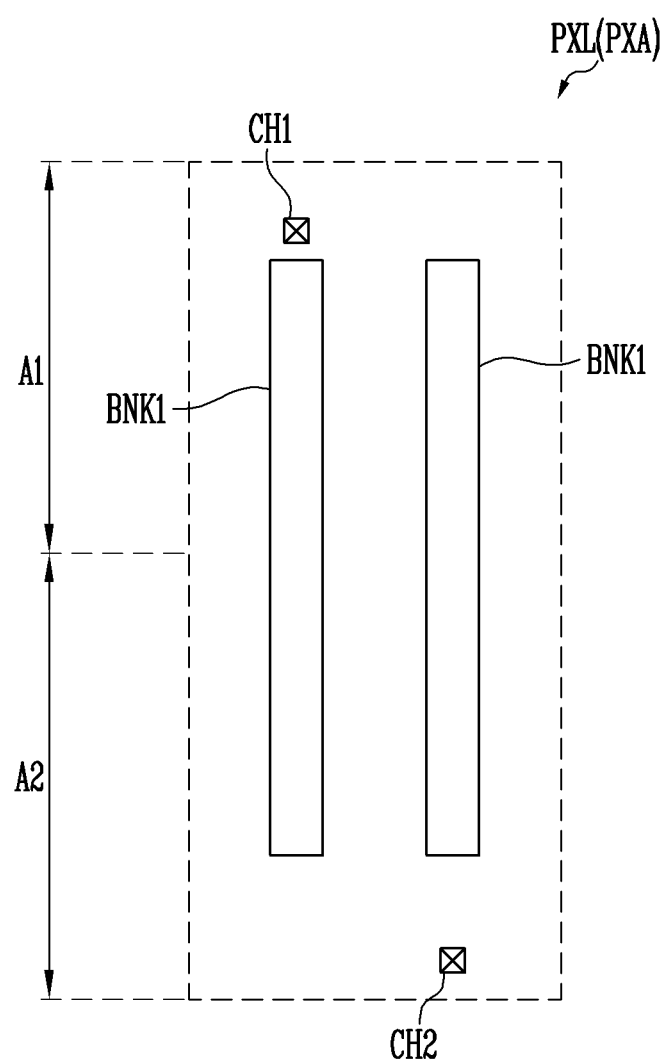
Figure 16C:
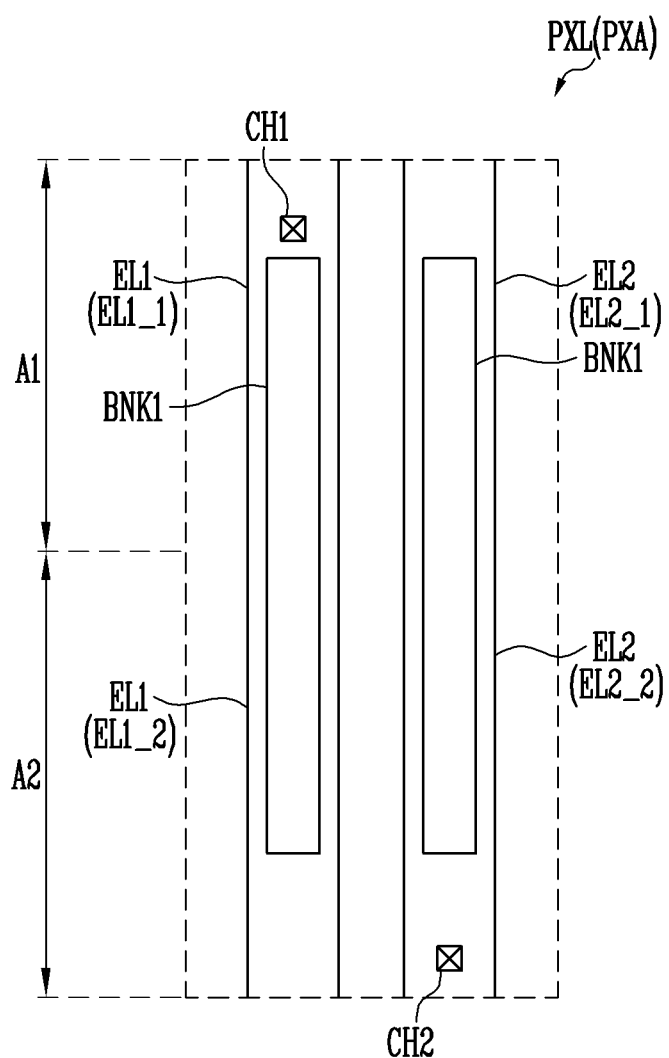
Figure 16D:
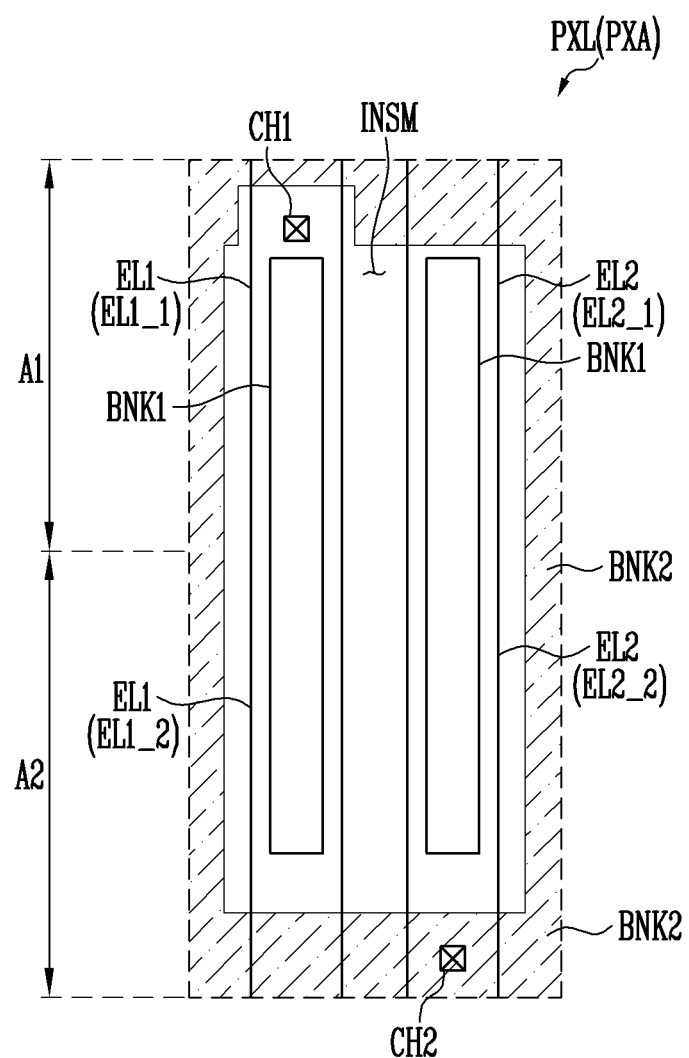
Figure 16E:
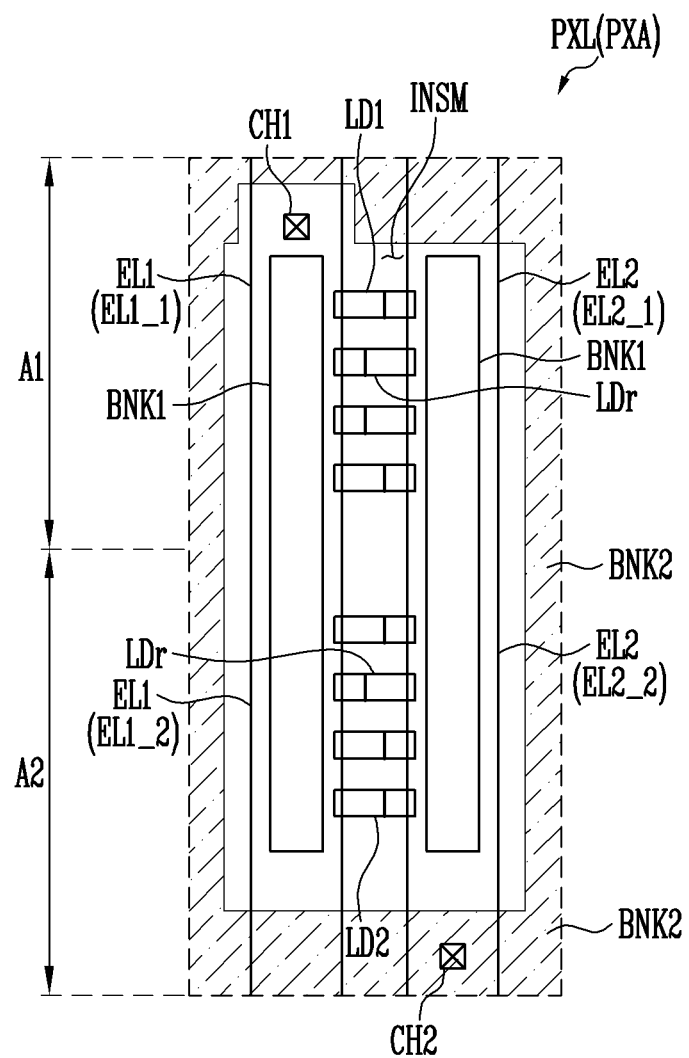
Figure 16E:
Figure 16F:
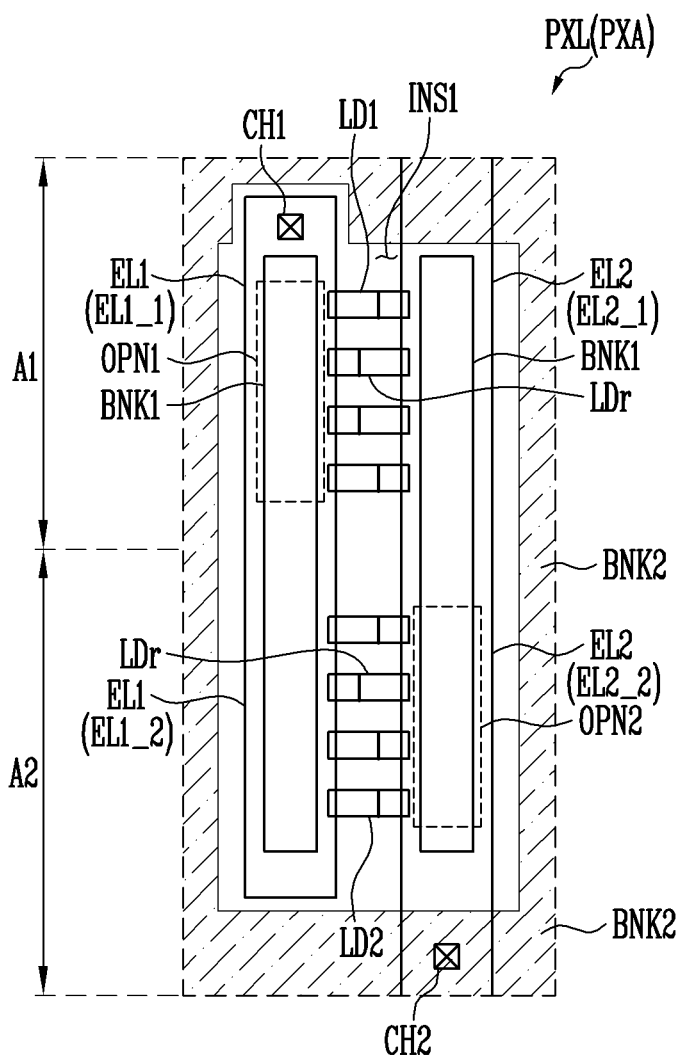
Figure 16G:
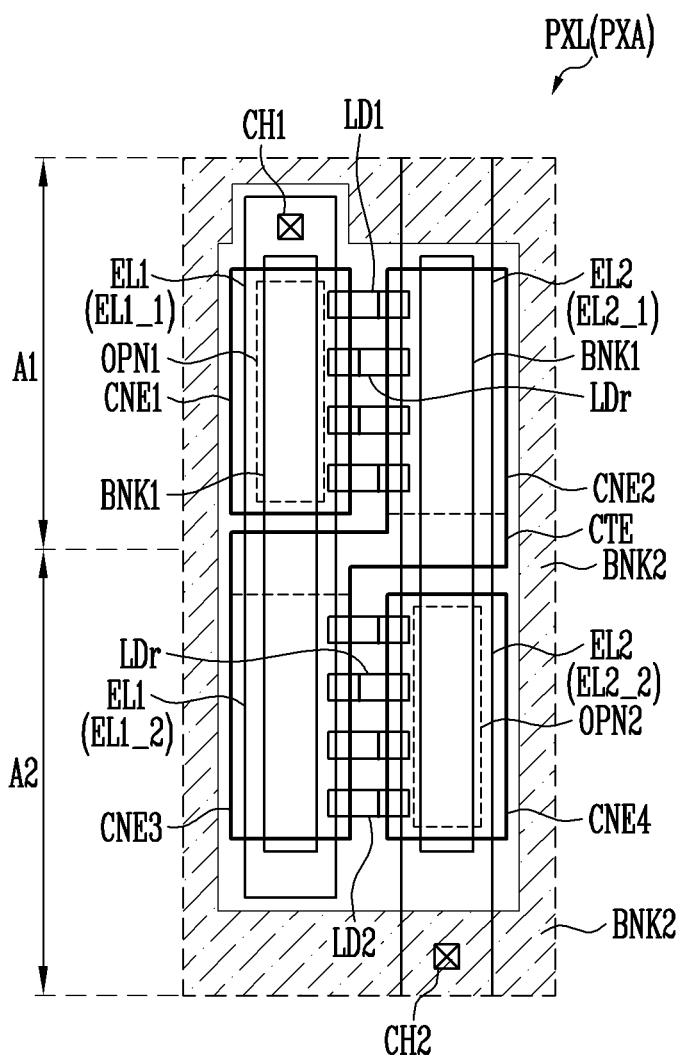
Figure 17A:
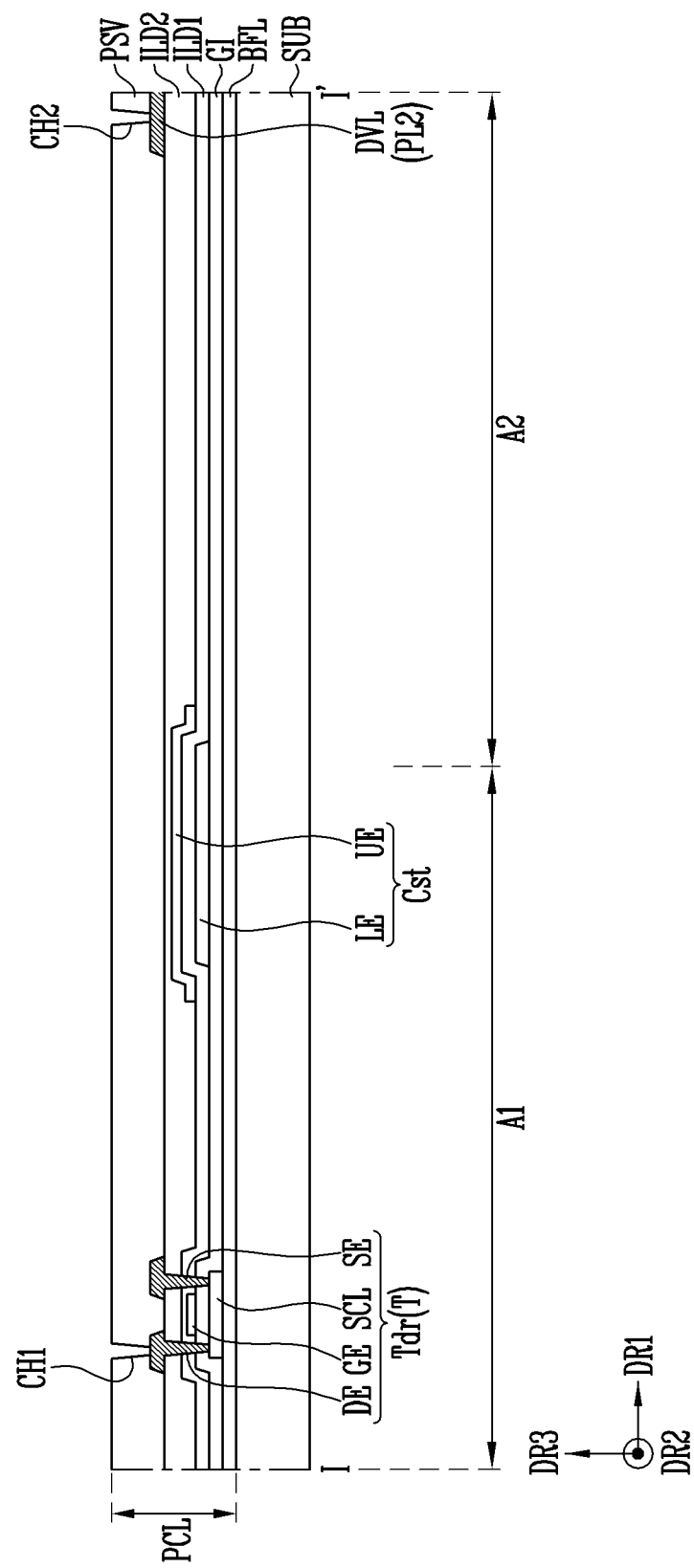
FIGS. 17A to 17H are schematic cross-sectional views sequentially illustrating a method of manufacturing a pixel shown in FIG. 10.
Figure 17B:
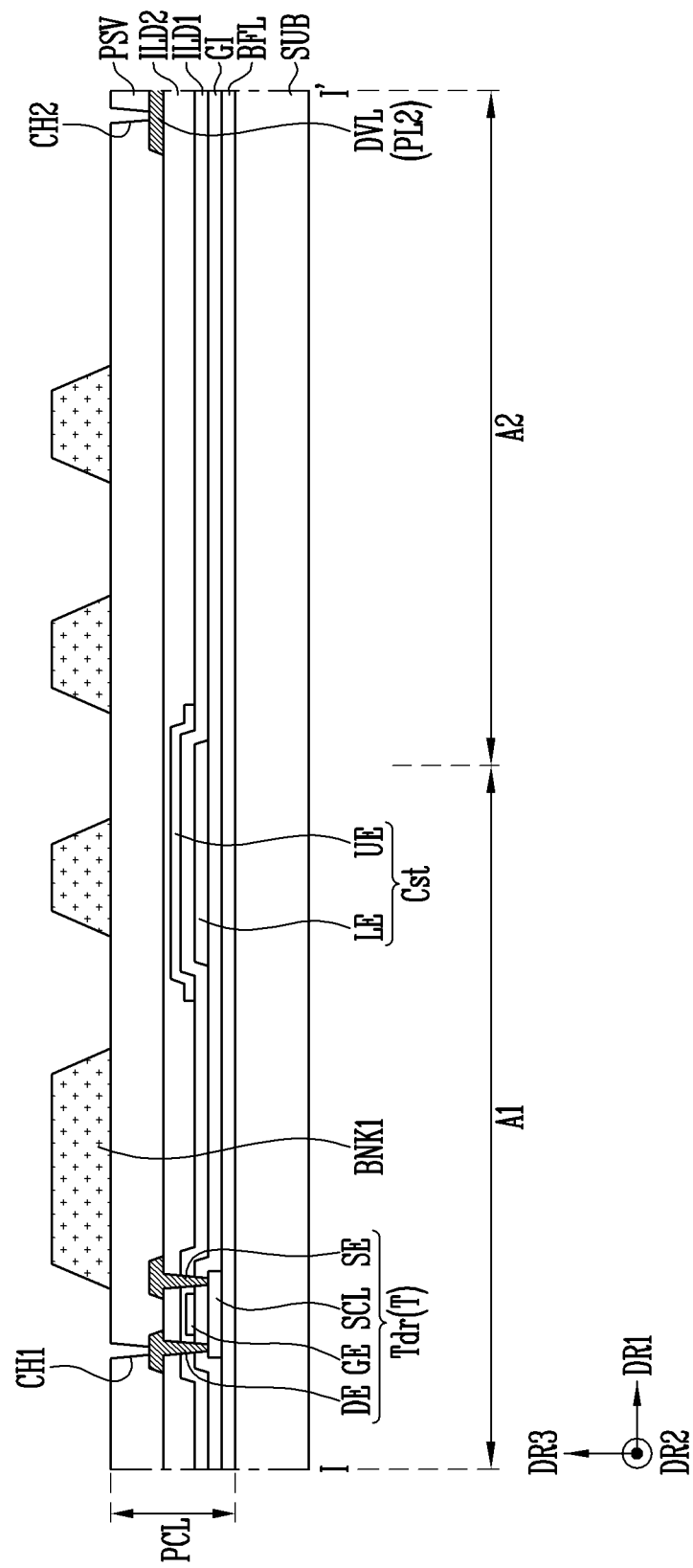
Figure 17C:
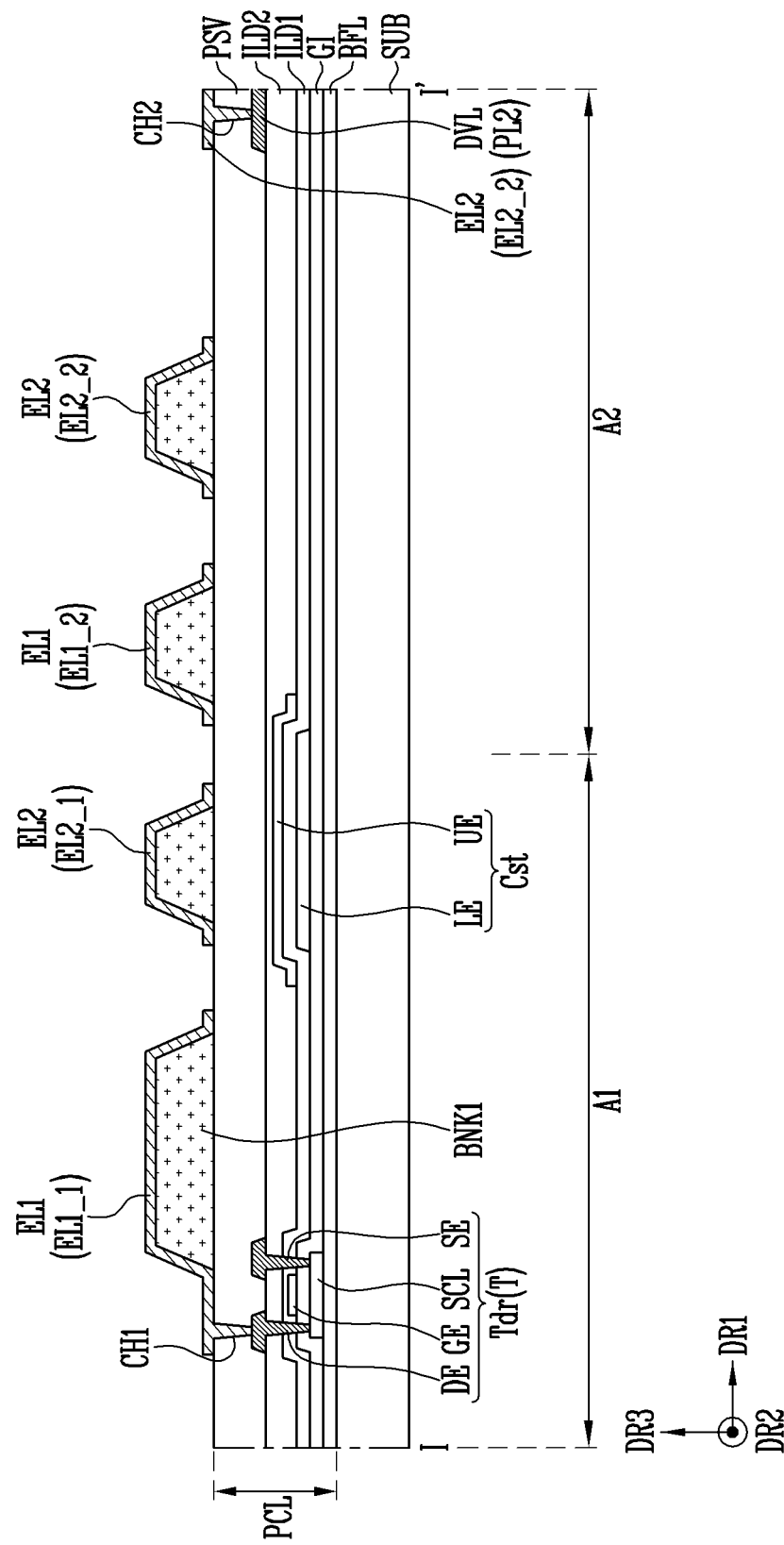
Figure 17D:
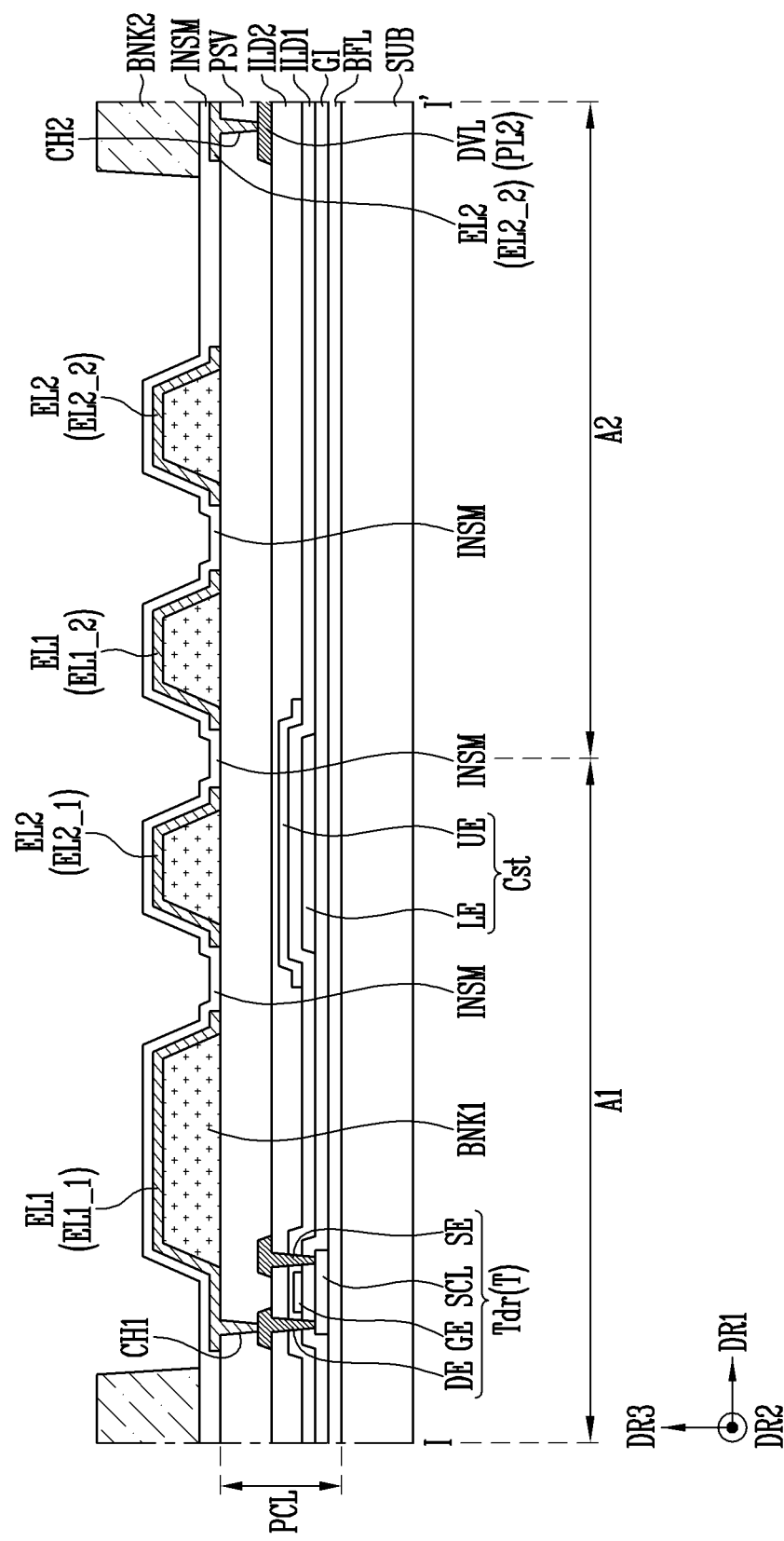
Figure 17E:
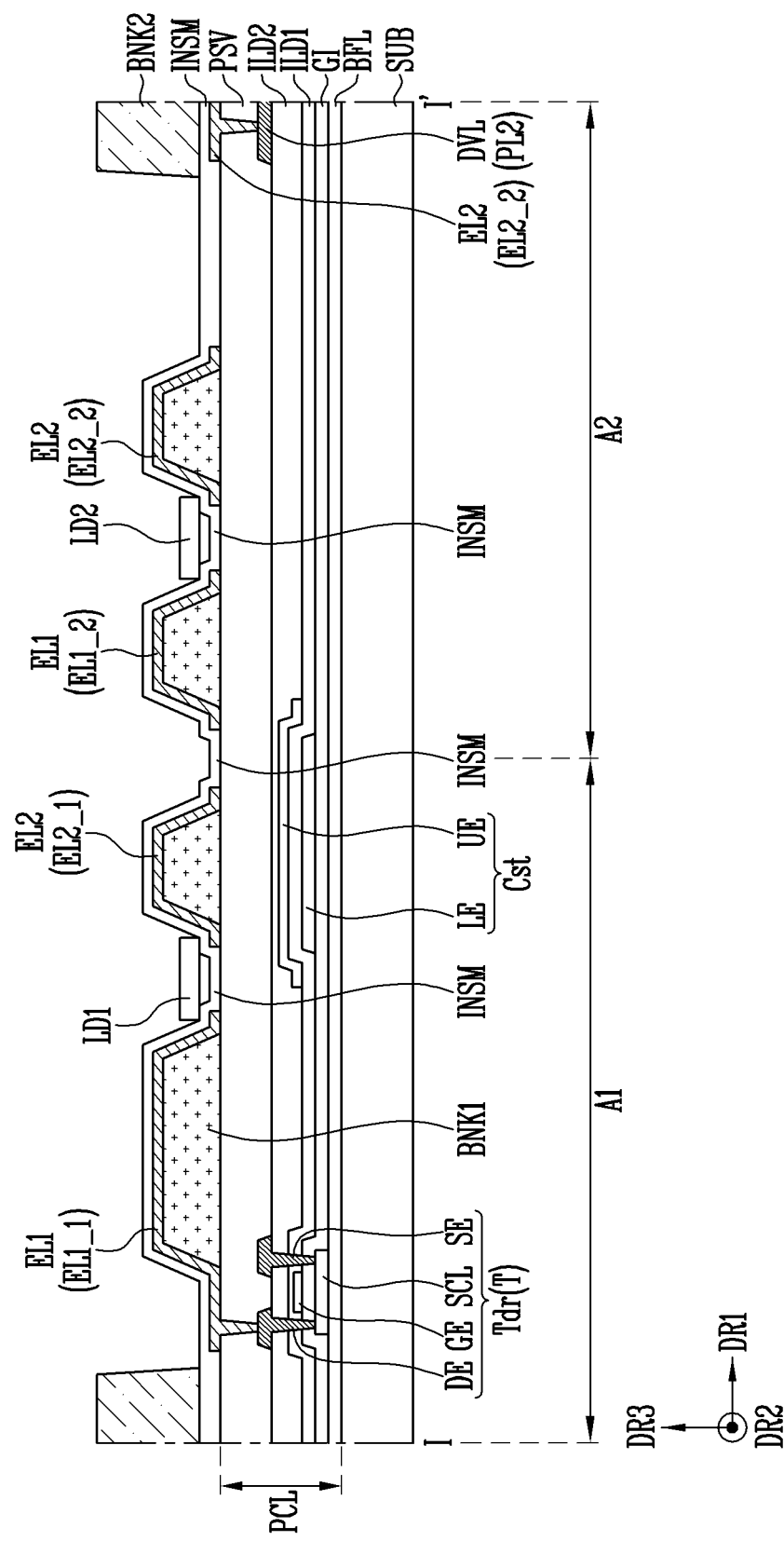
Figure 17F:
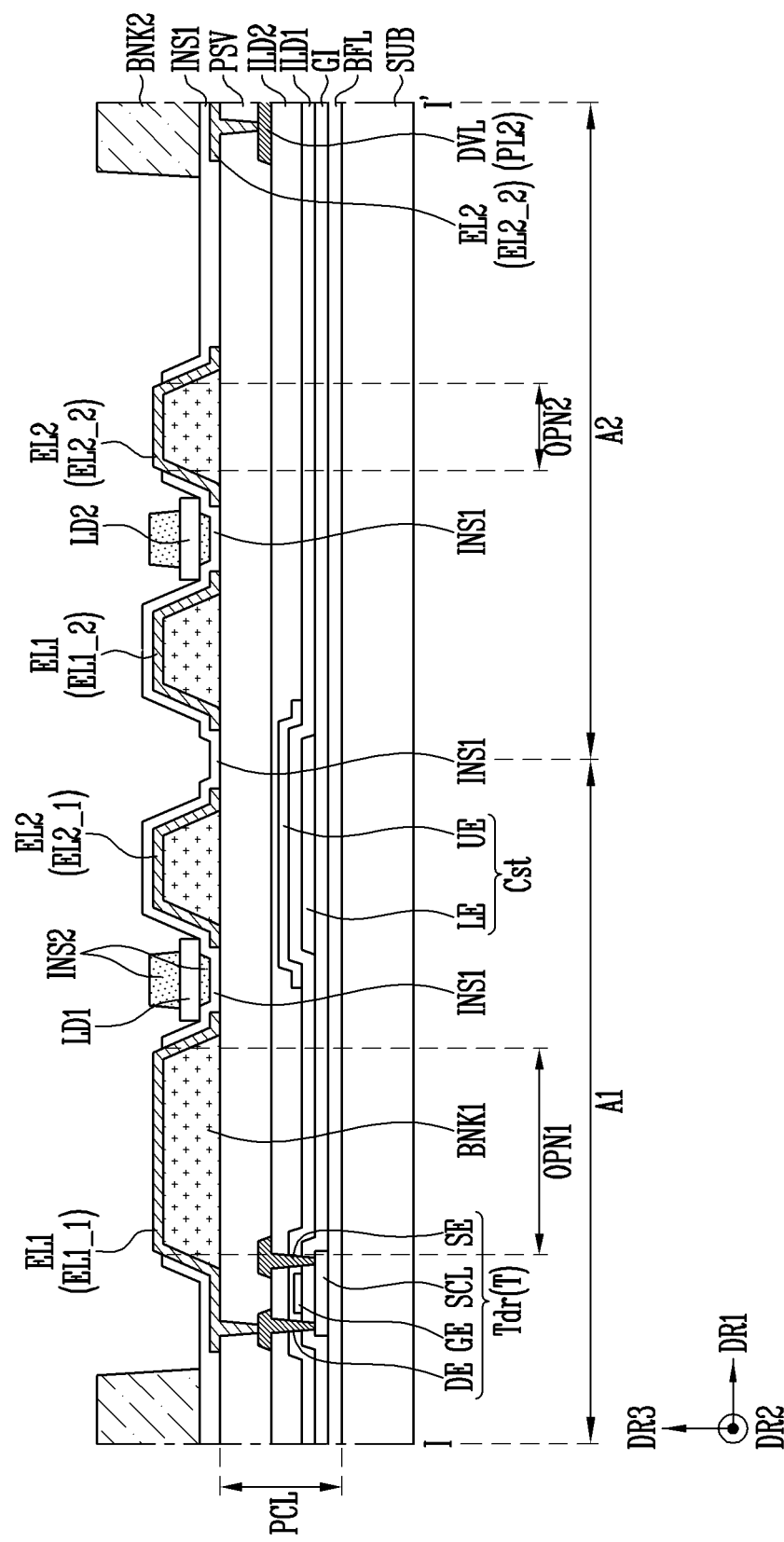
Figure 17G:
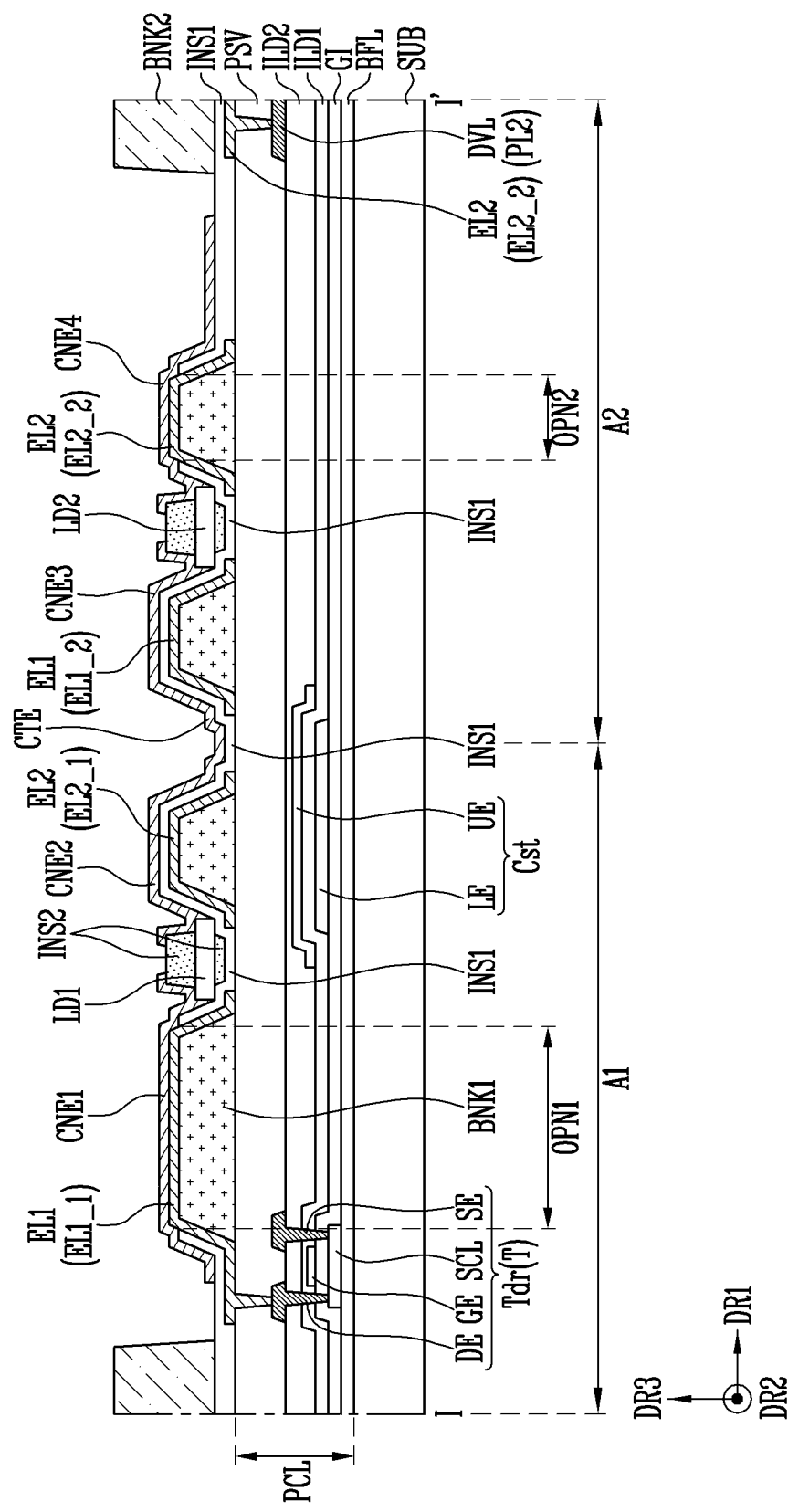
Figure 17H:
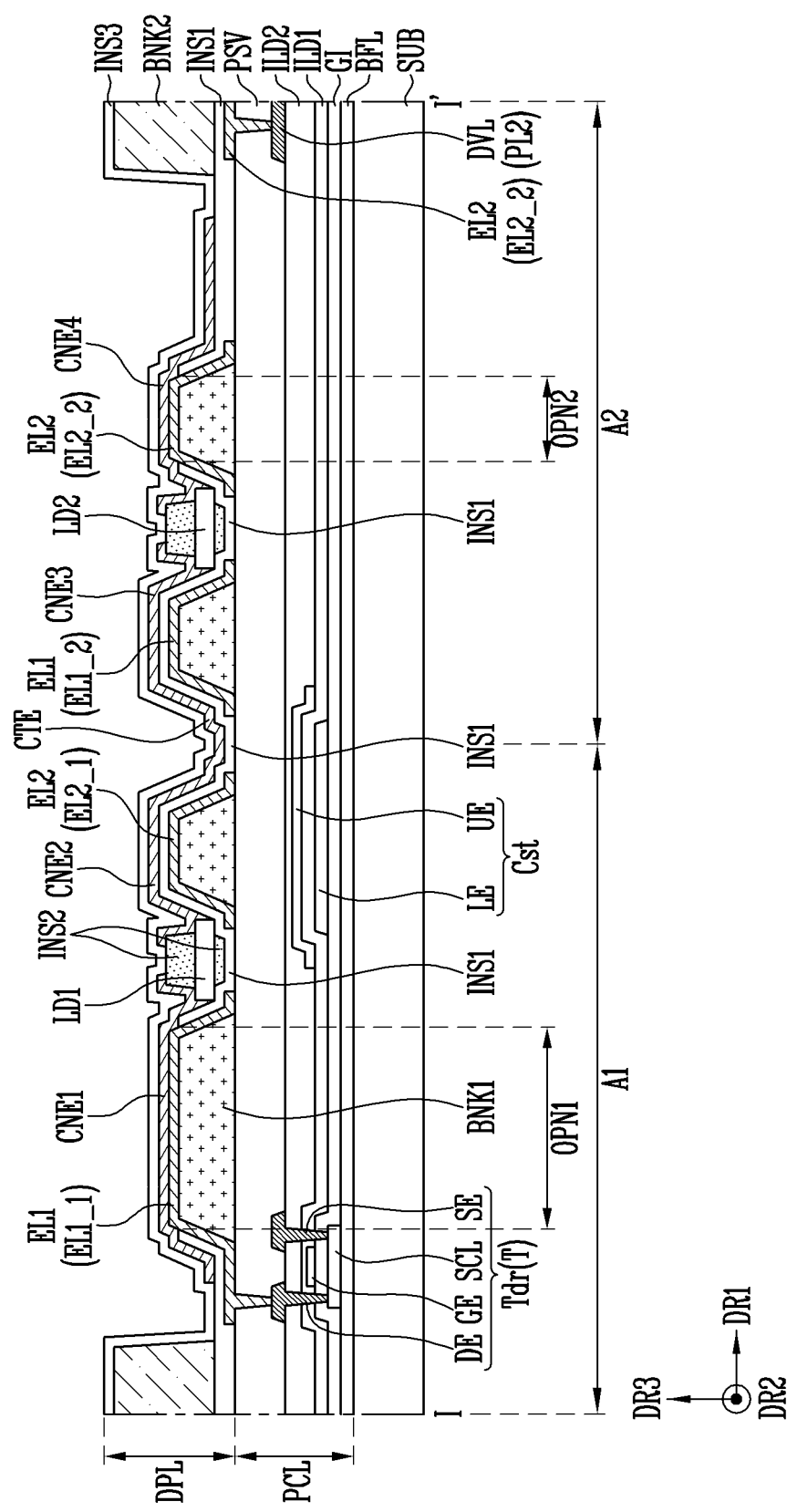

FIG. 8 is a plan view schematically illustrating a pixel PXL among the pixels shown in FIG. 5, FIG. 9 is a plan view schematically illustrating only the first and second electrodes EL1 and EL2, the contact electrodes CNE, the light emitting elements LD, and the opening OPN of FIG. 8, FIG. 10 is a schematic cross-sectional view taken along line I~I' of FIG. 8, FIG. 11 is a schematic cross-sectional view taken along line II~II' of FIG. 8, FIG. 12 is a schematic cross-sectional view corresponding to line II~II' of FIG. 8 as an implementation of a first bank pattern BNK1 shown in FIG. 11 according to another embodiment, FIG. 13 is a schematic cross-sectional view corresponding to line II~II' of FIG. 8 as an implementation of a second contact electrode CNE2 shown in FIG. 11 according to another embodiment, FIG. 14 is a schematic cross-sectional view taken along line III~III' of FIG. 8, and FIG. 15 is a plan view schematically illustrating the driving current flowing through the pixel PXL according to an embodiment of the disclosure, and illustrates, for example, flow of the driving current flowing through the pixel PXL of FIG. 8.

The pixel PXL shown in FIG. 8 may be any one of the pixels PXL shown in FIGS. 6A to 6E, and 7A and 7B, respectively. For example, the pixel PXL shown in FIG. 8 may be the pixel PXL shown in FIG. 7B.

In FIG. 8, illustration of a transistor connected to the light emitting elements LD and some signal lines connected to the transistor is omitted for convenience.

FIGS. 8 to 15 simplify and show a structure of the one pixel PXL, such as showing each electrode as a single layer of electrode and each insulating layer as a single layer of insulating layer, but the disclosure is not limited thereto.

In an embodiment of the disclosure, "formed and/or provided on the same layer" may refer to formed in the same process, and "formed and/or provided on different layers" may refer to formed in different processes.

In an embodiment of the disclosure, "connection" between two components may mean that an electrical connection and/or a physical connection are used, but the disclosure is not limited thereto.

In an embodiment of the disclosure, for convenience of description, a width direction (or a horizontal direction) is indicated as a first direction DR1, a height direction (or a vertical direction) is indicated as a second direction DR2, and a thickness direction of the substrate SUB is indicated as a third direction DR3. The first to third directions DR1, DR2, and DR3 may refer to directions indicated by the first to third directions DR1, DR2, and DR3, respectively.

Referring to FIGS. 1A to 5, 7B, and 8 to 15, the display device according to an embodiment of the disclosure may include the pixels PXL provided on the substrate SUB.

The substrate SUB may include a transparent insulating material and may transmit light. The substrate SUB may be a rigid substrate or a flexible substrate.

For example, the rigid substrate may be at least one of a glass substrate, a quartz substrate, a glass ceramic substrate, and a crystalline glass substrate.

The flexible substrate may be a film substrate and/or a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material configuring the substrate SUB may be variously changed, and may include fiber reinforced plastic (FRP) or the like. A material applied to the substrate SUB may have resistance (or heat resistance) to a high process temperature during a manufacturing process of the display device.

The substrate SUB may include the display area DA including at least one pixel area PXA in which the pixel PXL may be disposed, and the non-display area NDA disposed around the display area DA.

The pixels PXL may be arranged in a matrix form and/or a stripe form according to multiple pixel rows extending in the first direction DR1 in the display area DA on the substrate SUB, and multiple pixel columns extending in the second direction DR2 different from, for example, intersecting with the first direction DR1, but the disclosure is not limited thereto. According to an embodiment, the pixels PXL may be provided in the display area DA on the substrate SUB in various arrangement forms.

The pixel area PXA in which each pixel PXL may be provided (or arranged) may include an emission area in which light may be emitted and a peripheral area adjacent to (or surrounding a periphery) of the emission area. In an embodiment of the disclosure, the peripheral area may include a non-emission area in which light may not be emitted.

A line unit electrically connected to the pixels PXL may be positioned on the substrate SUB. The line unit may include signal lines that transmit a signal (or a voltage) to each pixel PXL. The signal lines may include, for example, the i-th scan line Si that transmits the scan signal to each pixel PXL, the j-th data line Dj that transmits the data signal to each pixel PXL, and the power lines PL1 and PL2 that transmit the driving power to each PXL. According to an embodiment, the line unit may further include the emission control line Ei that transmits the emission control signal to each pixel PXL as shown in FIGS. 6C and 6D. According to another embodiment, the line unit may further include the j-th sensing line SENj and the i-th control line CLi connected to each pixel PXL as shown in FIG. 6E.

Each pixel PXL may include a pixel circuit layer PCL provided on the substrate SUB and including the pixel circuit 144, and a display element layer DPL including the light emitting elements LD. The light emitting elements LD may be positioned in the pixel area PXA of each pixel PXL.

For convenience, the pixel circuit layer PCL is described first, and then the display element layer DPL is described.

The pixel circuit layer PCL may include a buffer layer BFL, the pixel circuit 144 provided on the buffer layer BFL, and a protective layer PSV (or a passivation layer) provided on the pixel circuit 144.

The buffer layer BFL may prevent an impurity from diffusing into a transistor T included in the pixel circuit 144. The buffer layer BFL may include an inorganic insulating layer including an inorganic material. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single layer, but may be provided as multiple layers of at least double or more layers. In case that the buffer layer BFL is provided as the multiple layers, each layer may be formed of the same material or may be formed of different materials. The buffer layer BFL may be omitted according to a material, a process condition, and the like of the substrate SUB.

The pixel circuit 144 may include at least one transistor T and a storage capacitor Cst. The transistor T may include a driving transistor Tdr that controls a driving current of the light emitting elements LD and a switching transistor Tsw connected to the driving transistor Tdr. However, the disclosure is not limited thereto, and the pixel circuit 144 may further include circuit elements performing another function in addition to the driving transistor Tdr and the switching transistor Tsw. In the following embodiment, when the driving transistor Tdr and the switching transistor Tsw are collectively referred to, the driving transistor Tdr and the switching transistor Tsw are referred to as a transistor T or transistors T. The driving transistor Tdr may have the same configuration as the first transistor T1 described with reference to FIGS. 6A to 7B, and the switching transistor Tsw may have the same configuration as the second transistor T2 described with reference to FIGS. 6A to 7B.

Each of the driving transistor Tdr and the switching transistor Tsw may include a semiconductor pattern SCL, a gate electrode GE, a first terminal SE, and a second terminal DE. The first terminal SE may be one of a source electrode and a drain electrode, and the second terminal DE may be the other of the source electrode and the drain electrode. For example, in case that the first terminal SE is the source electrode, the second terminal DE may be the drain electrode.

The semiconductor pattern SCL may be provided and/or formed on the buffer layer BFL. The semiconductor pattern SCL may include a first contact area contacting the first terminal SE and a second contact area contacting the second terminal DE. An area between the first contact area and the second contact area may be a channel area. The channel area may overlap the gate electrode GE of the corresponding transistor T. The semiconductor pattern SCL may be a semiconductor pattern formed of poly silicon, amorphous silicon, an oxide semiconductor, or the like, or a combination thereof. The channel area may be, for example, a semiconductor pattern that may not be doped with an impurity, and may be an intrinsic semiconductor. The first contact area and the second contact area may be a semiconductor pattern doped with an impurity.

The gate electrode GE may be provided and/or formed on the semiconductor pattern SCL with a gate insulating layer GI interposed therebetween. For example, the gate electrode GE may be provided and/or formed on the gate insulating layer GI to correspond to the channel area of the semiconductor pattern SCL. The gate electrode GE may be provided on the gate insulating layer GI to overlap the channel area of the transistor semiconductor pattern SCL. The gate electrode GE may form a single layer with a material of copper (Cu), molybdenum (Mo), tungsten (W), aluminum neodymium (AlNd), titanium (Ti), aluminum (Al), silver (Ag), and an alloy thereof alone or in combination, or may be formed in a double layer or multiple layer structure of molybdenum (Mo), titanium (Ti), copper (Cu), aluminum (Al), or silver (Ag) which may be a low-resistance material to reduce a line resistance.

The gate insulating layer GI may be provided and/or formed on the semiconductor pattern SCL. The gate insulating layer GI may be an inorganic insulating layer including an inorganic material. For example, the gate insulating layer GI may include at least one of metal oxides such as silicon nitride ($SiN_x$), silicon oxide ($SiO_x$), silicon oxynitride ($SiO_xN_y$), and aluminum oxide ($AlO_x$). However, a material of the gate insulating layer GI is not limited to the above-described embodiments. According to an embodiment, the gate insulating layer GI may be formed of an organic insulating layer including an organic material. The gate insulating layer GI may be provided as a single layer, but may also be provided as multiple layers of at least double or more layers.

The respective first terminal SE and the second terminal DE may be provided and/or formed on a second interlayer insulating layer ILD2, and may contact the first contact area and the second contact area of the semiconductor pattern SCL through a contact hole sequentially passing through the gate insulating layer GI and first and second interlayer insulating layers ILD1 and ILD2. For example, the first terminal SE may contact one of the first and second contact areas of the semiconductor pattern SCL, and the second terminal DE may contact the other of the first and second contact areas of the semiconductor pattern SCL. Each of the first and second terminals SE and DE may include the same material as the gate electrode GE, or may include one or more materials selected from materials disclosed as a configuration material of the gate electrode GE.

The first interlayer insulating layer ILD1 may be provided and/or formed on the gate electrode GE, and may be formed of an inorganic insulating layer including an inorganic material. For example, the first interlayer insulating layer ILD1 may include at least one of metal oxides such as silicon oxide ($SiO_x$), silicon nitride ($SiN_x$), silicon oxynitride ($SiO_xN_y$), and aluminum oxide ($AlO_x$). The first interlayer insulating layer ILD1 may be formed of a single layer or multiple layers. According to an embodiment, the first interlayer insulating layer ILD1 may be an organic insulating layer including an organic material.

The second interlayer insulating layer ILD2 may be provided and/or formed on the first interlayer insulating layer ILD1. The second interlayer insulating layer ILD2 may be an inorganic insulating layer including an inorganic material or an organic insulating layer including an organic material. According to an embodiment, the second interlayer insulating layer ILD2 may include the same material as the first interlayer insulating layer ILD1, but the disclosure is not limited thereto. The second interlayer insulating layer ILD2 may be provided as a single layer, but may be provided as multiple layers of at least double or more layers.

In an above-described embodiment, the first and second terminals SE and DE of each of the driving transistor Tdr and the switching transistor Tsw are described as separate electrodes electrically connected to the semiconductor pattern SCL through the contact hole sequentially passing through the gate insulating layer GI and the first and second insulating layers ILD1 and ILD2, but the disclosure is not limited thereto. According to an embodiment, the first terminal SE of each of the driving transistor Tdr and the switching transistor Tsw may be one of the first and second contact areas adjacent to the channel area of the corresponding semiconductor pattern SCL, and the second terminal DE of each of the driving transistor Tdr and the switching transistor Tsw may be the other of the first and second contact areas adjacent to the channel area of the corresponding semiconductor pattern SCL. The second terminal DE of the driving transistor Tdr may be electrically connected to the light emitting elements LD of the corresponding pixel PXL through a separate connector including a bridge electrode or the like.

In an embodiment of the disclosure, the transistors T included in the pixel circuit 144 may be configured of an LTPS (low temperature poly silicon) thin film transistor, but the disclosure is not limited thereto, and may be configured of an oxide semiconductor thin film transistor according to an embodiment. A case where the transistors T are thin film transistors of a top gate structure is described as an example, but the disclosure is not limited thereto. According to an embodiment, the transistors T may be thin film transistors of a bottom gate structure.

According to an embodiment, the transistor T included in the pixel circuit layer PCL may further include additional or (other) transistors such as a transistor for compensating for a threshold voltage of the driving transistor Tdr, and a transistor for controlling an emission time of each of the light emitting elements LD, in addition to the driving transistor Tdr and the switching transistor Tsw.

The storage capacitor Cst may include a lower electrode LE provided on the gate insulating layer GI and an upper electrode UE provided on the first interlayer insulating layer ILD1 and overlapping the lower electrode LE.

The lower electrode LE may be provided on the same layer as the gate electrode GE of each of the driving transistor Tdr and the switching transistor Tsw and may include the same material. According to an embodiment, the lower electrode LE may be provided integrally with the gate electrode GE of the driving transistor Tdr. The lower electrode LE may be regarded as an area of the gate electrode GE of the driving transistor Tdr. According to another embodiment, the lower electrode LE may be provided as a structure separate from the gate electrode GE of the driving transistor Tdr. The lower electrode LE and the gate electrode GE of the driving transistor Tdr may be electrically connected through a separate connector.

The upper electrode UE may overlap the lower electrode LE and cover the lower electrode LE. A capacitance of the storage capacitor Cst may be increased by increasing an overlap area of the upper electrode UE and the lower electrode LE. The upper electrode UE may be electrically connected to the first power line PL1. Accordingly, the first driving power supply VDD applied to the first power line PL1 may be transmitted to the upper electrode UE.

The second interlayer insulating layer ILD2 may be provided and/or formed on the storage capacitor Cst. The second interlayer insulating layer ILD2 may cover the storage capacitor Cst.

The pixel circuit layer PCL may include a driving voltage line DVL provided and/or formed on the second interlayer insulating layer ILD2. The driving voltage line DVL may have the same configuration as the second power line PL2 described with reference to FIGS. 6A to 7B. The second driving power supply VSS may be applied to the driving voltage lines DVL and PL2. The pixel circuit layer PCL may further include the first power line PL1 to which the first driving power supply VDD may be applied. The first power line PL1 may be provided on the same layer as the driving voltage line DVL or may be provided on a layer different from the driving voltage lines DVL and PL2. In an embodiment of the disclosure, it has been described that the driving voltage lines DVL and PL2 are provided on the same layer as the first and second terminals SE and DE of the driving transistor Tdr, but the disclosure is not limited thereto. According to an embodiment, the driving voltage lines DVL and PL2 may be provided on the same layer as any one of conductive layers included in the pixel circuit layer PCL. For example, a position of the driving voltage lines DVL and PL2 in the pixel circuit layer PCL may be variously changed.

The first power line PL1 may be electrically connected to a partial configuration of the display element layer DPL, for example, the first electrode EL1, and the driving voltage lines DVL and PL2 may be electrically connected to a partial configuration of the display element layer DPL, for example, the second electrode EL2. The first power line PL1 and the driving voltage lines DVL and PL2 may transmit an alignment signal (or an alignment voltage) to each of the first and second electrodes EL1 and EL2 in order to align the light emitting elements LD in the pixel area PXA of each of the pixels PXL. After the alignment of the light emitting elements LD, each of the first power line PL1 and the driving voltage lines DVL and PL2 may transmit corresponding driving power to each pixel PXL to drive the light emitting elements LD.

Each of the first power line PL1 and the driving voltage lines DVL and PL2 may include a conductive material. For example, each of the first power line PL1 and the driving voltage line DVL may form a single layer with a material selected from a group of copper (Cu), molybdenum (Mo), tungsten (W), aluminum neodymium (AlNd), titanium (Ti), aluminum (Al), silver (Ag), and an alloy thereof alone or in combination, or may be formed in a double layer or multiple layer structure of molybdenum (Mo), titanium (Ti), copper (Cu), aluminum (Al), or silver (Ag) which may be a low-resistance material to reduce a line resistance. For example, each of the first power line PL1 and the driving voltage lines DVL and PL2 may be configured of double layers stacked in an order of titanium (Ti)/copper (Cu).

In an above-described embodiment, it has been described that the driving voltage lines DVL and PL2 are provided and/or formed on the second interlayer insulating layer ILD2, but the disclosure is not limited thereto. According to an embodiment, the driving voltage lines DVL and PL2 may be provided and/or formed on any one of insulating layers provided on the substrate SUB, for example, the first interlayer insulating layer ILD1.

The protective layer PSV may be provided and/or formed on the transistor T and the driving voltage lines DVL and PL2.

The protective layer PSV may be provided in a form including an organic insulating layer, an inorganic insulating layer, or an organic insulating layer disposed on the inorganic insulating layer. For example, the inorganic insulating layer may include at least one of metal oxides such as silicon oxide ($SiO_x$), silicon nitride ($SiN_x$), silicon oxynitride ($SiO_xN_y$), and aluminum oxide ($AlO_x$). The organic insulating layer may include at least one of an acrylic resin (polyacrylates resin), an epoxy resin, a phenolic resin, a polyamide resin, a polyimides resin, an unsaturated polyesters resin, a poly-phenylene ethers resin, a poly-phenylene sulfides resin, and a benzocyclobutene resin.

The protective layer PSV may include a first contact hole CH1 exposing an area of the driving transistor Tdr and a second contact hole CH2 exposing an area of the driving voltage lines DVL and PL2.

The display element layer DPL may be provided on the protective layer PSV.

The display element layer DPL may include the first and second bank patterns BNK1 and BNK2, the first and second electrodes EL1 and EL2, the light emitting elements LD, and the contact electrode CNE. The display element layer DPL may include the intermediate electrode CTE and first to third insulating layers INS1 to INS3.

The first bank pattern BNK1 (or a first pattern) may be positioned in the emission area in which light may be emitted from the pixel area PXA of each of the pixels PXL. The first bank pattern BNK1 may be a support member supporting each of the first and second electrodes EL1 and EL2 in order to change a surface profile (or shape) of each of the first and second electrodes EL1 and EL2 to guide the light emitted from the light emitting elements LD in an image display direction of the display device.

The first bank pattern BNK1 may be provided and/or formed between the protective layer PSV and a corresponding electrode in the emission area of the corresponding pixel PXL. For example, the first bank pattern BNK1 may be provided and/or formed between the protective layer PSV and the first electrode EL1 and between the protective layer PSV and the second electrode EL2, respectively.

The first bank pattern BNK1 may be an inorganic insulating layer including an inorganic material or an organic insulating layer including an organic material. According to an embodiment, the first bank pattern BNK1 may include a single layer of organic insulating layer and/or a single layer of inorganic insulating layer, but the disclosure is not limited thereto. According to an embodiment, the first bank pattern BNK1 may be provided in a form of multiple layers in which at least one organic insulating layer and at least one inorganic insulating layer are stacked on each other. However, a material of the first bank pattern BNK1 is not limited to the above-described embodiments, and according to an embodiment, the first bank pattern BNK1 may include a conductive material.

The first bank pattern BNK1 may have a cross-section of a trapezoidal shape that becomes narrower from a surface (for example, an upper surface) of the protective layer PSV toward an upper portion along the third direction DR3, but the disclosure is not limited thereto. According to an embodiment, as shown in FIG. 12, the first bank pattern BNK1 may include a curved surface having a cross-section of a semi-ellipse shape, a semi-circle shape (or a hemisphere shape), or the like in which a width becomes narrower from a surface of the protective layer PSV toward an upper portion along the third direction DR3. When viewed in a cross-section, a shape of the first bank pattern BNK1 is not limited to the above-described embodiments and may be variously changed within a range capable of improving efficiency of the light emitted from each of the light emitting elements LD. The first bank patterns BNK1 adjacent in the first direction DR1 may be disposed on the same surface on the protective layer PSV, and may have the same height (or thickness) in the third direction DR3.

The first bank pattern BNK1 may have a bar shape extending along the second direction DR2 when viewed in a plan view, but the disclosure is not limited thereto. According to an embodiment, a shape of the first bank pattern BNK1 may be variously changed.

The second bank pattern BNK2 (or a bank) may surround at least one side of a peripheral area of the pixel area PXA of each pixel PXL. The peripheral area may include the non-emission area from which light is not emitted.

The second bank pattern BNK2 may be a structure defining (or partitioning) the pixel area PXA (or the emission area) of each pixel PXL and each pixel PXL adjacent thereto, and may be, for example, a pixel defining layer. The second bank pattern BNK2 may include at least one light blocking material and/or reflective material to prevent a light leakage defect in which light (or rays) leaks between each pixel PXL and the pixels PXL adjacent thereto. According to an embodiment, the second bank pattern BNK2 may include a transparent material (or substance). The transparent material may include, for example, polyamides resin, polyimides resin, and the like, but the disclosure is not limited thereto. According to another embodiment, a reflective material layer may be formed on the second bank pattern BNK2 to further improve efficiency of the light emitted from each pixel PXL.

The second bank pattern BNK2 may be provided and/or formed on a layer different from that of the first bank pattern BNK1, but the disclosure is not limited thereto. According to an embodiment, the second bank pattern BNK2 may be provided and/or formed on the same layer as the first bank pattern BNK1. In an embodiment of the disclosure, the second bank pattern BNK2 may be formed on a layer different from that of the first bank pattern BNK1 and may be positioned on the first insulating layer INS1.

Each of the first and second electrodes EL1 and EL2 may be provided in the pixel area PXA of each of the pixels PXL, and may extend in a direction, for example, the second direction DR2. The first and second electrodes EL1 and EL2 may be provided on the same surface and may be disposed to be spaced apart from each other in the first direction DR1. The first electrode EL1 and the second electrode EL2 may be arranged in an order of the first electrode EL1 and the second electrode EL2 along the first direction DR1, but the disclosure is not limited thereto. According to an embodiment, in a case opposite thereto, for example, the second electrode EL2 and the first electrode EL1 may be arranged in an order of the second electrode EL2 and the first electrode EL1 along the first direction DR1.

The first electrode EL1 may be electrically connected to a partial configuration, for example, the driving transistor Tdr, included in the pixel circuit layer PCL of the corresponding pixel PXL through the first contact hole CH1 passing through the protective layer PSV. The second electrode EL2 may be electrically connected to a partial configuration, for example, the driving voltage lines DVL and PL2, included in the pixel circuit layer PCL of the corresponding pixel PXL through the second contact hole CH2 passing through the protective layer PSV.

Each of the first and second electrodes EL1 and EL2 may be provided and/or formed on the first bank pattern BNK1 to have a surface profile corresponding to the shape of the first bank pattern BNK1. For example, each of the first and second electrodes EL1 and EL2 has a protrusion portion corresponding to the first bank pattern BNK1 in the third direction DR3 and a flat portion corresponding to a surface (for example, an upper surface) of the protective layer PSV.

Each of the first and second electrodes EL1 and EL2 may be formed of a material having a constant reflectance to allow the light emitted from each of the light emitting elements LD to proceed in the image display direction of the display device. Each of the first and second electrodes EL1 and EL2 may be formed of a conductive material (or substance) having a constant reflectance. The conductive material (or substance) may include an opaque metal advantageous for reflecting the light emitted from the light emitting elements LD in the image display direction of the display device. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and a metal such as an alloy thereof. According to an embodiment, each of the first and second electrodes EL1 and EL2 may include a transparent conductive material (or substance). The transparent conductive material may include a conductive oxide such as indium tin oxide (ITO), indium zinc oxide (IZO), zinc oxide (ZnO), and indium tin zinc oxide (ITZO), a conductive polymer such as PEDOT, and the like. In case that each of the first and second electrodes EL1 and EL2 includes a transparent conductive material, a separate conductive layer formed of an opaque metal for reflecting the light emitted from the light emitting elements LD in the image display direction of the display device may be additionally included. However, a material of each of the first and second electrodes EL1 and EL2 is not limited to the above-described materials.

Each of the first and second electrodes EL1 and EL2 may be provided and/or formed as a single layer, but the disclosure is not limited thereto. According to an embodiment, each of the first and second electrodes EL1 and EL2 may be provided and/or formed as multiple layers in which at least two or more material among metals, alloys, conductive oxides, and conductive polymers are stacked on each other. Each of the first and second electrodes EL1 and EL2 may be formed of multiple layers of at least double or more layers in order to minimize distortion due to a signal delay in case of transmitting a signal (or a voltage) to the ends of each of the light emitting elements LD. For example, each of the first and second electrodes EL1 and EL2 may be formed of multiple layers sequentially stacked in an order of indium tin oxide (ITO)/silver (Ag)/indium tin oxide (ITO).

As described above, since each of the first and second electrodes EL1 and EL2 has the surface profile corresponding to the shape of the first bank pattern BNK1 disposed thereunder, the light emitted from each of the light emitting elements LD may be reflected by each of the first and second electrodes EL1 and EL2 and may further proceed in the image display direction of the display device. As a result, efficiency of the light emitted from each of the light emitting elements LD may be further improved.

Each of the first bank pattern BNK1 and the first and second electrodes EL1 and EL2 may be used as a reflective member improving light efficiency of the display device by guiding the light emitted from the light emitting elements LD in a desired direction.

In an embodiment of the disclosure, the first electrode EL1 and the second electrode EL2 may receive the alignment signal (or the alignment voltage) and may be used as an alignment electrode (or an alignment line) for the alignment of the light emitting elements LD. For example, the first electrode EL1 may receive a first alignment signal (or a first alignment voltage) from the first power line PL1 to be used as a first alignment electrode (or a first alignment line), and the second electrode EL2 may receive a second alignment signal (or a second alignment voltage) from the driving voltage lines DVL and PL2 to be used as a second alignment electrode (or a second alignment line). Here, the first and second alignment signals (or alignment voltages) may be signals having a voltage difference and/or a phase difference of a degree at which the light emitting elements LD may be aligned between the first and second electrodes EL1 and EL2. At least one of the first and second alignment signals (or alignment voltages) may be an AC signal (or voltage), but the disclosure is not limited thereto.

In case that the alignment signal (or the alignment voltage) corresponding to each of the first and second electrodes EL1 and EL2 is applied, an electric field may be formed between the first electrode EL1 and the second electrode EL2. The light emitting elements LD may be aligned and/or provided in the pixel area PXA of each pixel PXL by the electric field. In a step of aligning the light emitting elements LD in the pixel area PXA of each of the pixels PXL, the alignment signal (or the alignment voltage) applied to each of the first and second electrodes EL1 and EL2 may be controlled or a magnetic field may be formed, to control the light emitting elements LD supplied to the pixel area PXA to be aligned to be relatively deflected.

In an embodiment of the disclosure, the pixel area PXA of each pixel PXL may be divided into a first area A1 and a second area A2 sequentially provided along the second direction DR2 when viewed in a plan view. The first area A1 may be an area positioned at an upper side in the pixel area PXA along the second direction DR2 when viewed in a plan view, and the second area A2 may be an area positioned at a lower side in the pixel area PXA along the second direction DR2.

Each of the first and second electrodes EL1 and EL2 may be divided into two areas according to positions of the first and second areas A1 and A2. For example, an area of the first electrode EL1 positioned in the first area A1 may be a (1-1)-th electrode EL1_1, and another area of the first electrode EL1 positioned in the second area A2 may be a (1-2)-th electrode EL1_2. An area of the second electrode EL2 positioned in the first area A1 may be a (2-1)-th electrode EL2_1, and another area of the second electrode EL2 positioned in the second area A2 may be a (2-2)-th electrode EL2_2.

The (1-1)-th electrode EL1_1 and the (1-2)-th electrode EL1_2 may be connected to each other in an area between the first area A1 and the second area A2 to configure the first electrode EL1. The (2-1)-th electrode EL2_1 and the (2-2)-th electrode EL2_2 may be connected to each other in an area between the first area A1 and the second area A2 to configure the first electrode EL1.

In the first area A1, the (1-1)-th electrode EL1_1 and the (2-1)-th electrode EL2_1 may be spaced apart from each other in the first direction DR1. In the second area A2, the (1-2)-th electrode EL1_2 and the (2-2)-th electrode EL2_2 may be spaced apart from each other in the first direction DR1. A distance in the first direction DR1 between the (1-1)-th electrode EL1_1 and the (2-1)-th electrode EL2_1 may be the same as a distance in the first direction DR1 between the (1-2)-th electrode EL1_2 and the (2-2)-th electrode EL2_2, but is not limited thereto. According to an embodiment, the distance in the first direction DR1 between the (1-1)-th electrode EL1_1 and the (2-1)-th electrode EL2_1 may be different from the distance in the first direction DR1 between the (1-2)-th electrode EL1_2 and the (2-2)-th electrode EL2_2.

The (1-1)-th electrode EL1_1 positioned in the first area A1 may be electrically connected to the driving transistor Tdr of the pixel circuit layer PCL, and the (2-2)-th electrode EL2_2 positioned in the second area A2 may be electrically connected to the driving voltage lines DVL and PL2 of the pixel circuit layer PCL.

In the first area A1, the (1-1)-th electrode EL1_1 and the (2-1)-th electrode EL2_1 may configure the first series stage SET1 (or a first stage) together with light emitting elements LD connected in parallel therebetween. In the second area A2, the (1-2)-th electrode EL1_2 and the (2-2)-th electrode EL2_2 may configure the second series stage SET2 (or a second stage) together with light emitting elements LD connected in parallel therebetween. In an embodiment of the disclosure, first and second series stages SET1 and SET2 may be disposed in the pixel area PXA of each pixel PXL, and the first and second series stages SET1 and SET2 may configure the emission unit EMU of the corresponding pixel PXL.

The (1-1)-th electrode EL1_1 included in the first series stage SET1 may be an anode electrode of the emission unit EMU of each pixel PXL, and the (2-2)-th electrode EL2_2 included in the second series stage SET2 may be a cathode electrode of the emission unit EMU.

After the light emitting elements LD are aligned in the pixel area PXA of each pixel PXL, a portion of the first electrode EL1 positioned between the pixels PXL adjacent to each other in the second direction DR2 may be removed to drive each pixel PXL individually (or independently).

In the above-described embodiments, each of the light emitting elements LD may be an ultra-small light emitting element, for example, having a size as small as a nano scale to a micro scale, using an inorganic crystal structure material. For example, each of the light emitting elements LD may be an ultra-small light emitting element manufactured by an etching method or an ultra-small light emitting element manufactured by a growth method.

At least two to tens of light emitting elements LD may be aligned and/or provided in the pixel area PXA of each pixel PXL, but the number of light emitting elements LD is not limited thereto. According to an embodiment, the number of light emitting elements LD aligned and/or provided in the pixel area PXA may be variously changed.

In FIGS. 8, 9, and 15, the light emitting elements LD of which the extension direction (or the length direction) may be parallel to the first direction DR1 are disposed between the first and second electrodes EL1 and EL2, but the disclosure is not limited thereto. According to an embodiment, at least one of the light emitting elements LD may be disposed so that the length direction thereof may be parallel to the second direction DR2 and/or a direction inclined to the second direction DR2 between the first and second electrodes EL1 and EL2. According to an embodiment, at least one reverse light emitting element LDr connected in a reverse direction may be further disposed between the adjacent first and second electrodes EL1 and EL2. According to another embodiment, at least one defective light emitting element that may not be connected to the first and second electrodes EL1 and EL2, for example, an ineffective light source may be further disposed between the first and second electrodes EL1 and EL2.

In an embodiment of the disclosure, each of the light emitting elements LD may emit any one of color light and/or white light. Each of the light emitting elements LD may be aligned between the first and second electrodes EL1 and EL2 so that the length L direction may be parallel to the first direction DR1. The light emitting elements LD may be provided in a form in which the light emitting elements LD are sprayed in a solution and may be input to the pixel area PXA of each pixel PXL.

The light emitting elements LD may be input to the pixel area PXA of each pixel PXL through an inkjet printing method, a slit coating method, or other various methods. For example, the light emitting elements LD may be mixed with a volatile solvent and may be supplied to the pixel area PXA through an inkjet printing method or a slit coating method. At this time, in case that the alignment signal (or the alignment voltage) corresponding to each of the first and second electrodes EL1 and EL2 provided to the pixel area PXA is applied, an electric field may be formed between two adjacent electrodes. Accordingly, the light emitting elements LD may be aligned between the first electrode EL1 and the second electrode EL2.

After the light emitting elements LD may be aligned, the solvent may be evaporated or removed in another method, and thus the light emitting elements LD may be finally aligned and/or provided in the pixel area PXA of each pixel PXL.

An end of each of the light emitting elements LD may be directly connected to an electrode of the first and second electrodes EL1 and EL2 or may be connected to the electrode through a corresponding contact electrode CNE. Another end of each of the light emitting elements LD may be directly connected to the remaining electrode of the first and second electrodes EL1 and EL2 or may be connected to the remaining electrode through a corresponding contact electrode CNE.

In an embodiment of the disclosure, the light emitting elements LD may include multiple first light emitting elements LD1 and multiple second light emitting elements LD2.

The first light emitting elements LD1 may be disposed between the (1-1)-th electrode EL1_1 and the (2-1)-th electrode EL2_1 electrode in the first area A1. The first light emitting elements LD1 may be provided between the (1-1)-th electrode EL1_1 and the (2-1)-th electrode EL2_1 in the same direction. For example, an end (for example, a p-type semiconductor layer) of each of the first light emitting elements LD1 may be connected to the (1-1)-th electrode EL1_1, and another end (for example, an n-type semiconductor layer) of each of the first light emitting elements LD1 may be connected to the contact electrode CNE on the (2-1)-th electrode EL2_1. In the first area A1 of each pixel PXL, the (1-1)-th electrode EL1_1, the contact electrode CNE positioned on the (1-1)-th electrode EL1_1, the (2-1)-th electrode EL2_1, and the contact electrode CNE positioned on the (2-1)-th electrode EL2_1 may configure the first series stage SET1 together with the first light emitting elements LD1 connected in the same direction (or in parallel) therebetween.

The second light emitting elements LD2 may be disposed between the (1-2)-th electrode EL1_2 and the (2-2)-th electrode EL2_2 in the second area A2. The second light emitting elements LD2 may be provided in the same direction between the (1-2)-th electrode EL1_2 and the (2-2)-th electrode EL2_2. For example, an end (for example, a p-type semiconductor layer) of each of the second light emitting elements LD2 may be connected to the contact electrode CNE on the (1-2)-th electrode EL1_2, and another end (for example, an n-type semiconductor layer) may be connected to the (2-2)-th electrode EL2_2. In the second area A2 of each pixel PXL, the (1-2)-th electrode EL1_2, the contact electrode CNE positioned on the (1-2)-th electrode EL1_2, the (2-2)-th electrode EL2_2, and the contact electrode CNE positioned on the (2-2)-th electrode EL2_2 may configure the second series stage SET2 together with the second light emitting elements LD2 connected in the same direction (or in parallel) therebetween.

In an embodiment of the disclosure, the first and second series stages SET1 and SET2 may be disposed in the pixel area PXA of each pixel PXL, and the first and second series stages SET1 and SET2 may configure the emission unit EMU of the corresponding pixel PXL.

The above-described light emitting elements LD may be provided and/or formed on the first insulating layer INS1.

The first insulating layer INS1 may be positioned under each of the light emitting elements LD provided between the first and second electrodes EL1 and EL2. The first insulating layer INS1 may fill a space between each of the light emitting elements LD and the protective layer PSV to stably support the light emitting elements LD, and prevent the light emitting elements LD from being separated from the protective layer PSV.

The first insulating layer INS1 may include an inorganic insulating layer formed of an inorganic material or an organic insulating layer formed of an organic material. In an embodiment of the disclosure, the first insulating layer INS1 may be formed of an inorganic insulating layer advantageous for protecting the light emitting elements LD from the pixel circuit layer PCL of each pixel PXL. For example, the first insulating layer INS1 may include at least one of metal oxides such as silicon nitride ($SiN_x$), silicon oxide ($SiO_x$), silicon oxynitride ($SiO_xN_y$), and aluminum oxide ($AlO_x$), but the disclosure is not limited thereto. According to an embodiment, the first insulating layer INS1 may be formed of an organic insulating layer advantageous for planarizing a support surface of the light emitting elements LD.

The first insulating layer INS1 may include an opening OPN exposing an area of each of the first and second electrodes EL1 and EL2. The first insulating layer INS1 may cover a remaining area except for the area.

The opening OPN may include a first opening OPN1 and a second opening OPN2. The first opening OPN1 may correspond to an area of the (1-1)-th electrode EL1_1 in the first area A1 and may expose an area of the (1-1)-th electrode EL1_1. The second opening OPN2 may correspond to an area of the (2-2)-th electrode EL2_2 in the second area A2 and may expose an area of the (2-2)-th electrode EL2_2. In an embodiment of the disclosure, the first opening OPN1 may expose an area of the (1-1)-th electrode EL1_1 that may be the anode electrode of the emission unit EMU of the corresponding pixel PXL to the outside, and the opening OPN2 may expose an area of the (2-2)-th electrode EL2_2 that may be the cathode of the emission unit EMU to the outside.

The (1-1)-th electrode EL1_1 may directly contact the contact electrode CNE disposed on the (1-1)-th electrode EL1_1 by the first opening OPN1 of the first insulating layer INS1, and the (2-2)-th electrode EL2_2 may directly contact the contact electrode CNE disposed on the (2-2)-th electrode EL_2 by the second opening OPN2 of the first insulating layer INS1.

In an embodiment of the disclosure, the first insulating layer INS1 may be provided on the (2-1)-th electrode EL2_1 in the first area A1 to cover the (2-1)-th electrode EL2_1. The (2-1)-th electrode EL2_1 may be completely covered by the first insulating layer INS1 to be electrically insulated from the contact electrode CNE disposed on the (2-1)-th electrode EL2_1. The first insulating layer INS1 may be provided on the (1-2)-th electrode EL1_2 in the second area A2 to cover the (1-2)-th electrode EL1_2. The (1-2)-th electrode EL1_2 may be completely covered by the first insulating layer INS1 to be electrically insulated from the contact electrode CNE disposed on the (1-2)-th electrode EL1_2.

The second insulating layer INS2 may be provided and/or formed on each of the light emitting elements LD. The second insulating layer INS2 may be provided and/or formed on each of the light emitting elements LD to cover a portion of an upper surface of each of the light emitting elements LD and expose the ends of each of the light emitting elements LD to the outside. The second insulating layer INS2 may be formed as an independent insulating pattern in the pixel area PXA of each of the pixels PXL, but the disclosure is not limited thereto.

The second insulating layer INS2 may be configured as a single layer or multiple layers, and may include an inorganic insulating layer including at least one inorganic material or an organic insulating layer including at least one organic material. The second insulating layer INS2 may further fix each of the light emitting elements LD aligned (or disposed) in the pixel area PXA of each of the pixels PXL. In an embodiment of the disclosure, the second insulating layer INS2 may include an inorganic insulating layer advantageous for protecting the active layer 12 of each of the light emitting elements LD from external oxygen, moisture, and the like. However, the disclosure is not limited thereto. According to an embodiment, the second insulating layer INS2 may include an organic insulating layer including an organic material according to a design condition or the like of a display device to which the light emitting elements LD may be applied.

The light emitting elements LD may be prevented from being deviated from an aligned position, by forming the second insulating layer INS2 on the light emitting elements LD after the alignment of the light emitting elements LD in the pixel area PXA of each of the pixels PXL may be completed. In case that a gap (or a space) exists between the first insulating layer INS1 and the light emitting elements LD before formation of the second insulating layer INS2, the gap may be filled with the second insulating layer INS2 during a process of forming the second insulating layer INS2. Accordingly, the second insulating layer INS2 may be formed of an organic insulating layer advantageous for filling the gap between the first insulating layer INS1 and the light emitting elements LD.

In an embodiment of the disclosure, the second insulating layer INS2 may be formed on the light emitting elements LD so that the active layer 12 of each of the light emitting elements LD may not come into contact with an external conductive material. The second insulating layer INS2 may cover only a portion of a surface (or an outer circumferential surface) of each of the light emitting elements LD and may expose the ends of each of the light emitting elements LD to the outside.

The contact electrode CNE may be provided and/or formed on the first and second electrodes EL1 and EL2. The contact electrode CNE may be a configuration for electrically more stably connecting each of the first and second electrodes EL1 and EL2 and the light emitting elements LD.

The contact electrode CNE may include first to fourth contact electrodes CNE1 to CNE4.

The first contact electrode CNE1 may be provided and/or formed on the (1-1)-th electrode EL1_1. Since an area of the (1-1)-th electrode EL1_1 may be exposed by the first opening OPN1 of the first insulating layer INS1, the first contact electrode CNE1 may directly contact an area of the (1-1)-th electrode EL1_1 by the first opening OPN1 to be connected to the (1-1)-th electrode EL1_1. According to an embodiment, in case that a capping layer (not shown) is disposed on an area of the (1-1)-th electrode EL1_1 exposed by the first opening OPN1 of the first insulating layer INS1, the first contact electrode CNE1 may be disposed on the capping layer and may be connected to the (1-1)-th electrode EL1_1 through the capping layer. Here, the capping layer may protect the (1-1)-th electrode EL1_1 from a defect or the like generated during the manufacturing process of the display device, and may further strengthen adhesion strength between the (1-1)-th electrode EL1_1 and the pixel circuit layer PCL disposed thereunder. The capping layer may include a transparent conductive material such as indium zinc oxide (IZO) in order to minimize loss of the light emitted from each of the light emitting elements LD and reflected by the (1-1)-th electrode EL1_1 in the image display direction of the display device.

The first contact electrode CNE1 may be positioned in the first area A1 of the pixel area PXA of each of the pixels PXL. The first contact electrode CNE1 may be provided directly on an end (for example, a p-type semiconductor layer) of each of the first light emitting elements LD1 to overlap the end and to be connected to the end of each of the first light emitting elements LD1. As the first contact electrode CNE1 directly contacts (or may be directly connected to) the (1-1)-th electrode EL1_1, the signal of the driving transistor Tdr applied to the (1-1)-th electrode EL1_1 may be transmitted to the first contact electrode CNE1. The signal transmitted to the first contact electrode CNE1 may be applied to the end of each of the first light emitting elements LD1.

The second contact electrode CNE2 may be provided and/or formed on the (2-1)-th electrode EL2_1. In an embodiment of the disclosure, the second contact electrode CNE2 may be provided and/or formed on the (2-1)-th electrode EL2_1 with the first insulating layer INS1 interposed therebetween. As described above, as the (2-1)-th electrode EL2_1 may be completely covered by the first insulating layer INS1, the second contact electrode CNE2 may be electrically insulated from the (2-1)-th electrode EL2_1. According to an embodiment, in case that the capping layer is disposed on the (2-1)-th electrode EL2_1, the first insulating layer INS1 may be disposed on the capping layer to completely cover the capping layer and the (2-1)-th electrode EL2_1. The second contact electrode CNE2 may be electrically insulated from the (2-1)-th electrode EL2_1 and the capping layer by the first insulating layer INS1.

In an embodiment of the disclosure, the second contact electrode CNE2 may be positioned in the first area A1 of the pixel area PXA of the corresponding pixel PXL. The second contact electrode CNE2 may be provided directly on another end (for example, an n-type semiconductor layer) of each of the first light emitting elements LD1 to overlap the another end, and may be connected to the another end of the first light emitting elements LD1.

The first and second contact electrodes CNE1 and CNE2 may be formed of various transparent conductive materials (or substances) in order to allow light emitted from each of the first light emitting elements LD1 and reflected by the (1-1)-th and (2-1)-th electrodes EL1_1 and EL2_1 to proceed in the image display direction of the display device without loss. For example, the first and second contact electrodes CNE1 and CNE2 may include at least one of various transparent conductive materials including indium tin oxide (ITO), indium zinc oxide (IZO), zinc oxide (ZnO), indium tin zinc oxide (ITZO), and the like, and may be substantially transparent or translucent to satisfy a light transmittance (or transmittance). However, a material of the first and second contact electrodes CNE1 and CNE2 is not limited to an above-described embodiment. According to an embodiment, the first and second contact electrodes CNE1 and CNE2 may be formed of various opaque conductive materials. The opaque conductive material may include, for example, titanium (Ti), aluminum (Al), silver (Ag), or the like, but the disclosure is not limited thereto. The first and second contact electrodes CNE1 and CNE2 may be formed of a single layer or multiple layers.

The first contact electrode CNE1 and the second contact electrode CNE2 may be provided on the same layer and may be formed through the same process. However, the disclosure is not limited thereto, and according to an embodiment, the first and second contact electrodes CNE1 and CNE2 may be provided on different layers and may be formed through different processes. In case that the first contact electrode CNE1 and the second contact electrode CNE2 are provided on different layers and formed through different processes, as shown in FIG. 13, an auxiliary insulating layer AUINS may be provided and/or formed between the first contact electrode CNE1 and the second contact electrode CNE2. The auxiliary insulating layer AUINS may be provided on the first contact electrode CNE1 to cover the first contact electrode CNE1. At this time, the auxiliary insulating layer AUINS may include the same material as the first and second insulating layers INS1 and INS2, or may include one or more materials selected from materials disclosed as a configuration material of the first and second insulating layers INS1 and INS2. For example, the auxiliary insulating layer AUINS may be formed of an inorganic insulating layer including an inorganic material or an organic insulating layer including an organic material. As described above, in case that the auxiliary insulating layer AUINS is disposed on the first contact electrode CNE1, the second contact electrode CNE2 may be provided on the auxiliary insulating layer AUINS.

The third contact electrode CNE3 may be provided and/or formed on the (1-2)-th electrode EL1_2. In an embodiment of the disclosure, the third contact electrode CNE3 may be provided and/or formed on the (1-2)-th electrode EL1_2 with the first insulating layer INS1 interposed therebetween. As described above, as the (1-2)-th electrode EL1_2 may be completely covered by the first insulating layer INS1, the third contact electrode CNE3 may be electrically insulated from the (1-2)-th electrode EL1_2. According to an embodiment, in case that the capping layer is disposed on the (1-2)-th electrode EL1_2, the first insulating layer INS1 may be disposed on the capping layer to completely cover the capping layer and the (1-2)-th electrode EL1_2. The third contact electrode CNE3 may be electrically insulated from the (1-2)-th electrode EL1_2 and the capping layer by the first insulating layer INS1.

In an embodiment of the disclosure, the third contact electrode CNE3 may be positioned in the second area A2 of the pixel area PXA of the corresponding pixel PXL. The third contact electrode CNE3 may be provided directly on an end (for example, a p-type semiconductor layer) of each of the second light emitting elements LD2 to overlap the end and to be connected to the end of each of the second light emitting elements LD2.

The fourth contact electrode CNE4 may be provided and/or formed on the (2-2)-th electrode EL2_2. Since an area of the (2-2)-th electrode EL2_2 may be exposed by the second opening OPN2 of the first insulating layer INS1, the fourth contact electrode CNE4 may directly contact an area of the (2-2)-th electrode EL2_2 by the second opening OPN2 to be electrically and/or physically connected to the (2-2)-th electrode EL2_2. According to an embodiment, in case that the capping layer is disposed on an area of the (2-2)-th electrode EL2_2 by the second opening OPN2 of the first insulating layer INS1, the fourth contact electrode CNE4 may be disposed on the capping layer to be electrically and/or physically connected to the (2-2)-th electrode EL2_2 through the capping layer.

The fourth contact electrode CNE4 may be positioned in the second area A2 of the pixel area PXA of each of the pixels PXL. The fourth contact electrode CNE4 may be provided directly on another end (for example, an n-type semiconductor layer) of each of the second light emitting elements LD2 to overlap the another end and to be connected to the another end of each of the second light emitting elements LD2. As the fourth contact electrode CNE4 directly contacts (or may be directly connected to) the (2-2)-th electrode EL2_2, the second driving power supply VSS applied to the (2-2)-th electrode EL2_2 may be transmitted to the fourth contact electrode CNE4. The second driving power supply VSS transmitted to the fourth contact electrode CNE4 may be applied to the another end of each of the second light emitting elements LD2.

The third and fourth contact electrodes CNE3 and CNE4 may be formed of various transparent conductive materials (or substances) in order to allow light emitted from each of the second light emitting elements LD2 and reflected by the (1-2)-th and (2-2)-th electrodes EL1_2 and EL2_2 to proceed in the image display direction of the display device without loss. In an embodiment of the disclosure, the third and fourth contact electrodes CNE3 and CNE4 may include the same material as the first and second contact electrodes CNE1 and CNE2, and may be formed through the same process as the first and second contact electrodes CNE1 and CNE2.

When viewed in a plan view, each of the first to fourth contact electrodes CNE1 to CNE4 may have a bar shape extending along the second direction DR2, but the disclosure is not limited thereto. According to an embodiment, a shape of the first to fourth contact electrodes CNE1 to CNE4 may be variously changed within a range electrically stably connected to each of the light emitting elements LD. The shape of each of the first to fourth contact electrodes CNE1 to CNE4 may be variously changed in consideration of a connection relationship with electrodes disposed thereunder.

In the pixel area PXA of each of the pixels PXL, the first contact electrode CNE1 positioned in the first area A1 and the third contact electrode CNE3 positioned in the second area A2 may be disposed to be spaced apart at a constant distance in the second direction DR2. For example, the first contact electrode CNE1 and the third contact electrode CNE3 may be disposed in the same column along the second direction DR2 and may be spaced apart from each other. According to an embodiment, the first contact electrode CNE1 and the third contact electrode CNE3 may be positioned in columns different from each other within a range in which a spatial restriction according to a density degree of configurations positioned in the pixel area PXA of each of the pixels PXL may be considered while maintaining a state in which the first contact electrode CNE1 and the third contact electrode CNE3 may be spaced apart from each other to be electrically insulated from each other.

In the pixel area PXA of each of the pixels PXL, the second contact electrode CNE2 positioned in the first area A1 and the fourth contact electrode CNE4 positioned in the second area A2 may be disposed to be spaced apart in the second direction DR2 at a constant distance. For example, the second contact electrode CNE2 and the fourth contact electrode CNE4 may be positioned in the same column along the second direction DR2 and may be disposed to be spaced apart from each other. However, the disclosure is not limited thereto, and the second contact electrode CNE2 and the fourth contact electrode CNE4 may be positioned in different columns.

The first and second contact electrodes CNE1 and CNE2 may configure the first series stage SET1 together with the first light emitting elements LD1 and the (1-1)-th and (2-1)-th electrodes EL1_1 and EL2_1. The third and fourth contact electrodes CNE3 and CNE4 may configure the second series stage SET2 together with the second light emitting elements LD2 and the (1-2)-th and (2-2)-th electrodes EL1_2 and EL2_2.

The second contact electrode CNE2 disposed in the first series stage SET1 may be electrically and/or physically connected to the third contact electrode CNE3 disposed in the second series stage SET by the intermediate electrode CTE. The intermediate electrode CTE may be positioned between the first series stage SET1 and the second series stage SET2, and may be connected to the second contact electrode CNE2 of the first series stage SET1 and the third contact electrodes CNE3 of the second series stage SET2.

In an embodiment of the disclosure, the intermediate electrode CTE may be provided between the first area A1 and the second area A2 so as not to overlap the first and second openings OPN1 and OPN2 of the first insulating layer INS1. In particular, the intermediate electrode CTE may be electrically and/or physically connected to the contact electrode CNE electrically insulated from the corresponding electrode by the first insulating layer INS1. For example, the intermediate electrode CTE may be electrically and/or physically connected to the second contact electrode CNE2 on the (2-1)-th electrode EL2_1 covered by the first insulating layer INS1. The intermediate electrode CTE may be electrically and/or physically connected to the third contact electrode CNE3 on the (1-2)-th first electrode EL1_2 covered by the first insulating layer INS1.

The intermediate electrode CTE may be provided over the first area A1 where the first series stage SET1 may be positioned and the second area A2 where the second series stage SET2 may be positioned when viewed in a plan view, and may overlap a portion of each of the first and second electrodes EL1 and EL2. The intermediate electrode CTE may be an electrode to which a signal (or voltage) may not be directly transmitted from the outside.

An end of the intermediate electrode CTE may be connected to the second contact electrode CNE2 in the first area A1, and another end thereof may be connected to the third contact electrode CNE3 in the second area A2. Accordingly, the intermediate electrode CTE may function as a bridge electrode (or a connection electrode) connecting the second contact electrode CNE2 of the first area A1 and the third contact electrode CNE3 of the second area A2 to each other. For example, the intermediate electrode CTE may be a bridge electrode (or a connection electrode) connecting the first series stage SET1 and the second series stage SET2.

The intermediate electrode CTE may be provided on the same layer as the second contact electrode CNE2 and/or the third contact electrode CNE3, may include the same material as the second contact electrode CNE2 and/or the third contact electrode CNE3, and may be formed through the same process as the second contact electrode CNE2 and/or the third contact electrode CNE3. In an embodiment of the disclosure, the intermediate electrode CTE may be formed integrally with the second contact electrode CNE2 and/or the third contact electrode CNE3. In case that the intermediate electrode CTE is provided integrally with the second contact electrode CNE2 and/or the third contact electrode CNE3, the intermediate electrode CTE may be regarded as an area of the second contact electrode CNE2 and/or an area of the third contact electrode CNE3.

As described above, the intermediate electrode CTE, the second contact electrode CNE2, and the third contact electrode CNE3 may be integrally formed and may be electrically and/or physically connected to each other. Accordingly, the first series stage SET1 and the second series stage SET2 of each of the pixels PXL may be electrically and/or physically connected to each other.

The intermediate electrode CTE may be provided over the first area A1 and the second area A2 and may have a bar shape bent at least once. However, a shape of the intermediate electrode CTE is not limited to an above-described embodiment. According to an embodiment, the intermediate electrode CTE may be changed into various shapes within a range for stably connecting two successive series stages.

The third insulating layer INS3 may be provided and/or formed on the first to fourth contact electrodes CNE1 to CNE4 and the intermediate electrode CTE. The third insulating layer INS3 may be an inorganic insulating layer including an inorganic material or an organic insulating layer including an organic material. For example, the third insulating layer INS3 may have a structure in which at least one inorganic insulating layer or at least one organic insulating layer may be alternately stacked. The third insulating layer INS3 may be an encapsulation layer that entirely covers the display element layer DPL and blocks water, moisture, or the like from being input to the display element layer DPL including the light emitting elements LD.

As shown in FIG. 15, in case that the driving current flows from the first power line PL1 to the driving voltage lines DVL and PL2 by the driving transistor Tdr of the pixel circuit layer PCL included in each pixel PXL, the driving current may flow into the emission unit EMU of each pixel PXL through the first contact hole CH1.

For example, the driving current may be supplied to the (1-1)-th electrode EL1_1 through the first contact hole CH1, and the driving current flows to the second contact electrode CNE2 via the first light emitting elements LD1 through the first contact electrode CNE1 that may be in direct contact with (or may be connected to) the (1-1)-th electrode EL1_1. Accordingly, in the first series stage SET1, the first light emitting elements LD1 may emit light with a luminance corresponding to a current distributed to each of the first light emitting elements LD1. At this time, the second contact electrode CNE2 may be electrically insulated from the (2-1)-th electrode EL2_1 disposed thereunder by the first insulating layer INS1.

The driving current flowing to the second contact electrode CNE2 flows to the third contact electrode CNE3 via the intermediate electrode CTE. The driving current flowing to the third contact electrode CNE3 flows to the fourth contact electrode CNE4 via the second light emitting elements LD3. The driving current flowing to the fourth contact electrode CNE4 flows to the (2-2)-th electrode EL2_2 that may be in direct contact with (or may be connected to) the fourth contact electrode CNE4. Accordingly, the second light emitting elements LD2 may emit light with a luminance corresponding to a current distributed to each of the second light emitting elements LD2. At this time, the third contact electrode CNE3 may be electrically insulated from the first (1-2)-th electrode EL1_2 disposed thereunder by the first insulating layer INS1.

In an above-described method, the driving current of each pixel PXL may flow sequentially through the first light emitting elements LD1 of the first series stage SET1 and the second light emitting elements LD2 of the second series stage SET2. Accordingly, each pixel PXL may emit light with a luminance corresponding to the data signal supplied during each frame period.

In an embodiment of the disclosure, after aligning the light emitting elements LD in the pixel area PXA of each of the pixels PXL, each of the first to fourth contact electrodes CNE1 to CNE4 may be used as a driving electrode for driving the light emitting elements LD together with the (1-1)-th electrode EL1_1 of the first series stage SET1 and the (2-2)-th electrode EL2_2 of the second series stage SET2.

In an embodiment of the disclosure, in a step of forming the second contact electrode CNE2 of the first series stage SET1 and the third contact electrode CNE3 of the second series stage SET2, the intermediate electrode CTE for serially connecting the first light emitting elements LD1 of the first series stage SET1 and the second light emitting elements LD2 of the second series stage SET2 may be simultaneously formed. Accordingly, a manufacturing process of each pixel PXL and the display device including the same may be simplified, and thus product yield may be improved.

According to the above-described embodiments, the pixel area PXA of each of the pixels PXL may be divided into the first area A1 and the second area A2 in a direction, for example, the second direction DR2, and the intermediate electrode CTE may be disposed between the first area A1 and the second area A2 to connect two successive series stages in the pixel area PXA. The light emitting elements LD included in each of the two successive series stages may be electrically connected to each other through an intermediate electrode CTE. For example, the first light emitting elements LD1 included in the first series stage SET1 and the second light emitting elements LD2 included in the second series stage SET2 may be electrically connected to each other through the intermediate electrode CTE. In such a method, the light emitting elements LD aligned in the pixel area PXA of each of the pixels PXL may be connected in a series/parallel mixed structure to configure the emission unit EMU of each pixel PXL. Accordingly, the emission unit EMU of each pixel PXL may be configured in a series/parallel mixed structure without increasing the number of alignment electrodes (or alignment lines). The emission unit EMU may be configured in a series/parallel mixed structure including at least two or more series stages without increasing the number of alignment electrodes (or alignment lines) in each pixel PXL (or minimizing the area occupied by the alignment electrodes), and thus a display device having high resolution and a fine pitch may be easily implemented.

In a display device for implementing high resolution and fine pitch, a size (the an area) of each pixel PXL may be reduced, and thus a connection of multiple series stages through an increase of the number of alignment electrodes (or alignment lines) may be difficult due to a spatial restriction between configurations included in each pixel PXL, for example, a critical dimension (CD) ("a line width of each of electrodes or a width of a gap between the electrodes") of the electrodes included in each pixel PXL.

Accordingly, in the disclosure, the emission unit EMU of each pixel PXL may be configured in a series/parallel mixed structure without increasing the number of alignment electrodes (or alignment lines), by disposing the intermediate electrode CTE between the successive first and second series stages SET1 and SET2, directly connecting the (1-1)-th electrode EL1_1 of the first series stage SET1 to the first contact electrode CNE1, directly connecting the (2-2)-th electrode EL2_2 of the second series stage SET2 to the fourth contact electrode CNE4, and covering the (2-1)-th electrode EL2_1 of the first series stage SET1 and the (1-2)-th electrode EL1_2 of the second series stage SET2 with the first insulating layer INS1.

According to the above-described embodiments, by configuring the emission unit EMU of the series/parallel mixed structure, each pixel PXL may be stably driven to reduce the driving current flowing through the display panel of the display device, thereby improving power consumption efficiency.

According to the above-described embodiments, since each of an area of the first electrode EL1_1, for example, the (1-2)-th electrode EL1_2, and an area of the second electrode EL2, for example, the (2-1)-th electrode EL2_1 may be covered by the first insulating layer INS1, the area of the first electrode EL1_1 and the area of the second electrode EL2 may not be affected by static electricity input from the outside.

FIGS. 16A to 16G are schematic plan views sequentially illustrating a method of manufacturing the pixel PXL shown in FIG. 8, and FIGS. 17A to 17H are schematic cross-sectional views sequentially illustrating a method of manufacturing the pixel PXL shown in FIG. 10.

Hereinafter, the pixel PXL according to an embodiment shown in FIGS. 8 and 10 is sequentially described according to a manufacturing method in conjunction with FIGS. 16A to 16G and 17A to 17H. In FIGS. 16A to 16G and FIGS. 17A to 17H, differences from the above-described embodiments are described in order to avoid redundant description.

Referring to FIGS. 1A to 5, 7B, 8 to 16A, and 17A, the pixel circuit layer PCL may be formed on the substrate SUB.

The pixel circuit layer PCL may include the buffer layer BFL, the transistors T, the storage capacitor Cst, the first power line PL1, the driving voltage lines DVL and PL2, and the protective layer PSV. The protective layer PSV may include the first contact hole CH1 exposing an area of the driving transistor Tdr and the second contact hole CH1 exposing an area of the driving voltage lines DVL and PL2.

Referring to FIGS. 1A to 5, 7B, 8 to 15, 16B, 17A, and 17B, the first bank pattern BNK1 may be formed on the protective layer PSV. On the protective layer PSV, the first bank pattern BNK1 may be spaced apart from the first bank pattern BNK1 adjacent in the first direction DR1 by a distance.

Referring to FIGS. 1A to 5, 7B, 8 to 15, 16C, and 17A to 17C, the first and second electrodes EL1 and EL2 including a conductive material (or substance) having high reflectance may be formed on the first bank pattern BNK1.

The first electrode EL1 may be divided into the (1-1)-th electrode EL1_1 positioned in the first area A1 of the pixel area PXA of each pixel PXL and the (1-2)-th electrodes EL1_2 positioned in the second area A2 of the pixel area PXA. The second electrode EL2 may be divided into the (2-1)-th electrode EL2_1 positioned in the first area A1 and the (2-2)-th electrode EL2_2 positioned in the second area A2. The first electrode EL1 may be electrically and/or physically connected to the driving transistor Tdr through the first contact hole CH1. The second electrode EL2 may be electrically and/or physically connected to the driving voltage lines DVL and PL2 through the second contact hole CH2.

Each of the first and second electrodes EL1 and EL2 may extend along the second direction DR2.

Referring to FIGS. 1A to 5, 7B, 8 to 15, 16D, and 17A to 17D, an insulating material layer INSM may be formed on the protective layer PSV including the first and second electrodes EL1 and EL2. The insulating material layer INSM may be an inorganic insulating layer including an inorganic material or an organic insulating layer including an organic material.

Subsequently, the second bank pattern BNK2 may be formed in the pixel area PXA of each pixel PXL. The second bank pattern BNK2 may be formed on the insulating material layer INSM. The second bank pattern BNK2 may be a pixel defining layer defining (or partitioning) the pixel area PXA (or the emission area) between each pixel PXL and pixels PXL adjacent thereto.

Referring to FIGS. 1A to 5, 7B, 8 to 15, 16E, and 17A to 17E, the alignment signal (or the alignment voltage) corresponding to each of the first and second electrodes EL1 and EL2 may be applied to form an electric field between the first and second electrodes EL1 and EL2 adjacent in the first direction DR1.

Subsequently, in a state in which the electric field may be formed between the first and second electrodes EL1 and EL2, a mixed solution including the light emitting elements LD may be input to the pixel area PXA of each of the pixels PXL using an inkjet printing method or the like. For example, an inkjet nozzle may be disposed on the insulating material layer INSM, and a solvent mixed with the light emitting elements LD may be input to the pixel area PXA of each of the pixels PXL through the inkjet nozzle. A method of inputting the light emitting elements LD to the pixel area PXA of each of the pixels PXL is not limited to an above-described embodiment, and the method of inputting the light emitting elements LD may be variously changed.

After the light emitting elements LD are input to the pixel area PXA of each of the pixels PXL, the solvent may be removed.

In case that the light emitting elements LD are input to the pixel area PXA of each of the pixels PXL, self-alignment may be induced by the electric field formed between the first electrode EL1 and the second electrode EL2. Accordingly, the light emitting elements LD may be aligned between the first electrode EL1 and the second electrode EL2. In an embodiment of the disclosure, the light emitting elements LD may be divided into the first light emitting elements LD1 and the second light emitting elements LD2 according to positions of the first and second areas A1 and A2 of the pixel area PXA of each of the pixels PXL. For example, the light emitting elements LD positioned in the first area A1 of the pixel area PXA may be the first light emitting elements LD1 and the light emitting elements LD positioned in the second area A2 of the pixel area PXA may be the second light emitting elements LD2.

The first and second light emitting elements LD1 and LD2 may be aligned on the insulating material layer INSM between the first and second electrodes EL1 and EL2 in the pixel area PXA of each of the pixels PXL.

Referring to FIGS. 1A to 5, 7B, 8 to 15, 16F, and 17A to 17F, after aligning the light emitting elements LD in the pixel area PXA of each pixel PXL, the second insulating layer INS2 may be formed on each light emitting element LD. The second insulating layer INS2 may cover at least a portion of the upper surface of each of the light emitting elements LD to expose the ends of each of the light emitting elements LD except for the active layer 12 to the outside.

The first insulating layer INS1 including the first opening OPN1 exposing a portion of the (1-1)-th electrode EL1_1 and the second opening OPN2 exposing a portion of the (2-2)-th electrode EL2_2 may be formed by removing a portion of the insulating material layer INSM through a process of forming the second insulating layer INS2, an etching process performed before and after the process of forming the second insulating layer INS2, or the like.

The first insulating layer INS1 may cover each of the (1-2)-th electrode EL1_2 and the (2-1)-th electrode EL2_1. Accordingly, the (1-2)-th electrode EL1_2 and the (2-1)-th electrode EL2_1 may be electrically insulated from configurations disposed on the first insulating layer INS1.

A portion of the first electrode EL1 may be removed in case that a process of forming the first and second insulating layers INS1 and INS2 is performed so that each pixel PXL may be driven independently (or individually) from the pixels PXL adjacent thereto. Accordingly, the first electrode EL1 provided to each pixel PXL may be electrically and/or physically separated from the first electrode EL1 provided to an adjacent pixel PXL positioned in the same pixel column.

Referring to FIGS. 1A to 5, 7B, 8 to 15, 16G, and 17A to 17G, the first to fourth contact electrodes CNE1 to CNE4 and the intermediate CTE may be formed on the second insulating layer INS2.

The first contact electrode CNE1 may be formed on the (1-1)-th electrode EL1_1 and may be connected to the (1-1)-th electrode EL1_1 and an end of each of the first light emitting elements LD. The second contact electrode CNE2 may be formed on the first insulating layer INS1 on the (2-1)-th electrode EL2_1 and may be connected to another end of each of the first light emitting elements LD1. The third contact electrode CNE3 may be formed on the first insulating layer INS1 on the (1-2)-th first electrode EL1_2 and may be connected to an end of each of the second light emitting elements LD2. The fourth contact electrode CNE4 may be formed on the (2-2)-th electrode EL2_2 and may be connected to the (2-2)-th electrode EL2_2 and another end of each of the second light emitting elements LD2.

The first and second contact electrodes CNE1 and CNE2 may be positioned in the first area A1 of the pixel area PXA of each of the pixels PXL, and the third and fourth contact electrodes CNE3 and CNE4 may be positioned in the second area A2 of the pixel area PXA of each of the pixels PXL. The first and second contact electrodes CNE1 and CNE2 may configure the first series stage SET1 together with the (1-1)-th electrode EL1_1, the (2-1)-th electrode EL2_1, and the first light emitting elements LD1. The third and fourth contact electrodes CNE3 and CNE4 may configure the second series stage SET2 together with the (1-2)-th electrode EL1_2, the (2-2)-th electrode EL2_2, and the second light emitting elements LD2.

The intermediate electrode CTE may be provided integrally with the second contact electrode CNE2 and/or the third contact electrode CNE3 to electrically and/or physically connect the second contact electrode CNE2 and the third contact electrode CNE3 to each other. In an embodiment of the disclosure, the intermediate electrode CTE may electrically and/or physically connect the second contact electrode CNE2 of the first series stage SET1 and the third contact electrode CNE3 of the second series stage SET2 to each other to connect the first series stage SET1 and the second series stage SET2.

Referring to FIGS. 1A to 5, 7B, 8 to 15, and 17A to 17H, the third insulating layer INS3 covering the first to fourth contact electrodes CNE1 to CNE4 may be formed. The third insulating layer INS3 may have a structure in which at least one inorganic layer and at least one organic layer are alternately stacked on each other, but the disclosure is not limited thereto.

Figure 18A:
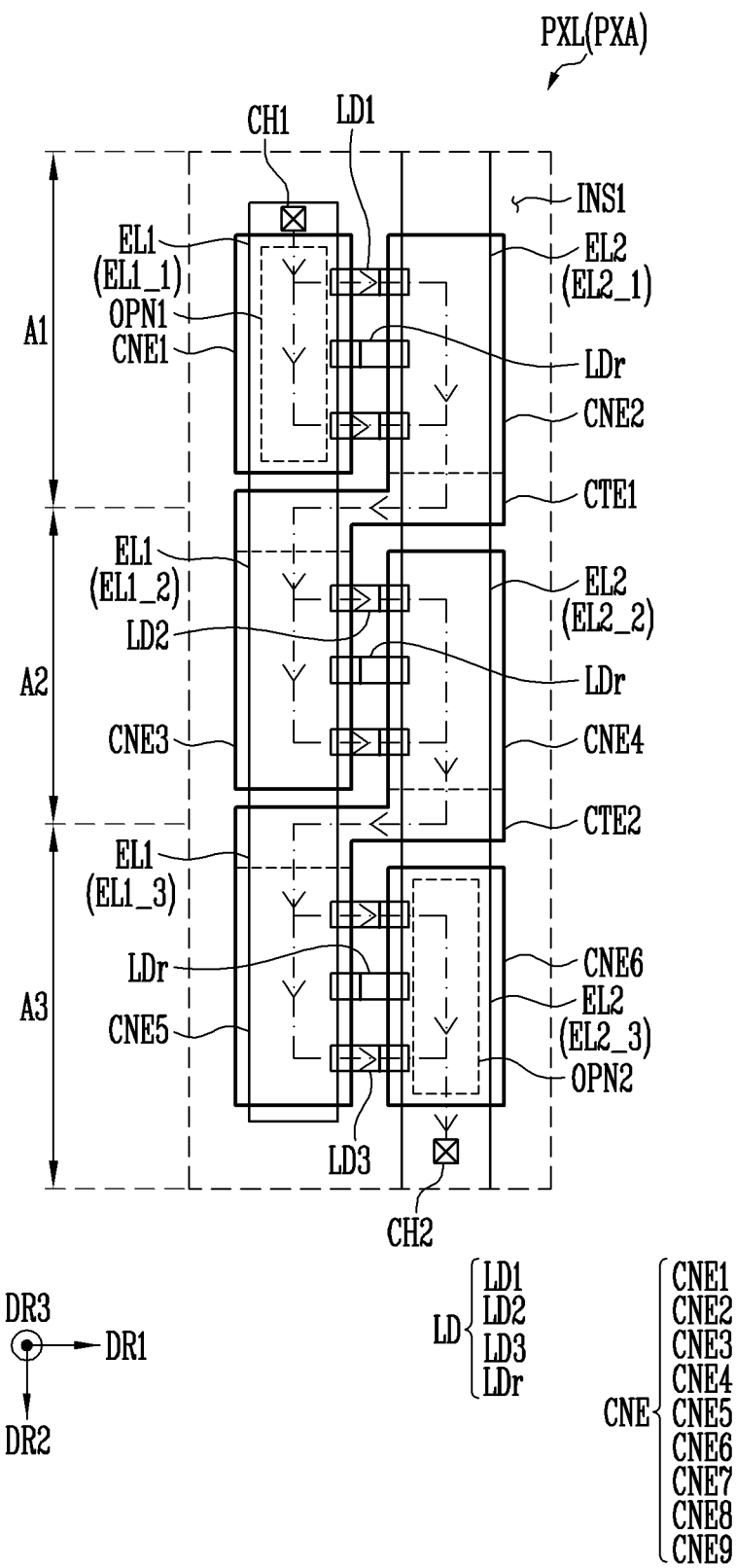
FIGS. 18A to 18C schematically illustrate a pixel according to another embodiment of the disclosure, and are schematic plan views of the pixel including only a partial configuration of a display element layer.
Figure 18B:
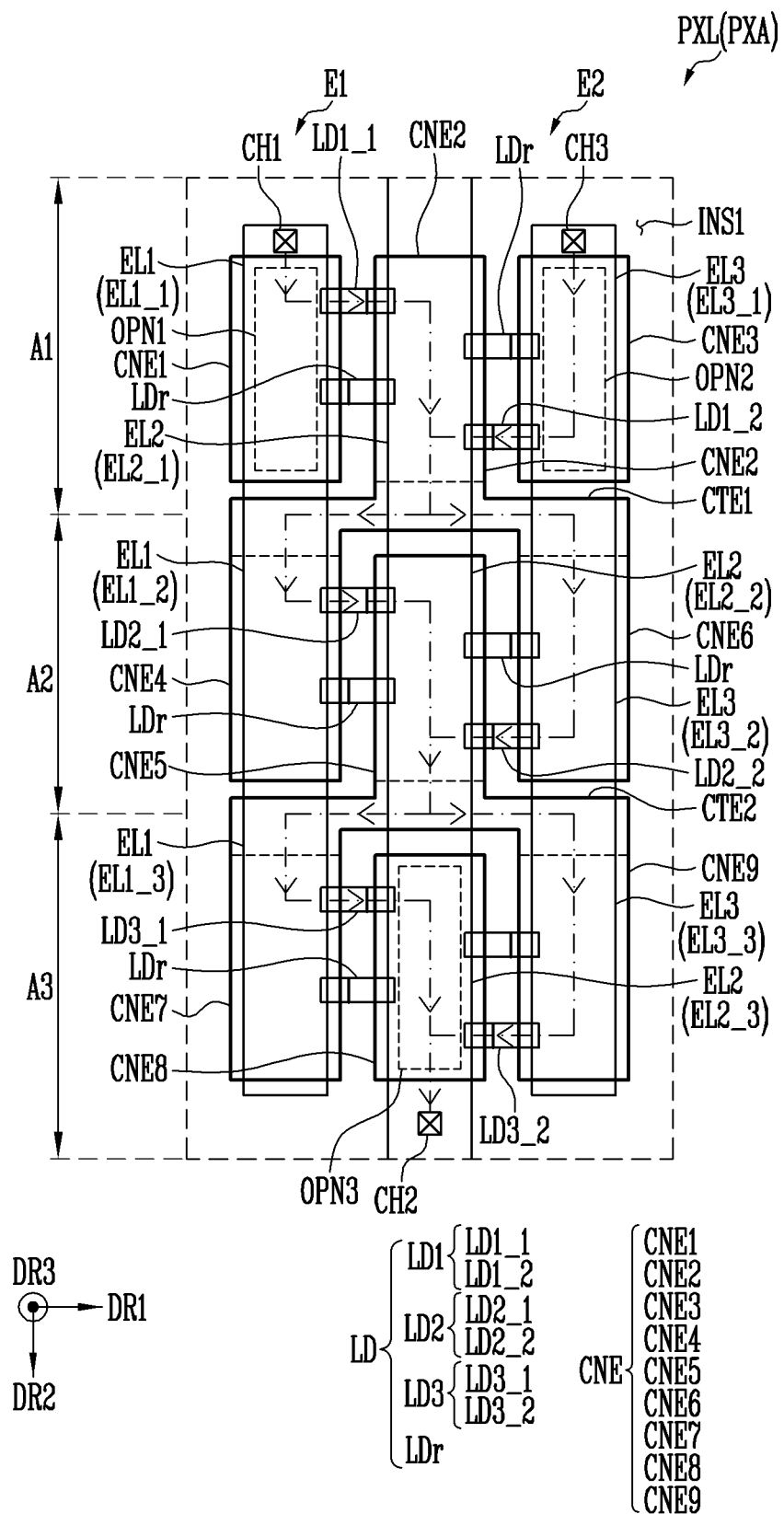
Figure 18C:
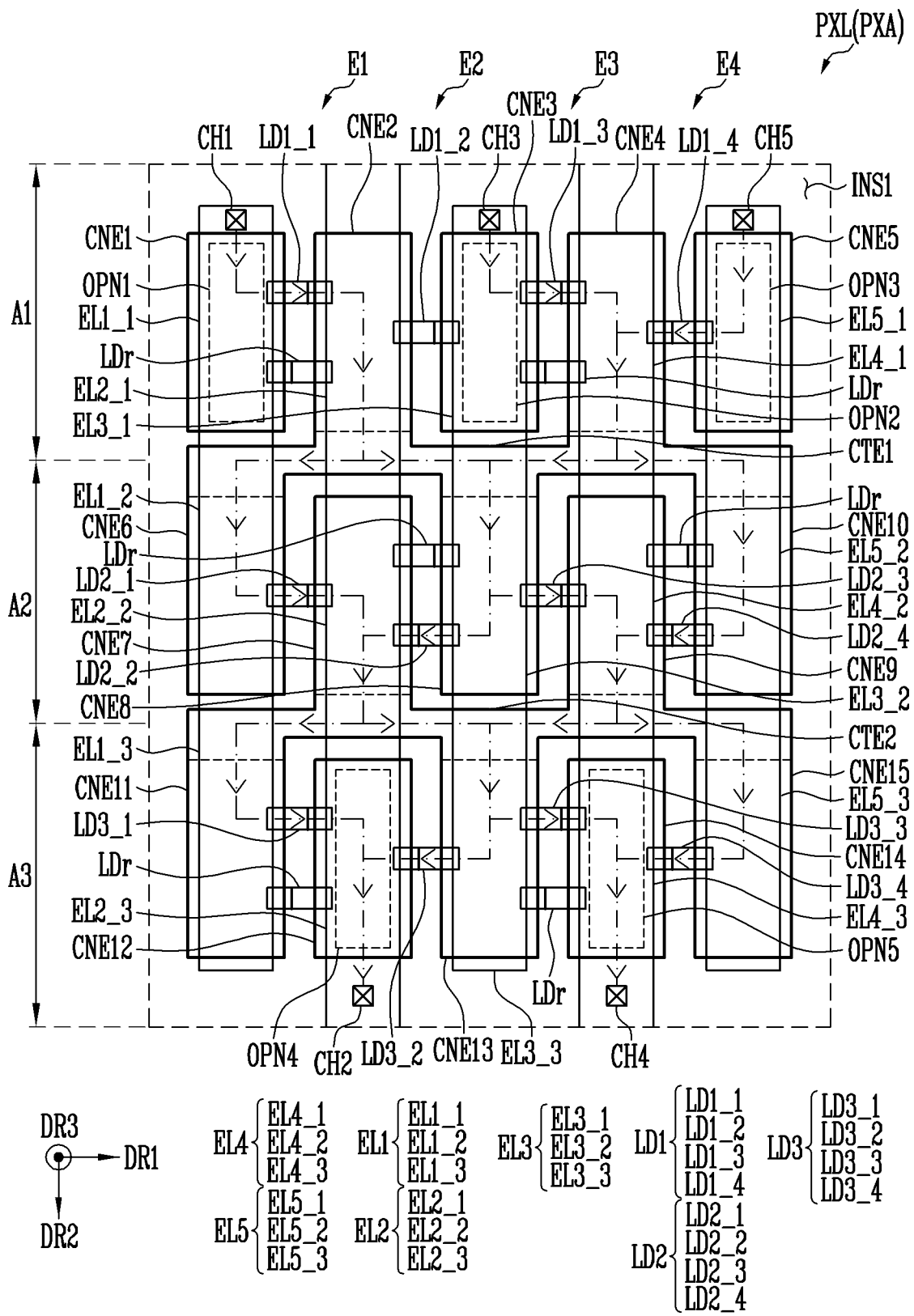

FIGS. 18A to 18C schematically illustrate the pixel PXL according to another embodiment of the disclosure, and are schematic plan views of the pixel PXL including only a partial configuration of the display element layer DPL.

Regarding the pixels PXL of FIGS. 18A to 18C, differences from the above-described embodiments are described in order to avoid redundant description. Parts which are not specifically described in the disclosure may be in accordance with the above-described embodiments, and the same reference numerals indicate the same components and similar reference numerals indicate similar components.

First, referring to FIGS. 1A to 5, 7B, and 18A, the pixel area PXA of each pixel PXL may be divided into first to third areas A1 to A3 sequentially provided along the second direction DR2 when viewed in a plan view. The first area A1 may be an area positioned at an upper side in the pixel area PXA along the second direction DR2, the second area A2 may be an area positioned at a center (or in a middle) in the pixel area PXA along the second direction DR2, and the third area A3 may be an area positioned at a lower side in the pixel area PXA along the second direction DR2.

Each of the first and second electrodes EL1 and EL2 may be divided into three areas according to positions of the first to third areas A1 to A3. For example, an area of the first electrode EL1 positioned in the first area A1 may be a (1-1)-th electrode EL1_1, another area of the first electrode EL1 positioned in the second area A2 may be a (1-2)-th electrode EL1_2, and still another area of the first electrode EL1 positioned in the third area A3 may be a (1-3)-th electrode EL1_3. An area of the second electrode EL2 positioned in the first area A1 may be a (2-1)-th electrode EL2_1, another area of the second electrode EL2 positioned in the second area A2 may be a (2-2)-th electrode EL2_2, and still another area of the second electrode EL2 positioned in the third area A3 may be a (2-3)-th electrode EL2_3.

In the first area A1, the (1-1)-th electrode EL1_1 and the (2-1)-th electrode EL2_1 may be spaced apart from each other in the first direction DR1. In the second area A2, the (1-2)-th electrode EL1_2 and the (2-2)-th electrode EL2_2 may be spaced apart from each other in the first direction DR1. In the third area A3, the (1-3)-th electrode EL1_3 and the (2-3)-th electrode EL2_3 may be spaced apart from each other in the first direction DR1.

The (1-1)-th electrode EL1_1 positioned in the first area A1 may be electrically and/or physically connected to the first transistor T1 of the pixel circuit 144 through the first contact hole CH1, and the (2-3)-th electrode EL2_3 positioned in the third area A3 may be electrically and/or physically connected to the second power line PL2 of the pixel circuit 144 through the second contact hole CH2.

In the first area A1, an area of the (1-1)-th electrode EL1_1 may be exposed to the outside by the first opening OPN1 of the first insulating layer INS1. The first contact electrode CNE1 may be disposed on the (1-1)-th electrode EL1_1, of which the area may be exposed to the outside, and thus the (1-1)-th electrode EL1_1 and the first contact electrode CNE1 may directly contact to be electrically and/or physically connected to each other. In the first area A1, the (2-1)-th electrode EL2_1 may be covered by the first insulating layer INS1. The second contact electrode CNE2 may be disposed on the first insulating layer INS1 on the (2-1)-th electrode EL2_1. The (2-1)-th electrode EL2_1 and the second contact electrode CNE2 may be electrically insulated by the first insulating layer INS1 disposed therebetween.

In the first area A1, at least one first light emitting element LD1 may be aligned between the (1-1)-th electrode EL1_1 and the (2-1)-th electrode EL2_1. An end of the first light emitting element LD1 may be electrically and/or physically connected to one of the first and second contact electrodes CNE1 and CNE2 and the another end of the first light emitting element LD1 may be electrically and/or physically connected to the other of the first and second contact electrodes CNE1 and CNE2.

In an embodiment of the disclosure, the (1-1)-th and (2-1)-th electrodes EL1_1 and EL2_1, the first and second contact electrodes CNE1 and CNE2, and the first light emitting element LD1 positioned in the first area A1 may configure the first series stage SET1.

In the second area A2, the (1-2)-th electrode EL1_2 may be covered by the first insulating layer INS1. The third contact electrode CNE3 may be disposed on the first insulating layer INS1 on the (1-2)-th first electrode EL1_2. The (1-2)-th electrode EL1_2 and the third contact electrode CNE3 may be electrically insulated by the first insulating layer INS1. In the second area A2, the (2-2)-th electrode EL2_2 may be covered by the first insulating layer INS1. The fourth contact electrode CNE4 may be disposed on the first insulating layer INS1 on the (2-2)-th electrode EL2_2. The (2-2)-th electrode EL2_2 and the fourth contact electrode CNE4 may be electrically connected to each other by the first insulating layer INS1.

In the second area A2, at least one second light emitting element LD2 may be aligned between the (1-2)-th electrode EL1_2 and the (2-2)-th electrode EL2_2. An end of the second light emitting element LD2 may be electrically and/or physically connected to one of the third and fourth contact electrodes CNE3 and CNE4, and the another end of the second light emitting element LD2 may be electrically and/or physically connected to the other of the third and fourth contact electrodes CNE3 and CNE4.

In an embodiment of the disclosure, the (1-2)-th and (2-2)-th electrodes EL1_2 and EL2_2, the third and fourth contact electrodes CNE3 and CNE4, and the second light emitting element LD2 may configure the second series stage SET2.

The first intermediate electrode CTE1 may be disposed between the first area A1 and the second area A2. The first intermediate electrode CTE1 may be provided over the first area A1 and the second area A2. An end of the first intermediate electrode CTE1 may be electrically and/or physically connected to the second contact electrode CNE2, and another end of the first intermediate electrode CTE1 may be electrically and/or physically connected to the third contact electrode CNE3. The first intermediate electrode CTE1 may be provided integrally with the second contact electrode CNE2 and/or the third contact electrode CNE3. Accordingly, the second contact electrode CNE2 and the third contact electrode CNE3 may be electrically and/or physically connected to each other by the first intermediate electrode CTE1.

In an embodiment of the disclosure, the first intermediate electrode CTE1 may be a first bridge electrode (or a first connection electrode) electrically connecting the first series stage SET1 and the second series stage SET2.

In the third area A2, the (1-3)-th electrodes EL1_3 may be covered by the first insulating layer INS1. A fifth contact electrode CNE5 may be disposed on the first insulating layer INS1 on the (1-3)-th electrode EL1_3. The (1-3)-th electrode EL1_3 and the fifth contact electrode CNE5 may be electrically insulated by the first insulating layer INS1. An area of the (2-3)-th electrode EL2_3 may be exposed to the outside by the second opening OPN2 of the first insulating layer INS1. A sixth contact electrode CNE6 may be disposed on the (2-3)-th electrode EL2_3, of which the area may be exposed to the outside, and thus the (2-3)-th electrode EL2_3 and the sixth contact electrode CNE6 may directly contact to be electrically and/or physically connected to each other.

In the third area A3, at least one third light emitting element LD3 may be aligned between the (1-3)-th electrode EL1_3 and the (2-3)-th electrode EL2_3. An end of the third light emitting element LD3 may be electrically and/or physically connected to one of the fifth and sixth contact electrodes CNE5 and CNE6, and another end of the third light emitting element LD3 may be electrically and/or physically connected to the other of the fifth and sixth contact electrodes CNE5 and CNE6.

In an embodiment of the disclosure, the (1-3)-th and (2-3)-th electrodes EL1_3 and EL2_3, the fifth and sixth contact electrodes CNE5 and CNE6, and the third light emitting elements LD3 may configure a third series stage.

The second intermediate electrode CTE2 may be disposed between the second area A2 and the third area A3. The second intermediate electrode CTE2 may be provided over the second area A2 and the third area A3. An end of the second intermediate electrode CTE2 may be electrically and/or physically connected to the fourth contact electrode CNE4, and another end of the second intermediate electrode CTE2 may be electrically and/or physically connected to the fifth contact electrode CNE5. The second intermediate electrode CTE2 may be provided integrally with the fourth contact electrode CNE4 and/or the fifth contact electrode CNE5. Accordingly, the fourth contact electrode CNE4 and the fifth contact electrode CNE5 may be electrically and/or physically connected to each other by the second intermediate electrode CTE2.

In an embodiment of the disclosure, the second intermediate electrode CTE2 may be a second bridge electrode (or a second connection electrode) connecting the second series stage SET2 and the third series stage.

An area of the first electrode EL1 that may be exposed by the first opening OPN1 of the first insulating layer INS1 to directly contact the first contact electrode CNE1, for example, the (1-1)-th electrode EL1_1 may be the anode electrode in the emission unit EMU of each pixel PXL. Another area of the second electrode EL2 that may be exposed by the second opening OPN2 of the first insulating layer INS1 to directly contact the sixth contact electrode CNE6, for example, the second (2-3)-th electrode EL2_3 may be the cathode electrode in the emission unit EUM.

In case that the driving current flows from the first power line PL1 to the second power line PL2 by the first transistor T1, the driving current flows to the (1-1)-th electrode EL1_1 and the first contact electrode CNE1 through the first contact hole CH1, and the driving current flows to the second contact electrode CNE2 via the first light emitting elements LD1. The driving current flowing to the second contact electrode CNE2 flows to the third contact electrode CNE3 through the first intermediate electrode CTE1, and the driving current flows to the fourth contact electrode CNE4 via the second light emitting elements LD2. The driving current flowing to the fourth contact electrode CNE4 flows to the fifth contact electrode CNE5 through the second intermediate electrode CTE2. The driving current flowing to the fifth contact electrode CNE5 flows to the (2-3)-th electrode EL2_3 and the sixth contact electrode CNE6 via the third light emitting elements LD3.

As described above, the emission unit EMU of each pixel PXL may be configured in a series/parallel mixed structure without increasing the number of alignment electrodes by disposing the intermediate electrode CTE between successive series stages, directly connecting the (1-1)-th electrode EL1_1 of the first series stage SET1 to the first contact electrode CNE1, directly connecting the (2-3)-th electrode EL2_3 of the third series stage to the sixth contact electrode CNE6, and covering the (2-1)-th electrode EL2_1, the (1-2)-th electrode EL1_2, the (2-2)-th electrode EL2_2, and the (1-3)-th electrodes EL1_3 with the first insulating layer INS1.

Referring to FIGS. 1A to 5 and 18B, first to third electrodes EL1 to EL3 may be provided in the pixel area PXA of each pixel PXL.

In an embodiment of the disclosure, the pixel area PXA of each pixel PXL may include a first emission area E1 and a second emission area E2. The first electrode EL1, the second electrode EL2, and the light emitting elements LD aligned between the first and second electrodes EL1 and EL2 may be provided in the first emission area E1. The third electrode EL3, the second electrode EL2, and the light emitting elements LD aligned between the third and second electrodes EL3 and EL2 may be provided in the second emission area E2. The second electrode EL2 may be disposed between the first emission area E1 and the second emission area E2, and the second electrode EL2 may be commonly provided.

Each of the first and second emission areas E1 and E2 may be divided into first to third areas A1 to A3 along the second direction DR2 when viewed in a plan view.

Each of the first to third electrodes EL1 to EL3 may be divided into three areas according to positions of the first to third areas A1 to A3 of each of the first and second emission areas E1 and E2. The first electrode EL1 may be divided into a (1-1)-th electrode EL1_1 of the first area A1, a (1-2)-th electrode EL1_2 of the second area A2, and a (1-3)-th electrodes EL1_3 of the third area A3. The second electrode EL2 may be divided into a (2-1)-th electrode EL2_1 of the first area A1, a (2-2)-th electrode EL2_2 of the second area A2, and a (2-3)-th electrode EL2_3 of the third area A3. The third electrode EL3 may be divided into a (3-1)-th electrode EL3_1 positioned in the first area A1, a (3-2)-th electrode EL3_2 positioned in the second area A2, and a (3-3)-th electrode positioned in the third area A3.

In the first area A1, the (1-1)-th electrode EL1_1, the (2-1)-th electrode EL2_1, and the (3-1)-th electrode EL3_1 may be spaced apart from each other in the first direction DR1. In the second area A2, the (1-2)-th electrode EL1_2, the (2-2)-th electrode EL2_2, and the (3-2)-th electrode EL3_2 may be spaced apart from each other in the first direction DR1. In the third area A3, the (1-3)-th electrode EL1_3, the (2-3)-th electrode EL2_3, and the (3-3)-th electrode EL3_3 may be spaced apart from each other in the first direction DR1.

The (1-1)-th electrode EL1_1 positioned in the first area A1 may be electrically and/or physically connected to the first transistor T1 of each pixel PXL through a first contact hole CH1, the (3-1)-th electrode EL3_1 positioned in the first area A1 may be electrically and/or physically connected to the first transistor T1 through a third contact hole CH3. The (2-3)-th electrode EL2_3 positioned in the third area A3 may be electrically and/or physically connected to the second power line PL2 through a second contact hole CH2.

In the first area A1 of the first emission area E1, an area of the (1-1)-th electrode EL1_1 may be exposed to the outside by the first opening OPN1 of the first insulating layer INS1, and may be directly connected to the first contact electrode CNE1 by the first opening OPN1.

In the first area A1 of the second emission area E2, an area of the (3-1)-th electrode EL3_1 may be exposed to the outside by the second opening OPN2 of the first insulating layer INS1. The third contact electrode CNE3 may be disposed on the (3-1)-th electrode EL3_1, of which the area may be exposed to the outside, and thus the (3-1)-th electrode EL3_1 and the third contact electrode CNE3 may directly contact to be electrically and/or physically connected to each other.

In the first area A1 between the first and second emission areas E1 and E2, the (2-1)-th electrode EL2_1 may be covered by the first insulating layer INS1 to be electrically insulated from the second contact electrode CNE2 disposed on the (2-1)-th electrode EL2_1.

At least one (1-1)-th light emitting element LD1_1 may be aligned between the (1-1)-th electrode EL1_1 and the (2-1)-th electrode EL2_1. An end of the (1-1)-th light emitting element LD1_1 may be electrically and/or physically connected to the first contact electrode CNE1, and another end of the (1-1)-th light emitting element LD1_1 may be electrically and/or physically connected to the second contact electrode CNE2.

At least one (1-2)-th light emitting element LD1_2 may be aligned between the (2-1)-th electrode EL2_1 and the (3-1)-th electrode EL3_1. An end of the (1-2)-th light emitting element LD1_2 may be electrically and/or physically connected to the third contact electrode CNE3, and another end of the (1-2)-th light emitting element LD1_2 may be electrically and/or physically connected to the second contact electrode CNE2.

In an embodiment of the disclosure, the (1-1)-th electrode EL1_1, the (2-1)-th electrode EL2_1, the (3-1)-th electrode EL3_1, the first to third contact electrodes CNE1, CNE2, and CNE3, and the (1-1)-th and (1-2)-th light emitting elements LD1_1 and LD1_2 positioned in the first area A1 of the first and second emission areas E1 and E2 may configure the first series stage SET1.

In the second area A2 of the first emission area E1, the (1-2)-th electrode EL1_2 may be covered by the first insulating layer INS1 to be electrically insulated from the fourth contact electrode CNE4 disposed on the (1-2)-th electrode EL1_2.

In the second area A2 of the second emission area E2, the (3-2)-th electrode EL3_2 may be covered by the first insulating layer INS1 to be electrically insulated from the sixth contact electrode CNE6 disposed on the (3-2)-th electrode EL3_2.

In the second emission area A2 between the first and second emission areas E1 and E2, the (2-2)-th electrode EL2_2 may be covered by the first insulating layer INS1 to be electrically insulated from the fifth contact electrode CNE5 disposed on the (2-2)-th electrode EL2_2.

In the second area A2 of the first emission area E1, at least one (2-1)-th light emitting element LD2_1 may be aligned between the (1-2)-th electrode EL1_2 and the (2-2)-th electrode EL2_2. An end of the (2-1)-th light emitting element LD2_1 may be electrically and/or physically connected to the fourth contact electrode CNE4, and another end of the (2-1)-th light emitting element LD2_1 may be electrically and/or physically connected to the fifth contact electrode CNE5.

In the second area A2 of the second emission area E2, at least one (2-2)-th light emitting element LD2_2 may be aligned between the (2-2)-th electrode EL2_2 and the (3-2)-th electrode EL3_2. An end of the (2-2)-th light emitting element LD2_2 may be electrically and/or physically connected to the sixth contact electrode CNE6, and another end of the (2-2)-th light emitting element LD2_2 may be electrically and/or physically connected the fifth contact electrode CNE5.

In an embodiment of the disclosure, the (1-2)-th first electrode EL1_2, the (2-2)-th second electrode EL2_2, the (3-2)-th electrode EL3_2, the fourth to sixth contact electrodes CNE4, CNE5, and CNE6, and the (2-1)-th and (2-2)-th light emitting elements LD2_1 and LD2_2 positioned in the second area A2 of the first and second emission areas E1 and E2 may configure the second series stage SET2.

In the first and second emission areas E1 and E2, the first intermediate electrode CTE1 may be disposed between the first area A1 and the second area A2. The first intermediate electrode CTE1 may be provided over the first area A1 and the second area A2. An end of the first intermediate electrode CTE1 may be electrically and/or physically connected to the second contact electrode CNE2, another end of the first intermediate electrode CTE1 may be electrically and/or physically connected to the fourth contact electrode CNE4, and still another end of the first intermediate electrode CTE1 may be electrically and/or physically connected to the sixth contact electrode CNE6. The first intermediate electrode CTE1 may be provided integrally with the second contact electrode CNE2, the fourth contact electrode CNE4, and/or the sixth contact electrode CNE6. Accordingly, the second contact electrode CNE2, the fourth contact electrode CNE4, and the sixth contact electrode CNE6 may be electrically and/or physically connected to each other by the first intermediate electrode CTE1.

In an embodiment of the disclosure, the first intermediate electrode CTE1 may be a first bridge electrode (or a first connection electrode) electrically connecting the first series stage SET1 and the second series stage SET2.

In the third area A3 of the first emission area E1, the (1-3)-th electrode EL1_1 may be covered by the first insulating layer INS1 to be electrically insulated from a seventh contact electrode CNE7 disposed on the (1-3)-th electrode EL1_3.

In the third area A3 of the second emission area E2, the (3-3)-th electrode EL3_3 may be covered by the first insulating layer INS1 to be electrically insulated from a ninth contact electrode CNE9 disposed on the (3-3)-th electrode EL3_3.

In the third area A3 between the first and second emission areas E1 and E2, an area of the (2-3)-th electrode EL2_3 may be exposed to the outside by a third opening OPN3 of the first insulating layer INS1. An eighth contact electrode CNE8 may be disposed on the (2-3)-th electrode EL2_3, of which the area may be exposed to the outside, and thus the (2-3)-th electrode EL2_3 and the eighth contact electrode CNE8 may directly contact to be electrically and/or physically connected to each other.

In the third area A3 of the first emission area E1, at least one (3-1)-th light emitting element LD3_1 may be aligned between the (1-3)-th electrode EL1_3 and the (2-3)-th electrode EL2_3. An end of the (3-1)-th light emitting element LD3_1 may be electrically and/or physically connected to the seventh contact electrode CNE7, and another end of the (3-1)-th light emitting element LD3_1 may be electrically and/or physically connected to the eighth contact electrode CNE8.

In the third area A3 of the second emission area E2, at least one (3-2)-th light emitting element LD3_2 may be aligned between the (2-3)-th electrode EL2_3 and the (3-3)-th electrode EL3_3. An end of the (3-2)-th light emitting element LD3_2 may be electrically and/or physically connected to the ninth contact electrode CNE9, and another end of the (3-2)-th light emitting element LD3_2 may be electrically and/or physically connected to the eighth contact electrode CNE8.

In an embodiment of the disclosure, the (1-3)-th electrode EL1_3 the (2-3)-th electrode EL2_3, the (3-3)-th electrode EL3_3, the seventh to ninth contact electrodes CNE7, CNE8, and CNE9, and the (3-1)-th and (3-2)-th light emitting elements LD3_1 and LD3_2 may configure a third series stage.

In the first and second emission areas E1 and E2, the second intermediate electrode CTE2 may be disposed between the second area A2 and the third area A3. The second intermediate electrode CTE2 may be provided over the second area A2 and the third area A3. An end of the second intermediate electrode CTE2 may be electrically and/or physically connected to the fifth contact electrode CNE5, another end of the second intermediate electrode CTE2 may be electrically and/or physically connected to the seventh contact electrode CNE7, and still another end of the seventh intermediate electrode CTE2 may be electrically and/or physically connected to the ninth contact electrode CNE9. The second intermediate electrode CTE2 may be provided integrally with the fifth contact electrode CNE5, the seventh contact electrode CNE7, and/or the ninth contact electrode CNE9. Accordingly, the fifth contact electrode CNE5, the seventh contact electrode CNE7, and the ninth contact electrode CNE9 may be electrically and/or physically connected to each other by the second intermediate electrode CTE2.

In an embodiment of the disclosure, the second intermediate electrode CTE2 may be a second bridge electrode (or a second connection electrode) electrically connecting the second series stage SET2 and the third series stage.

The (1-1)-th electrode EL1_1 having an area exposed by the first opening OPN1 of the first insulating layer INS1 to directly contact the first contact electrode CNE1 and the (3-1)-th electrode EL3_1 having an area exposed by the second opening OPN2 of the first insulating layer INS1 to directly contact the third contact electrode CNE3 may be the anode electrode of the emission unit EMU of each pixel PXL. The (2-3)-th electrode EL2_3 having an area exposed by the third opening OPN3 of the first insulating layer INS1 to directly contact the eighth contact electrode CNE8 may be the cathode electrode of the emission unit EMU.

In case that the driving current flows from the first power line PL1 to the second power line PL2 by the first transistor T1, the driving current may be supplied to the (1-1)-th electrode EL1_1 and the first contact electrode CNE1 through the first contact hole CH1, and the driving current flows to the second contact electrode CNE2 via the (1-1)-th light emitting element LD1_1. In case that the driving current flows from the first power line PL1 to the second power line PL2, the driving current may be supplied to the (3-1)-th electrode EL3_1 and the third contact electrode CNE3 through the third contact hole CH3, and the driving current flows to the second contact electrode CNE2 via the (1-2)-th light emitting element LD1_2.

The driving current flowing to the second contact electrode CNE2 flows to the fourth contact electrode CNE4 and the sixth contact electrode CNE6 through the first intermediate electrode CTE1. The driving current flowing to the fourth contact electrode CNE4 flows to the fifth contact electrode CNE5 via the (2-1)-th light emitting element LD2_1. The driving current flowing to the sixth contact electrode CNE6 flows to the fifth contact electrode CNE5 via the (2-2)-th light emitting element LD2_2.

The driving current flowing to the fifth contact electrode CNE5 flows to the seventh contact electrode CNE7 and the ninth contact electrode CNE9 through the second intermediate electrode CTE2. The driving current flowing to the seventh contact electrode CNE7 flows to the eighth contact electrode CNE8 via the (3-1)-th light emitting element LD3_1. The driving current flowing to the ninth contact electrode CNE9 flows to the eighth contact electrode CNE8 via the (3-2)-th light emitting element LD3_2.

Referring to FIGS. 1A to 5 and 18C, first to fifth electrodes EL1 to EL5 may be provided in the pixel area PXA of each pixel PXL.

In an embodiment of the disclosure, the pixel area PXA of each pixel PXL may include first to fourth emission areas E1 to E4.

The first electrode EL1, the second electrode EL2, and the light emitting elements LD aligned between the first and second electrodes EL1 and EL2 may be provided in the first emission area E1. The third electrode EL3, the second electrode EL2, and the light emitting elements LD aligned between the third and second electrodes EL3 and EL2 may be provided in the second emission area E2. The second electrode EL2 may be disposed between the first emission area E1 and the second emission area E2. For example, the second electrode EL2 may be commonly provided to the first emission area E1 and the second emission area E2.

The third electrode EL3, the fourth electrode EL4, and the light emitting elements LD aligned between the third and fourth electrodes EL3 and EL4 may be provided in the third emission area E3. The third electrode EL3 may be disposed between the second emission area E2 and the third emission area E3.

The fifth electrode EL5, the fourth electrode EL4, and the light emitting elements LD aligned between the fifth and fourth electrodes EL5 and EL4 may be provided in the fourth emission area E4. The fourth electrode EL4 may be disposed between the third emission area E3 and the fourth emission area E4. For example, the fourth electrode EL4 may be commonly provided to the third emission area E3 and the fourth emission area E4.

Each of the first to fourth emission areas E1 to E4 may be divided into first to third areas A1 to A3 along the second direction DR2 when viewed in a plan view. Each of the first to fifth electrodes EL1 to EL5 may be divided into three areas according to positions of the first to third areas A1 to A3. The first electrode EL1 may be divided into a (1-1)-th electrode EL1_1 of the first area A1, a (1-2)-th electrodes EL1_2 of the second area A2, and a (1-3)-th electrodes EL1_3 of the third area A3. The second electrode EL2 may be divided into a (2-1)-th electrode EL2_1 of the first area A1, a (2-2)-th electrode EL2_2 of the second area A2, and a (2-3)-th electrode EL2_3 of the third area A3. The third electrode EL3 may include a (3-1)-th electrode EL3_1 positioned in the first area A1, a (3-2)-th electrode EL3_2 positioned in the second area A2, and a (3-3)-th electrode positioned in the third area A3. The fourth electrode EL4 may include a (4-1)-th electrode EL4_1 positioned in the first area A1, a (4-2)-th electrode EL4_2 positioned in the second area A2, and a (4-3)-th electrode EL4_3 positioned in the third area A3. The fifth electrode EL5 may include a (5-1)-th electrode EL5_1 positioned in the first area A1, a (5-2)-th electrode EL5_2 positioned in the second area A2, and a (5-3)-th electrode EL5_3 positioned in the third area A3.

In the first area A1, the (1-1)-th electrode EL1_1, the (2-1)-th electrode EL2_1, the (3-1)-th electrode EL3_1, the (4-1)-th electrode EL4_1, and the (5-1)-th electrode EL5_1 may be spaced apart from each other in the first direction DR1. In the second area A2, the (1-2)-th electrode EL1_2, the (2-2)-th electrode EL2_2, the (3-2)-th electrode EL3_2, the (4-2)-th electrode EL4_2, and the (5-2)-th electrode EL5_2 may be spaced apart from each other in the first direction DR1. In the third area A3, the (1-3)-th electrode EL1_3, the (2-3)-th electrode EL2_3, the (3-3)-th electrode EL3_3, the (4-3)-th electrode EL4_3, and the (5-3)-th electrode EL5_3 may be spaced apart from each other in the first direction DR1.

The (1-1)-th electrode EL1_1 positioned in the first area A1 may be electrically and/or physically connected to the first transistor T1 of each pixel PXL through a first contact hole CH1, the (3-1)-th electrode EL3_1 positioned in the first area A1 may be electrically and/or physically connected to the first transistor T1 through a third contact hole CH3, and the (5-1)-th electrode EL5_1 positioned in the first area A1 may be electrically and/or physically connected to the first transistor T1 through a fifth contact hole CH5.

The (2-3)-th electrode EL2_3 positioned in the third area A3 may be electrically and/or physically connected to the second power line PL2 through a second contact hole CH2, and the (4-3)-th electrode EL4_3 positioned in the third area A3 may be electrically and/or physically connected to the second power line PL2 through a fourth contact hole CH4.

An area of the (1-1)-th electrode EL1_1 may be exposed to the outside by the first opening OPN1 of the first insulating layer INS1, and may be directly connected to the first contact electrode CNE1 by the first opening OPN1. The (2-1)-th electrode EL2_1 may be covered by the first insulating layer INS1 to be electrically insulated from the second contact electrode CNE2 disposed on the (2-1)-th electrode EL2_1. An area of the (3-1)-th electrode EL3_1 may be exposed to the outside by the second opening OPN2 of the first insulating layer INS1. The third contact electrode CNE3 may be disposed on the (3-1)-th electrode EL3_1, of which the area may be exposed to the outside, and thus the (3-1)-th electrode EL3_1 and the third contact electrode CNE3 may directly contact to be electrically and/or physically connected to each other. The (4-1)-th electrode EL4_1 may be covered by the first insulating layer INS1 to be electrically insulated from the fourth contact electrode CNE4 disposed on the (4-1)-th electrode EL4_1. An area of the (5-1)-th electrode EL5_1 may be exposed to the outside by the third opening OPN3 of the first insulating layer INS1. The fifth contact electrode CNE5 may be disposed on the (5-1)-th electrode EL5_1, of which the area may be exposed to the outside, and thus the (5-1)-th electrode EL5_1 and the fifth contact electrode CNE5 may directly contact to be electrically and/or physically connected to each other.

At least one (1-1)-th light emitting element LD1_1 may be aligned between the (1-1)-th electrode EL1_1 and the (2-1)-th electrode EL2_1. An end of the (1-1)-th light emitting element LD1_1 may be electrically and/or physically connected to one of the first and second contact electrodes CNE1 and CNE2, and another end of the (1-1)-th light emitting element LD1_1 may be electrically and/or physically connected to the other of the first and second contact electrodes CNE1 and CNE2.

At least one (1-2)-th light emitting element LD1_2 may be aligned between the (2-1)-th electrode EL2_1 and the (3-1)-th electrode EL3_1. An end of the (1-2)-th light emitting element LD1_2 may be electrically and/or physically connected to one of the second and third contact electrodes CNE2 and CNE3, and another end of the (1-2)-th light emitting element LD1_2 may be electrically and/or physically connected to the other of the second and third contact electrodes CNE2 and CNE3.

At least one (1-3)-th light emitting element LD1_3 may be aligned between the (3-1)-th electrode EL3_1 and the (4-1)-th electrode EL4_1. An end of the (1-3)-th light emitting element LD1_3 may be electrically and/or physically connected to one of the third and fourth contact electrodes CNE3 and CNE4, and another end of the (1-3)-th light emitting element LD1_3 may be electrically and/or physically connected to the other of the third and fourth contact electrodes CNE3 and CNE4.

At least one (1-4)-th light emitting element LD1_4 may be aligned between the (4-1)-th electrode EL4_1 and the (5-1)-th electrode EL5_1. An end of the (1-4)-th light emitting elements LD1_4 may be electrically and/or physically connected to one of the fourth and fifth contact electrodes CNE4 and CNE5, and another end of the (1-4)-th light emitting elements LD1_4 may be electrically and/or physically connected to the other of the fourth and fifth contact electrodes CNE4 and CNE5.

The (1-1)-th, (1-2)-th, (1-3)-th, and (1-4)-th light emitting elements LD1_1, LD1_2, LD1_3, and LD1_4 aligned in the first area A1 may configure a first light emitting element group LD1.

In an embodiment of the disclosure, the (1-1)-th electrode EL1_1, the (2-1)-th electrode EL2_1, the (3-1)-th electrode EL3_1, the (4-1)-th electrode EL4_1, and the (5-1)-th electrode EL5_1, the first to fifth contact electrodes CNE1 to CNE5, and the first light emitting element group LD1 may configure the first series stage SET1.

The (1-2)-th electrode EL1_2 may be covered by the first insulating layer INS1 to be electrically insulated from the sixth contact electrode CNE6 disposed on the (1-2)-th electrode EL1_2. The (2-2)-th electrode EL2_2 may be covered by the first insulating layer INS1 to be electrically insulated from the seventh contact electrode CNE7 disposed on the (2-2)-th electrode EL2_2. The (3-2)-th electrode EL3_2 may be covered by the first insulating layer INS1 to be electrically insulated from the eighth contact electrode CNE8 disposed on the (3-2)-th electrode EL3_2. The (4-2)-th electrode EL4_2 may be covered by the first insulating layer INS1 to be electrically insulated from the ninth contact electrode CNE9 disposed on the (4-2)-th electrode EL4_2. The (5-2)-th electrode EL5_2 may be covered by the first insulating layer INS1 to be electrically insulated from a tenth contact electrode CNE10 disposed on the (5-2)-th electrode EL5_2.

At least one (2-1)-th light emitting element LD2_1 may be aligned between the (1-2)-th electrode EL1_2 and the (2-2)-th electrode EL2_2. An end of the (2-1)-th light emitting element LD2_1 may be electrically and/or physically connected to one of the sixth and seventh contact electrodes CNE6 and CNE7, and another end of the (2-1)-th light emitting element LD2_1 may be electrically and/or physically connected to the other of the sixth and seventh contact electrodes CNE6 and CNE7.

At least one (2-2)-th light emitting element LD2_2 may be aligned between the (2-2)-th electrode EL2_2 and the (3-2)-th electrode EL3_2. An end of the (2-2)-th light emitting element LD2_2 may be electrically and/or physically connected to one of the seventh and eighth contact electrodes CNE7 and CNE8, and another end of the (2-2)-th light emitting element LD2_2 may be electrically and/or physically connected to the other of the seventh and eighth contact electrodes CNE7 and CNE8.

At least one (2-3)-th light emitting element LD2_3 may be aligned between the (3-2)-th electrode EL3_2 and the (4-2)-th electrode EL4_2. An end of the (2-3)-th light emitting element LD2_3 may be electrically and/or physically connected to one of the eighth and ninth contact electrodes CNE8 and CNE9, and another end of the (2-3)-th light emitting element LD2_3 may be electrically and/or physically connected to the other of the eighth and ninth contact electrodes CNE8 and CNE9.

At least one (2-4)-th light emitting element LD2_4 may be aligned between the (4-2)-th electrode EL4_2 and the (5-2)-th electrode EL5_2. An end of the (2-4)-th light emitting element LD2_4 may be electrically and/or physically connected to one of the ninth and tenth contact electrodes CNE9 and CNE10, and another end of the (2-4)-th light emitting element LD2_4 may be electrically and/or physically connected to the other of the ninth and tenth contact electrodes CNE9 and CNE10.

The (2-1)-th, (2-2)-th, (2-3)-th, and (2-4)-th light emitting elements LD2_1, LD2_2, LD2_3, and LD2_4 aligned in the second area A2 may configure a second light emitting element group LD2.

In an embodiment of the disclosure, the (1-2)-th electrode EL1_2 the (2-2)-th electrode EL2_2, the (3-2)-th electrode EL3_2, the (4-2)-th electrode EL4_2, and the (5-2)-th electrode EL5_2, the sixth to tenth contact electrodes CNE6 to CNE10, and the second light emitting element group LD2 may configure the second series stage SET2.

The first intermediate electrode CTE1 may be disposed between the first area A1 and the second area A2. The first intermediate electrode CTE1 may be provided over the first area A1 and the second area A2. An end of the first intermediate electrode CTE1 may be electrically and/or physically connected to the second contact electrode CNE2, and another end of the first intermediate electrode CTE1 may be electrically and/or physically connected to the fourth contact electrode CNE4. The another end of the first intermediate electrode CTE1 may be electrically and/or physically connected to the sixth contact electrode CNE6, and the still another end of the first intermediate electrode CTE1 may be electrically and/or physically connected to the eighth contact electrode CNE8, and further still another end of the first intermediate electrode CTE1 may be electrically and/or physically connected to the tenth contact electrode CNE10.

In an embodiment of the disclosure, the first intermediate electrode CTE1 may be a first bridge electrode (or a first connection electrode) electrically connecting the first series stage SET1 and the second series stage SET2.

The (1-3)-th electrode EL1_3 may be covered by the first insulating layer INS1 to be electrically insulated from an eleventh contact electrode CNE11 disposed on the (1-3)-th electrode EL1_3. The (2-3)-th electrode EL2_3 may be exposed to the outside by a fourth opening OPN4 of the first insulating layer INS2, and may be directly connected to a twelfth contact electrode CNE12 by the fourth opening OPN4. The (3-3)-th electrode EL3_3 may be covered by the first insulating layer INS1 to be electrically insulated from a thirteenth contact electrode CNE13 disposed on the (3-3)-th electrode EL3_3. The (4-3)-th electrode EL4_3 may be exposed to the outside by a fifth opening OPN5 of the first insulating layer INS1, and may be directly connected to a fourteenth contact electrode CNE14 by the fifth opening OPN5. The (5-3)-th electrode EL5_3 may be covered by the first insulating layer INS1 to be electrically insulated from a fifteenth contact electrode CNE15 disposed on the (5-3)-th electrode EL5_3.

At least one (3-1)-th light emitting element LD3_1 may be aligned between the (1-3)-th electrode EL1_3 and the (2-3)-th electrode EL2_3. An end of the (3-1)-th light emitting element LD3_1 may be electrically and/or physically connected to one of the eleventh and twelfth contact electrodes CNE11 and CNE12, and another end of the (3-1)-th light emitting element LD3_1 may be electrically and/or physically connected to the other of the eleventh and twelfth contact electrodes CNE11 and CNE12.

At least one (3-2)-th light emitting element LD3_2 may be aligned between the (2-3)-th electrode EL2_3 and the (3-3)-th electrode EL3_3. An end of the (3-2)-th light emitting element LD3_2 may be electrically and/or physically connected to one of the twelfth and thirteenth contact electrodes CNE12 and CNE13, and another end of the (3-2)-th light emitting element LD3_2 may be electrically and/or physically connected to the other of the twelfth and thirteenth contact electrodes CNE12 and CNE13.

At least one (3-3)-th light emitting element LD3_3 may be aligned between the (3-3)-th electrode EL3_3 and the (4-3)-th electrode EL4_3. An end of the (3-3)-th light emitting element LD3_3 may be electrically and/or physically connected to one of the thirteenth and fourteenth contact electrodes CNE13 and CNE14, and another end of the (3-3)-th light emitting element LD3_3 may be electrically and/or physically connected to the other of the thirteenth and fourteenth contact electrodes CNE13 and CNE14.

At least one (3-4)-th light emitting element LD3_4 may be aligned between the (4-3)-th electrode EL4_3 and the (5-3)-th electrode EL5_3. An end of the (3-4)-th light emitting element LD3_4 may be electrically and/or physically connected to one of the fourteenth and fifteenth contact electrodes CNE14 and CNE15, and another end of the (3-4)-th light emitting element LD3_4 may be electrically and/or physically connected to the other of the fourteenth and fifteenth contact electrodes CNE14 and CNE15.

The (3-1)-th, (3-2)-th, (3-3)-th, and (3-4)-th light emitting elements LD3_1, LD3_2, LD3_3, and LD3_4 aligned in the third area A3 may configure a third light emitting element group LD3.

In an embodiment of the disclosure, the (1-3)-th electrode EL1_3, the (2-3)-th electrode EL2_3, the (3-3)-th electrode EL3_3, the (4-3)-th electrode EL4_3, the (5-3)-th electrode EL5_3, the eleventh to fifteenth contact electrodes CNE11 to CNE15, the third light emitting element group LD3 may configure the third series stage.

The second intermediate electrode CTE2 may be disposed between the second area A2 and the third area A3. The second intermediate electrode CTE2 may be provided over the second area A2 and the third area A3. An end of the second intermediate electrode CTE2 may be electrically and/or physically connected to the seventh contact electrode CNE7, and another end of the second intermediate electrode CTE2 may be electrically and/or physically connected to the ninth contact electrode CNE9. The another end of the second intermediate electrode CTE2 may be electrically and/or physically connected to the eleventh contact electrode CNE11, and still another end of the second intermediate electrode CTE2 may be electrically and/or physically connected to the thirteenth contact electrode CNE13, and further still another end of the second intermediate electrode CTE2 may be electrically and/or physically connected to the fifteenth contact electrode CNE5.

In an embodiment of the disclosure, the second intermediate electrode CTE2 may be a second bridge electrode (or a second connection electrode) electrically connecting the second series stage SET2 and the third series stage.

The (1-1)-th electrode EL1_1 of which an area may be exposed by the first opening OPN1 of the first insulating layer INS1 to directly contact the first contact electrode CNE1, the (3-1)-th electrode EL3_1 of which an area may be exposed by the second opening OPN2 of the first insulating layer INS1 to directly contact the third contact electrode CNE3, and the (5-1)-th electrode EL5_1 of which an area may be exposed by the third opening OPN3 of the first insulating layer INS1 to directly contact the fifth contact electrode CNE5 may be the anode electrode of the emission unit EMU of each pixel PXL. The (2-3)-th electrode of which an area may be exposed by the fourth opening OPN4 of the first insulating layer INS1 to directly contact the twelfth contact electrode CNE12 and the (4-3)-th electrode of which an area may be exposed by the fifth opening OPN5 of the first insulating layer INS1 to directly contact the fifteenth contact electrode CNE14 may be the cathode electrode of the emission unit EMU.

Figure 19:
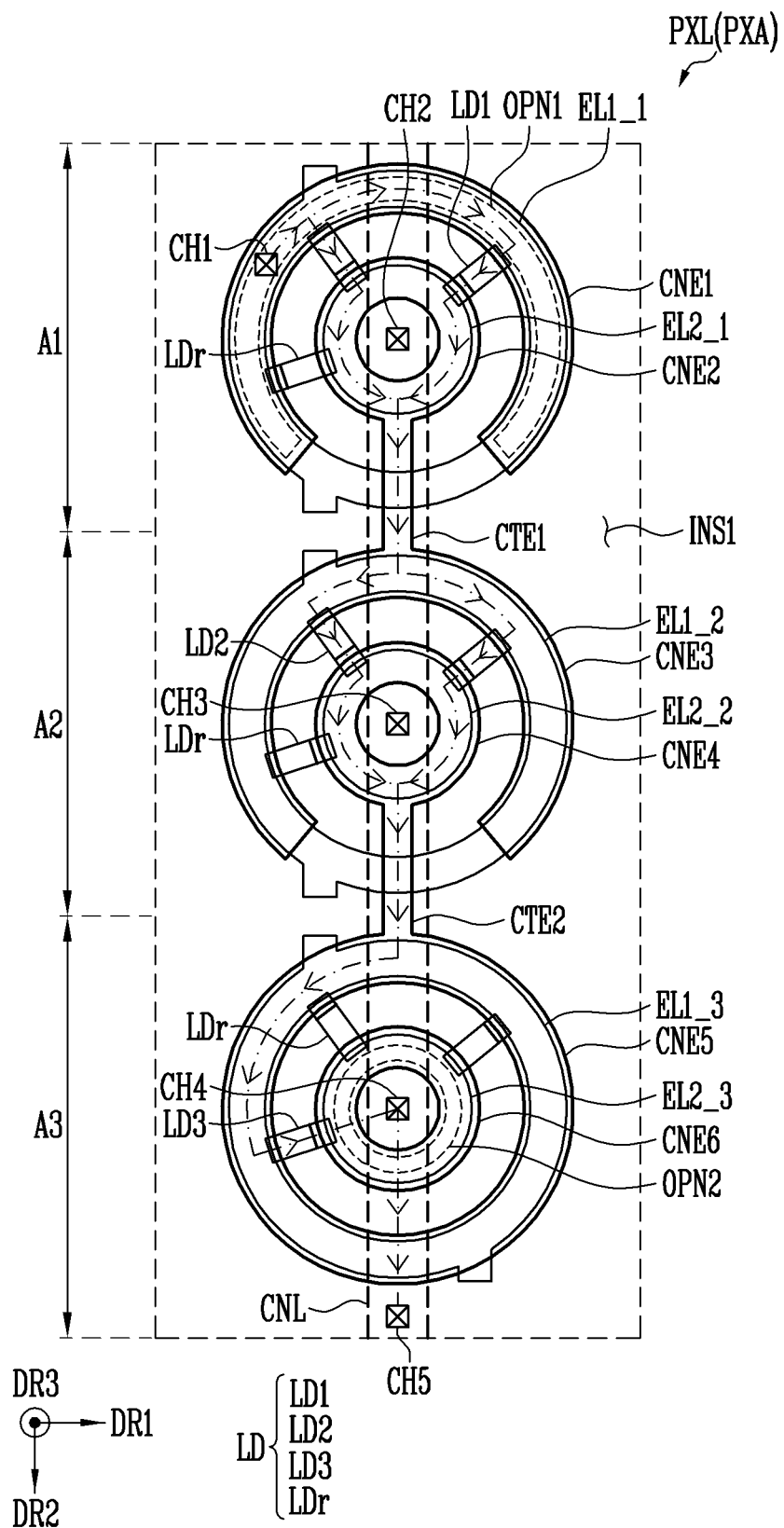
FIG. 19 schematically illustrates a pixel according to still another embodiment of the disclosure, and is a schematic plan view of the pixel including only a partial configuration of the display element layer.

FIG. 19 schematically illustrates the pixel PXL according to still another embodiment of the disclosure, and is a schematic plan view of the pixel PXL including only a partial configuration of the display element layer DPL.

Regarding the pixel PXL of FIG. 19, differences from the above-described embodiments are described in order to avoid redundant description. Parts which are not specifically described in the disclosure may be in accordance with the above-described embodiments, and the same reference numerals indicate the same components and similar reference numerals indicate similar components.

Referring to FIGS. 1A to 5, 7B, and 19, the pixel area PXA of each pixel PXL may include first to third areas A1 to A3 partitioned along the second direction DR2.

The (1-1)-th electrode EL1_1 and the (2-1)-th electrode EL2_1 spaced apart from each other may be disposed in the first area A1, the (1-2)-th electrode EL1_2 and the (2-2)-th electrode EL2_2 spaced apart from each other may be disposed in the second area A2, and the (1-3)-th electrode EL1_3 and the (2-3)-th electrode EL2_3 spaced apart from each other may be disposed in the third area A3.

Before aligning the light emitting elements LD in the pixel area PXA of each pixel PXL, the (1-1)-th electrode EL1_1, the (1-2)-th electrode EL1_2, and the (1-3)-th electrode EL1_3 may configure an alignment line electrically and/or physically connected to each other. After the light emitting elements LD are aligned in the pixel area PXA, a portion of the alignment line may be removed or disconnected, and thus the (1-1)-th electrode EL1_1, the (1-2)-th electrode EL1_2, and the (1-3)-th electrode EL1_3 may be electrically and/or physically separated from each other.

Regardless of whether the light emitting elements LD are aligned, the (2-1)-th electrode EL2_1, the (2-2)-th electrode EL2_2, and the (2-3)-th electrode EL2_3 may be electrically connected through a connection line CNL. For example, the (2-1)-th electrode EL2_1 may be connected to the connection line CNL through a second contact hole CH2, the (2-2)-th electrode EL2_2 may be connected to the connection line CNL through a third contact hole CH3, and the (2-3)-th electrode EL2_3 may be connected to the connection line CNL through a fourth contact hole CH4. The connection line CNL may be electrically connected to the second power line PL2 of the pixel circuit 144 of each pixel PXL through a fifth contact hole CH5.

When viewed in a plan view, the (2-1)-th electrode EL2_1 may be positioned at a center (or in a middle) of the first area A1 and may have a circular shape. The (1-1)-th electrode EL1_1 may have a shape surrounding the (2-1)-th electrode EL2_1 in a circumferential direction thereof. For example, the (1-1)-th electrode EL1_1 may have a shape surrounding at least a portion of the (2-1)-th electrode EL2_1. In an embodiment of the disclosure, the (1-1)-th electrode EL1_1 may have a shape surrounding only a remaining area except for at least one area of the (2-1)-th electrode EL2_1, for example, a "C" shape in which a portion may be opened without forming a perfect circular ring shape.

In an embodiment of the disclosure, the (1-1)-th electrode EL1_1 may be electrically and/or physically connected to the first transistor T1 of the pixel circuit 144 through the first contact hole CH1. An area of the (1-1)-th electrode EL1_1 may be exposed to the outside by the first opening OPN1 of the first insulating layer (refer to "INS1" of FIG. 10). The first contact electrode CNE1 may be disposed on the (1-1)-th electrode EL1_1, of which the area may be exposed to the outside, and thus the (1-1)-th electrode EL1_1 and the first contact electrode CNE1 may directly contact to be electrically and/or physically connected to each other. The (2-1)-th electrode EL2_1 may be covered by the first insulating layer INS1 to be electrically insulated from the second contact electrode CNE2 disposed on the (2-1)-th electrode EL2_1.

In the first area A1, first light emitting elements LD1 may be aligned between the (1-1)-th electrode EL1_1 and the (2-1)-th electrode EL2_1. An end of each of the first light emitting elements LD1 may be connected to any one of the first and second contact electrodes CNE1 and CNE2, and another end of each of the first light emitting elements LD1 may be connected to the other of the first and second contact electrodes CNE1 and CNE2. The first light emitting elements LD1 may be aligned along a periphery of the (2-1)-th electrode EL2_1. For example, the first light emitting elements LD1 may be radially aligned around the circular (2-1)-th electrode EL2_1 between the (1-1)-th electrode EL1_1 and the (2-1)-th electrode EL2_1.

In an embodiment of the disclosure, the (1-1)-th and (2-1)-th electrodes EL1_1 and EL2_1, the first and second contact electrodes CNE1 and CNE2, and the first light emitting element LD1 positioned in the first area A1 may configure the first series stage SET1.

The (2-2)-th electrode EL2_2 may be positioned at a center (or in a middle) of the second area A2 and may have a circular shape when viewed in a plan view. The (1-2)-th electrode EL1_2 may have a shape surrounding the (2-2)-th electrode EL2_1 in a circumferential direction thereof. For example, the (1-2)-th electrode EL1_2 may have a shape surrounding at least a portion of the (2-2)-th electrode EL2_2. In an embodiment of the disclosure, the (1-2)-th electrode EL1_2 may have a shape surrounding only a remaining area except for at least one area of the (2-2)-th electrode EL2_2, for example, a "C" shape in which a portion may be opened without forming a perfect circular ring shape.

In an embodiment of the disclosure, the (1-2)-th first electrode EL1_2 may be covered by the first insulating layer INS1 to be electrically insulated from the third contact electrode CNE3 disposed on the (1-2)-th electrode EL1_2. The (2-2)-th electrode EL2_2 may be covered by the first insulating layer INS1 to be electrically insulated from the fourth contact electrode CNE4 disposed on the (2-2)-th electrode EL2_2.

In the second area A2, second light emitting elements LD2 may be aligned between the (1-2)-th electrode EL1_2 and the (2-2)-th electrode EL2_2. An end of each of the second light emitting elements LD2 may be connected to one of the third and fourth contact electrodes CNE3 and CNE4, and another end of each of the second light emitting elements LD2 may be connected to the other of the third and fourth contact electrodes CNE3 and CNE4. The second light emitting elements LD2 may be aligned along a periphery of the (2-2)-th electrode EL2_2. For example, the second light emitting elements LD2 may be radially aligned around the circular (2-2)-th electrode EL2_2 between the (1-2)-th electrode EL1_2 and the (2-2)-th electrode EL2_2.

In an embodiment of the disclosure, the (1-2)-th and (2-2)-th electrodes EL1_2 and EL2_2, the third and fourth contact electrodes CNE3 and CNE4, and the second light emitting elements LD2 positioned in the second area A2 may configure the second series stage SET2.

The first intermediate electrode CTE1 may be disposed between the first area A1 and the second area A2. The first intermediate electrode CTE1 may be provided over the first area A1 and the second area A2. An end of the first intermediate electrode CTE1 may be electrically and/or physically connected to the second contact electrode CNE2, and another end of the first intermediate electrode CTE1 may be electrically and/or physically connected to the third contact electrode CNE3. The first intermediate electrode CTE1 may be provided integrally with the second contact electrode CNE2 and/or the third contact electrode CNE3. Accordingly, the second contact electrode CNE2 and the third contact electrode CNE3 may be electrically and/or physically connected to each other by the first intermediate electrode CTE1.

In an embodiment of the disclosure, the first intermediate electrode CTE1 may be a first bridge electrode (or a first connection electrode) electrically connecting the first series stage SET1 and the second series stage SET2.

The (2-3)-th electrode EL2_3 may be positioned at a center (or in a middle) of the third area A3 and may have a circular shape when viewed in a plan view. The (1-3)-th electrode EL1_3 may have a shape surrounding a periphery of the (2-3)-th electrode EL2_3 along a circumferential direction thereof. For example, the (1-3)-th electrode EL1_3 may have a circular ring shape (or a closed loop shape) surrounding a periphery of the (2-3)-th electrode EL2_3. The (1-3)-th electrode EL1_3 may have a circular ring shape, but the disclosure is not limited thereto. According to an embodiment, the (1-3)-th electrode EL1_3 is not limited to a circular ring shape, and may have a polygonal ring shape including a quadrangular ring shape, an octagonal ring shape of a quadrangular shape, an octagonal shape, and the like forming a closed circuit.

In an embodiment of the disclosure, the (2-3)-th electrode EL2_3 may be electrically and/or physically connected to the second power line PL2 of the pixel circuit 144 through the fourth contact hole CH4 and the connection line CNL. The (1-3)-th electrode EL1_3 may be covered by the first insulating layer INS1 to be electrically insulated from the fifth contact electrode CNE5 disposed on the (1-3)-th electrode EL1_3. An area of the (2-3)-th electrode EL2_3 may be exposed to the outside by the second opening OPN2 of the first insulating layer INS1. The sixth contact electrode CNE6 may be disposed on the (2-3)-th electrode EL2_3, of which the area may be exposed to the outside, and thus the (2-3)-th electrode EL2_3 and the sixth contact electrode CNE6 may directly contact to be electrically and/or physically connected to each other.

In the third area A3, third light emitting elements LD3 may be aligned between the (1-3)-th electrode EL1_3 and the (2-3)-th electrode EL2_3. An end of each of the third light emitting elements LD3 may be connected to any one of the fifth and sixth contact electrodes CNE5 and CNE6, and another end of each of the third light emitting elements LD3 may be connected to the other of the fifth and sixth contact electrodes CNE5 and CNE6. The third light emitting elements LD3 may be aligned along a periphery of the (2-3)-th electrode EL2_3. For example, the third light emitting elements LD3 may be radially aligned around the circular shape (2-3)-th electrode EL2_3 between the (1-3)-th electrode EL1_3 and the (2-3)-th electrode EL2_3.

In an embodiment of the disclosure, the (1-3)-th and (2-3)-th electrodes EL1_3 and EL2_3, the fifth and sixth contact electrodes CNE5 and CNE6, and the third light emitting elements LD3 positioned in the third area A3 may configure the third series stage.

The second intermediate electrode CTE2 may be disposed between the second area A2 and the third area A3. The second intermediate electrode CTE2 may be provided over the second area A2 and the third area A3. An end of the second intermediate electrode CTE2 may be electrically and/or physically connected to the fourth contact electrode CNE4, and another end of the second intermediate electrode CTE2 may be electrically and/or physically connected to the fifth contact electrode CNE5. The second intermediate electrode CTE2 may be provided integrally with the fourth contact electrode CNE4 and/or the fifth contact electrode CNE5. Accordingly, the fourth contact electrode CNE4 and the fifth contact electrode CNE5 may be electrically and/or physically connected to each other by the second intermediate electrode CTE2.

In an embodiment of the disclosure, the second intermediate electrode CTE2 may be a second bridge electrode (or a second connection electrode) connecting the second series stage SET2 and the third series stage.

The (1-1)-th electrode EL1_1 of which an area may be exposed by the first opening OPN1 of the first insulating layer INS1 to directly contact the first contact electrode CNE1 may be the anode electrode in the emission unit EMU of each pixel PXL. The second third electrode EL2_3 of which an area may be exposed by the second opening OPN2 of the first insulating layer INS1 to directly contact the sixth contact electrode CNE6 may be the cathode electrode in the emission unit EUM.

Although the above has been described with reference to embodiments of the disclosure, those skilled in the art or those having ordinary knowledge of the corresponding technical field will understand that the disclosure may be variously changed and modified without departing from the technical scope of the disclosure.

Therefore, the scope of the disclosure should not be limited to the contents described in the detailed description of the specification, but should include all such changes and modifications.

What is claimed is:
1. A pixel comprising:
   a first area and a second area partitioned in a first direction;
   (1-1)-th and (2-1)-th electrodes disposed in the first area and spaced apart in a second direction different from the first direction;
   (1-2)-th and (2-2)-th electrodes disposed in the second area and spaced apart in the second direction;

light emitting elements disposed between the (1-1)-th and (2-1)-th electrodes and between the (1-2)-th and (2-2)-th electrodes;

a contact electrode disposed on the (1-1)-th and (2-1)-th electrodes and the (1-2)-th and (2-2)-th electrodes;

an insulating layer disposed between each of the (1-1)-th and (2-1)-th electrodes and the (1-2)-th and (2-2)-th electrodes, and the contact electrode, and including a first opening exposing a portion of the (1-1)-th electrode; and a first intermediate electrode electrically connecting the contact electrode on the (2-1)-th electrode and the contact electrode on the (1-2)-th electrode, wherein the insulating layer completely covers the (2-1)-th electrode and the (1-2)-th electrode.

2. The pixel according to claim 1, wherein the insulating layer further includes a second opening exposing a portion of the (2-2)-th electrode.

3. The pixel according to claim 2, wherein
the (1-1)-th electrode directly contacts the contact electrode on the (1-1)-th electrode through the first opening, and
the (2-2)-th electrode directly contacts the contact electrode on the (2-2)-th electrode through the second opening.

4. The pixel according to claim 3, wherein
the (2-1)-th electrode is electrically insulated from the contact electrode on the (2-1)-th electrode, and
the (1-2)-th electrode is electrically insulated from the contact electrode on the (1-2)-th electrode.

5. The pixel according to claim 2, wherein
the first intermediate electrode is disposed between the first area and the second area, and
the first intermediate electrode and the contact electrode on the (2-1)-th electrode are integral with each other or the first intermediate electrode and the contact electrode on the (1-2)-th electrode are integral with each other.

6. The pixel according to claim 2, wherein the contact electrode on the (1-1)-th electrode, the contact electrode on the (2-1)-th electrode, the contact electrode on the (1-2)-th electrode, the contact electrode on the (2-2)-th electrode, and the first intermediate electrode are disposed on a same layer.

7. The pixel according to claim 2, wherein
the (1-1)-th electrode and the (1-2)-th electrode extend in the first direction and are electrically connected to each other between the first area and the second area, and
the (2-1)-th electrode and the (2-2)-th electrode extend in the first direction and are electrically connected to each other between the first area and the second area.

8. The pixel according to claim 2, wherein
the (1-1)-th electrode is an anode electrode, and
the (2-2)-th electrode is a cathode electrode.

9. The pixel according to claim 1, wherein the light emitting elements comprises:
first light emitting elements disposed between the (1-1)-th electrode and the (2-1)-th electrode in the first area; and
second light emitting elements disposed between the (1-2)-th electrode and the (2-2)-th electrode in the second area.

10. The pixel according to claim 9, wherein
the first light emitting elements form a first series stage electrically connected in parallel between the (1-1)-th electrode and the (2-1)-th electrode, and
the second light emitting elements form a second series stage electrically connected in parallel between the (1-2)-th electrode and the (2-2)-th electrode.

11. The pixel according to claim 9, further comprising:
a third area disposed at a lower end of the second area in the first direction,
wherein the third area comprises:
(1-3)-th and (2-3)-th electrodes spaced apart in the second direction;
third light emitting elements disposed between the (1-3)-th electrode and the (2-3)-th electrode;
a contact electrode disposed on the (1-3)-th and (2-3)-th electrodes;
the insulating layer disposed between each of the (1-3)-th and (2-3)-th electrodes and the contact electrode, and including a second opening exposing a portion of the (2-3)-th electrode; and
a second intermediate electrode electrically connecting the contact electrode on the (2-2)-th electrode and the contact electrode on the (1-3)-th electrode.

12. The pixel according to claim 11, wherein the insulating layer completely covers the (2-2)-th electrode and the (1-3)-th electrode.

13. The pixel according to claim 12, wherein
the (1-1)-th electrode directly contacts the contact electrode on the (1-1)-th electrode through the first opening, and
the (2-3)-th electrode directly contacts the contact electrode on the (2-3)-th electrode through the second opening.

14. The pixel according to claim 12, wherein
the second intermediate electrode and the contact electrode on the (2-2)-th electrode are integral with each other or the second intermediate electrode and the contact electrode on the (1-3)-th electrode are integral with each other.

15. The pixel according to claim 13, wherein
the first light emitting elements form a first series stage electrically connected in parallel between the (1-1)-th electrode and the (2-1)-th electrode,
the second light emitting elements form a second series stage electrically connected in parallel between the (1-2)-th electrode and the (2-2)-th electrode, and
the third light emitting elements form a third series stage electrically connected in parallel between the (1-3)-th electrode and the (2-3)-th electrode.

16. The pixel according to claim 15, wherein
the (1-1)-th electrode is an anode electrode, and
the (2-3)-th electrode is a cathode electrode.

17. The pixel according to claim 1, wherein
in the first area, one electrode of the (1-1)-th and (2-1)-th electrodes has a circular shape and another electrode of the (1-1)-th and (2-1)-th electrodes has a shape surrounding a periphery of the one electrode of the (1-1)-th and (2-1)-th electrodes, and
in the second area, one electrode of the (1-2)-th and (2-2)-th electrodes has a circular shape and another electrode of the (1-2)-th and (2-2)-th electrodes has a shape surrounding a periphery of the one electrode of the (1-2)-th and (2-2)-th electrodes.

18. A display device comprising:
pixels disposed on a substrate,
wherein each of the pixels comprises:
a first area and a second area partitioned in a first direction;
(1-1)-th and (2-1)-th electrodes disposed in the first area and spaced apart in a second direction different from the first direction;
(1-2)-th and (2-2)-th electrodes disposed in the second area and spaced apart in the second direction;

first light emitting elements disposed between the (1-1)-th and (2-1)-th electrodes;

second light emitting elements disposed between the (1-2)-th and (2-2)-th electrodes;

a first contact electrode disposed on the (1-1)-th electrode;

a second contact electrode disposed on the (2-1)-th electrode;

a third contact electrode disposed on the (1-2)-th electrode; and a fourth contact electrode disposed on the (2-2)-th electrode;

an insulating layer disposed between the (1-1)-th electrode and the first contact electrode, between the (2-1)-th electrode and the second contact electrode, between the (1-2)-th electrode and the third contact electrode, and between the (2-2)-th electrode and the fourth contact electrode; and an intermediate electrode electrically connecting the second contact electrode and the third contact electrode, wherein the insulating layer includes a first opening exposing a portion of the (1-1)-th electrode and a second opening exposing a portion of the (2-2)-th electrode, and the insulating layer completely covers the (2-1)-th electrode and the (1-2)-th electrode.

19. The display device according to claim 18, wherein the (1-1)-th electrode is an anode electrode, and the (2-2)-th electrode is a cathode electrode.

20. A method of manufacturing a display device, the method comprising:

providing each pixel including a pixel area having a first area and a second area partitioned in a first direction, wherein the providing of the pixel comprises:

forming (1-1)-th and (2-1)-th electrodes spaced apart in a second direction different from the first direction in the first area;

forming (1-2)-th and (2-2)-th electrodes spaced apart in the second direction in the second area;

forming an insulating material layer on the (1-1)-th and (2-1)-th electrodes and the (1-2)-th and (2-2)-th electrodes;

aligning light emitting elements on the insulating material layer;

forming an insulating layer including a first opening exposing a portion of the (1-1)-th electrode and a second opening exposing a portion of the (2-2)-th electrode by removing a portion of the insulating material layer;

forming a contact electrode on the (1-1)-th and (2-1)-th electrodes and the (1-2)-th and (2-2)-th electrodes; and forming an intermediate electrode electrically connecting the contact electrode on the (2-1)-th electrode and the contact electrode on the (1-2)-th electrode, wherein the insulating layer completely covers the (2-1)-th electrode and the (1-2)-th electrode, and the (2-1)-th electrode is electrically insulated from the contact electrode on the (2-1)-th electrode, and the (1-2)-th electrode is electrically insulated from the contact electrode on the (1-2)-th electrode.

* * * * *